US006815700B2

(12) United States Patent
Melnychuk et al.

(10) Patent No.: US 6,815,700 B2
(45) Date of Patent: Nov. 9, 2004

(54) PLASMA FOCUS LIGHT SOURCE WITH IMPROVED PULSE POWER SYSTEM

(75) Inventors: Stephan T. Melnychuk, Carlsbad, CA (US); William N. Partlo, Poway, CA (US); Igor V. Fomenkov, San Diego, CA (US); I. Roger Oliver, San Diego, CA (US); Richard M. Ness, San Diego, CA (US); Norbert Bowering, San Diego, CA (US); Oleh Khodykin, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 37 days.

(21) Appl. No.: 10/189,824

(22) Filed: Jul. 3, 2002

(65) Prior Publication Data

US 2003/0006383 A1 Jan. 9, 2003

Related U.S. Application Data

(63) Continuation-in-part of application No. 10/120,655, filed on Apr. 10, 2002, which is a continuation-in-part of application No. 09/875,719, filed on Jun. 6, 2001, now Pat. No. 6,586,757, which is a continuation-in-part of application No. 09/875,721, filed on Jun. 6, 2001, now Pat. No. 6,566,668, which is a continuation-in-part of application No. 09/690,084, filed on Oct. 16, 2000, now Pat. No. 6,566,667, which is a continuation-in-part of application No. 09/590,962, filed on Jun. 9, 2000, now abandoned, which is a continuation-in-part of application No. 09/442,582, filed on Nov. 18, 1999, now Pat. No. 6,452,199, which is a continuation-in-part of application No. 09/324,526, filed on Jun. 2, 1999, now Pat. No. 6,541,786, which is a continuation-in-part of application No. 09/268,243, filed on Mar. 15, 1999, now Pat. No. 6,064,072, which is a continuation-in-part of application No. 09/093,416, filed on Jun. 8, 1998, now Pat. No. 6,051,841, which is a continuation-in-part of application No. 08/854,507, filed on May 12, 1997, now Pat. No. 5,763,930.

(51) Int. Cl.$^7$ ............................. H05H 1/04; G21G 4/00; G21K 5/00

(52) U.S. Cl. ............................. 250/504 R; 250/493.1; 378/119; 378/34; 378/141

(58) Field of Search ........................... 250/504 R, 493.1; 378/34, 119, 141

(56) References Cited

U.S. PATENT DOCUMENTS

| 2,759,106 A | 8/1956 | Wolter .................... 250/53 |
| 3,150,483 A | 5/1962 | Mayfield et al. ........... 60/35.5 |

(List continued on next page.)

OTHER PUBLICATIONS

Apruzese, J.P., "X–Ray Laser Research Using Z Pinches," Am. Inst. of Phys. 399–403, (1994).

(List continued on next page.)

Primary Examiner—John R. Lee
Assistant Examiner—Bernard E. Souw
(74) Attorney, Agent, or Firm—William Cray

(57) ABSTRACT

The present invention provides a high energy photon source. A pair of plasma pinch electrodes are located in a vacuum chamber. The chamber contains a working gas which includes a noble buffer gas and an active gas chosen to provide a desired spectral line. A pulse power source provides electrical pulses at voltages high enough to create electrical discharges between the electrodes to produce very high temperature, high density plasma pinches in the working gas providing radiation at the spectral line of the source or active gas. Preferably the electrodes are configured co-axially. The central electrode is preferably hollow and the active gas is introduced out of the hollow electrode. This permits an optimization of the spectral line source and a separate optimization of the buffer gas. In preferred embodiments the central electrode is pulsed with a high negative electrical pulse so that the central electrode functions as a hollow cathode. Preferred embodiments present optimization of capacitance values, anode length and shape and preferred active gas delivery systems are disclosed. Preferred embodiments also include a pulse power system comprising a charging capacitor and a magnetic compression circuit comprising a pulse transformer. Special techniques are described for cooling the central electrode. In one example, water is circulated through the walls of the hollow electrode. In another example, a heat pipe cooling system is described for cooling the central electrode.

40 Claims, 36 Drawing Sheets

U.S. PATENT DOCUMENTS

| | | | |
|---|---|---|---|
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,837,794 A | 6/1989 | Riordan et al. | 378/119 |
| 5,023,897 A | 6/1991 | Neff et al. | 387/122 |
| 5,027,076 A | 6/1991 | Horsley et al. | 324/674 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,313,481 A | 5/1994 | Cook et al. | 372/37 |
| 5,411,224 A | 5/1995 | Dearman et al. | 244/53 |
| 5,448,580 A | 9/1995 | Birx et al. | 372/38 |
| 5,504,795 A | 4/1996 | McGeoch | 378/119 |
| 5,729,562 A | 3/1998 | Birx et al. | 372/38 |
| 5,763,930 A * | 6/1998 | Partlo | 250/504 R |
| 5,866,871 A | 2/1999 | Birx | 219/121 |
| 5,936,988 A | 8/1999 | Partlo et al. | 372/38 |
| 5,963,616 A | 10/1999 | Silfvast et al. | 378/122 |
| 6,031,241 A | 2/2000 | Silfvast et al. | 250/504 |
| 6,039,850 A | 3/2000 | Schulz | 204/192.15 |
| 6,051,841 A * | 4/2000 | Partlo | 250/504 R |
| 6,064,072 A * | 5/2000 | Partlo et al. | 250/504 R |
| 6,172,324 B1 | 1/2001 | Birx | 219/121.57 |
| 6,452,199 B1 * | 9/2002 | Partlo et al. | 250/504 R |
| 6,541,786 B1 * | 4/2003 | Partlo et al. | 250/504 R |
| 6,566,667 B1 * | 5/2003 | Partlo et al. | 250/504 R |
| 6,566,668 B2 * | 5/2003 | Rauch et al. | 250/504 R |
| 6,586,757 B2 * | 7/2003 | Melnychuk et al. | 250/504 R |
| 2001/0055364 A1 * | 12/2001 | Kandaka et al. | 378/119 |
| 2002/0014598 A1 * | 2/2002 | Melnychuk et al. | 250/504 R |
| 2002/0014599 A1 * | 2/2002 | Rauch et al. | 250/504 R |
| 2002/0100882 A1 * | 8/2002 | Partlo et al. | 250/504 R |
| 2002/0163313 A1 * | 11/2002 | Ness et al. | 315/111.01 |
| 2002/0168049 A1 * | 11/2002 | Schriever et al. | 378/119 |
| 2003/0006383 A1 * | 1/2003 | Melnychuk et al. | 250/504 R |
| 2003/0068012 A1 * | 4/2003 | Ahmad et al. | 378/119 |

OTHER PUBLICATIONS

Bollanti, et al., "Compact Three Electrodes Excimer Laser IANUS for a POPA Optical System," *SPIE Proc.* (2206) 144–153, (1994).

Bollanti, et al., "Ianus, the three–electrode excimer laser," *App. Phys. B (Lasers & Optics)* 66(4):401–406, (1998).

Choi, et al., "A $10^{13}$ A/s High Energy Density Micro Discharge Radiation Source," *B. Radiation Characteristics*, p. 287–290.

Choi, et al., "Fast pulsed hollow cathode capillary discharge device," *Rev. of Sci. Instrum.* 69(9):3118–3122 (1998).

Fomenkov, et al., "Characterization of a 13.5nm Source for EUV Lithography based on a Dense Plasma Focus and Lithium Emission," Sematech Intl. Workshop on EUV Lithography (Oct. 1999).

Hansson, et al., "Xenon liquid jet laser–plasma source for EUV lithography," Emerging Lithographic Technologies IV, *Proc. Of SPIE*, vol. 3997:729–732 (2000).

Kato, Yasuo, "Electrode Lifetimes in a Plasma Focus Soft X–Ray Source," *J. Appl. Phys.* (33) Pt. 1, No. 8:4742–4744 (1991).

Kato, et al., "Plasma focus x–ray source for lithography," Am. Vac. Sci. Tech. B., 6(1): 195–198 (1988).

Lebert, et al., "Soft x–ray emission of laser–produced plasmas using a low–debris cryogenic nitrogen target," *J. Appl. Phys.*, 84(6):3419–3421 (1998).

Lebert, et al., "A gas discharge based radiation source for EUV–lithography," Intl. Conf. Micro and Nano–Engineering 98 (Sep. 2–24, 1998) Leuven, Belgium.

Lebert, et al., "Investigation of pinch plasmas with plasma parameters promising ASE," Inst. Phys. Conf. Ser. No. 125: Section 9, pp. 411–415 (1992) Schiersee, Germany.

Lee, Ja H., "Production of dense plasmas in hypocyloidal pinch apparatus," *The Phys. Of Fluids*, 20(2):313–321 (1977).

Lewis, Ciaran L.S., "Status of Collision–Pumped X–ray Lasers," *Am Inst. Phys.* Pp. 9–16 (1994).

Malmqvist, et al., "Liquid–jet target for laser–plasma soft x–ray generation," *Am. Inst. Phys.* 67(12):4150–4153 1996).

Mather, et al., "Stability of the Dense Plasma Focus," *Phys. Of Fluids*, 12(11):2343–2347 (1969).

Mayo, et al. "A magnetized coaxial source facility for the generation of energetic plasma flows," *Sci. Technol.* vol. 4:pp. 47–55 (1994).

Mayo, et al., "Initial Results on high enthalpy plasma generation in a magnetized coaxial source," *Fusion Tech* vol. 26:1221–1225 (1994).

Nilsen, et al., "Analysis of resonantly photopumped Na–Ne x–ray–laser scheme," *Am Phys. Soc.* 44(7):4591–4597 (1991).

Partlo, et al., "EUV (13.5nm) Light Generation Using a Dense Plasma Focus Device," *SPIE Proc. On Emerging Lithographic Technologies III*, vol. 3676, 846–858 (Mar. 1999).

Porter, et al., "Demonstration of Population Inversion by Resonant Photopumping in a Neon Gas Cell Irradiated by a Sodium Z Pinch," *Phys. Rev. Let.*, 68(6):796–799, (Feb. 1992).

Price, Robert H., "X–Ray Microscopy using Grazing Incidence Reflection Optics," *Am. Inst. Phys.*, pp. 189–199, (1981).

Qi, et al., "Fluorescence in Mg IX emission at 48.340 Å from Mg pinch plasmas photopumped by Al XI line radiation at 48.338 Å," The Am. Phys. Soc., 47(3):2253–2263 (Mar. 1993).

Scheuer, et al., "A Magnetically–Nozzled, Quasi–Steady, Multimegawatt, Coaxial Plasma Thruster," *IEEE: Transactions on Plasma Science*, 22(6) (Dec. 1994).

Shriever, et al., "Laser–produced lithium plasma as a narrow–band extended ultraviolet radiation source for photoelectron spectroscopy," App. Optics, 37(7):1243–1248, (Mar. 1998).

Schriever, et al., "Narrowband laser produced extreme ultraviolet sources adapted to silicon/molybdenum multilayer optics," J. of App. Phys., 83(9):4566–4571, (May 1998).

Silfvast, et al., "High–power plasma discharge source at 13.5 nm and 11.4 nm for EUV lithography," *SPIE*, vol. 3676:272–275, (Mar. 1999).

Silfvast, et al., "Lithium hydride capillary discharge creates x–ray plasma at 13.5 namometers," *Laser Focus World*, p. 13. (Mar. 1997).

Wilhein, et al., "A slit grating spectrograph for quantitative soft x–ray spectroscopy," Am. Inst. Of Phys. Rev. of Sci. Instrum., 70(3):1694–1699, (Mar. 1999).

Wu, et al., "The vacuum Spark and Spherical Pinch X–ray/ EUV Point Sources," *SPIE, Conf. On Emerging Tech.* III, Santa Clara, CA, vol. 3676:410–420, (Mar. 1999).

Zombeck, M.V., "Astrophysical Observations with High Resolution X–ray Telescope," *Am. Inst. Of Phys.,* pp. 200–209, (1981).

* cited by examiner

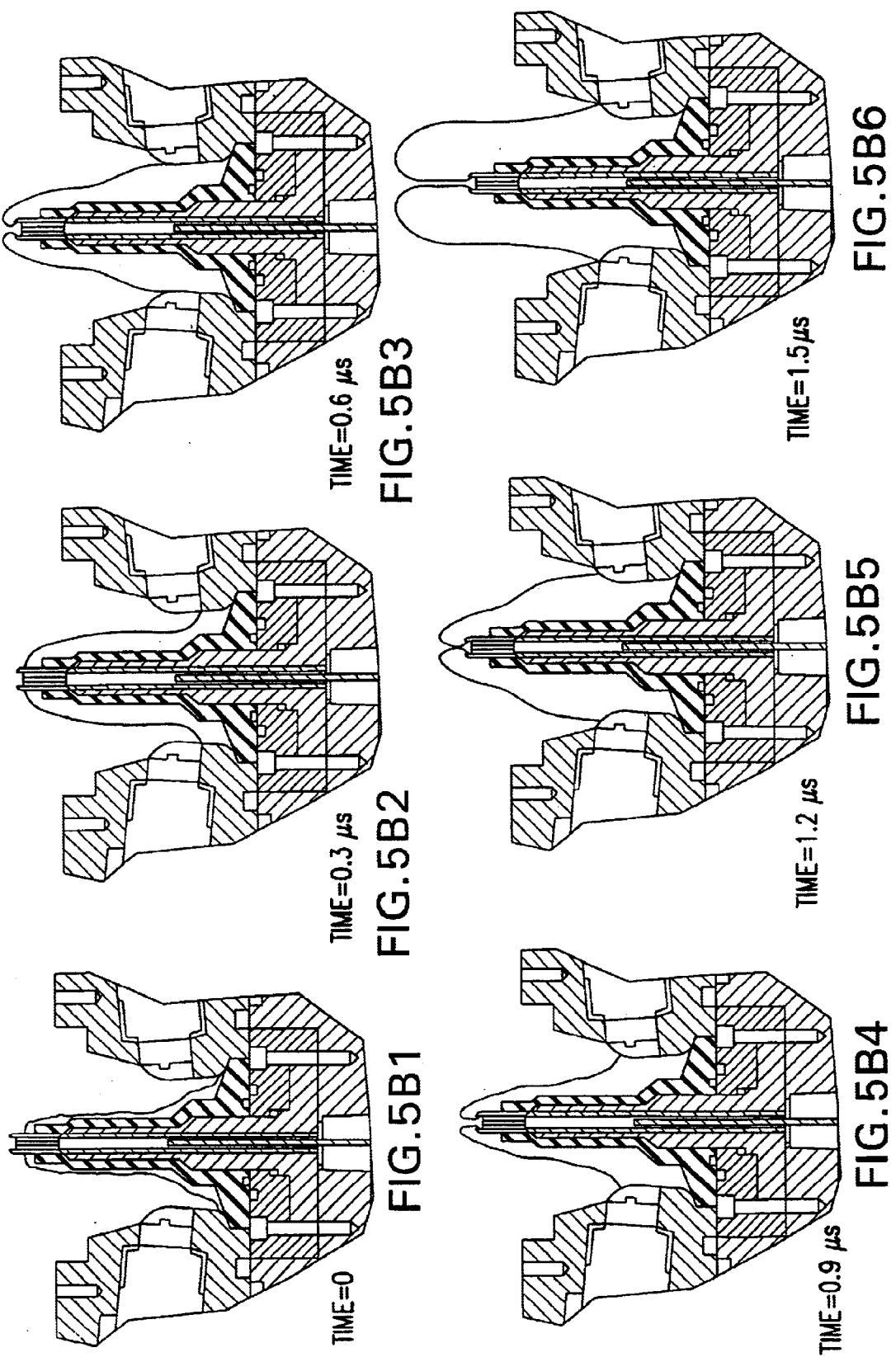

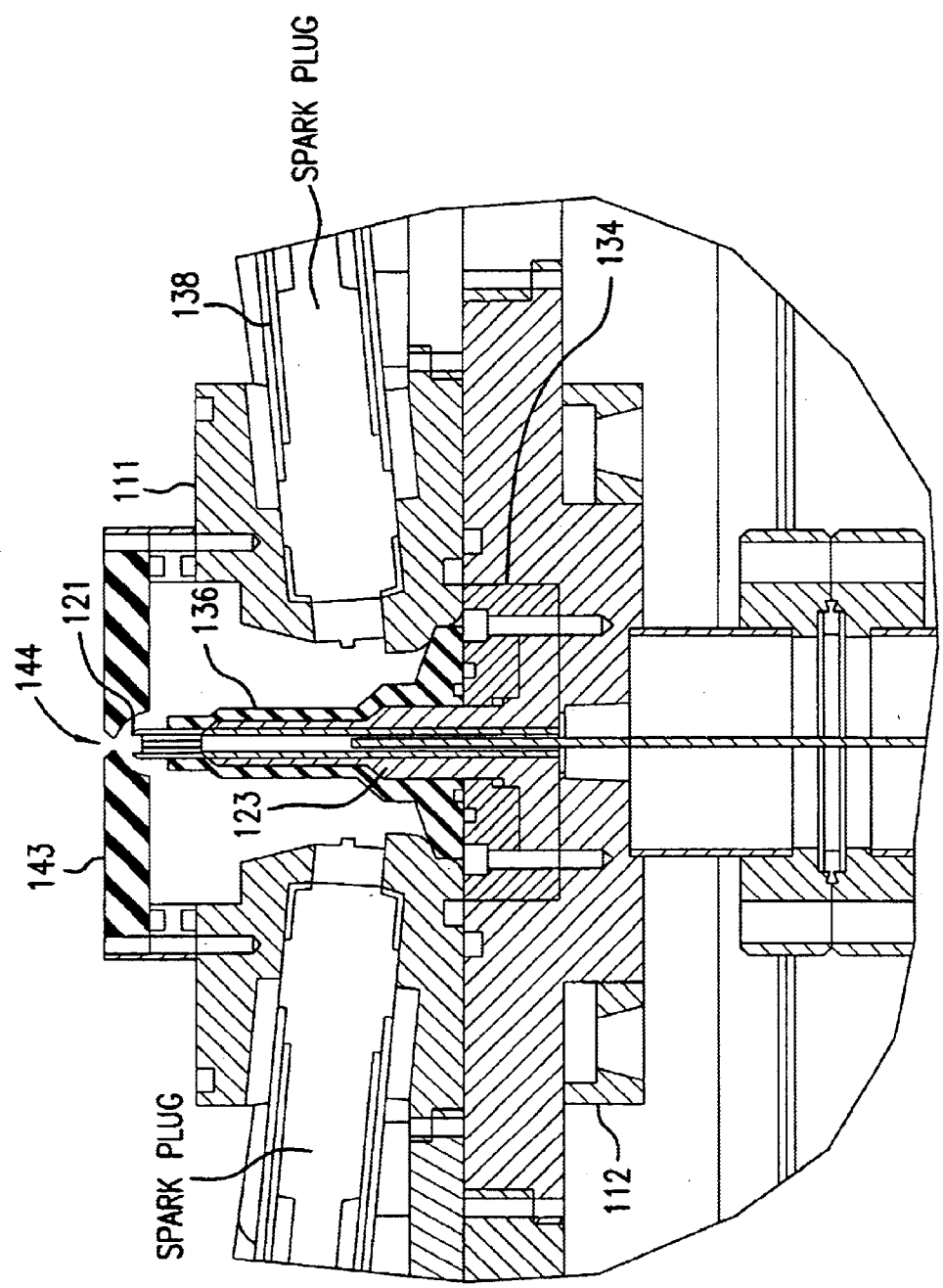

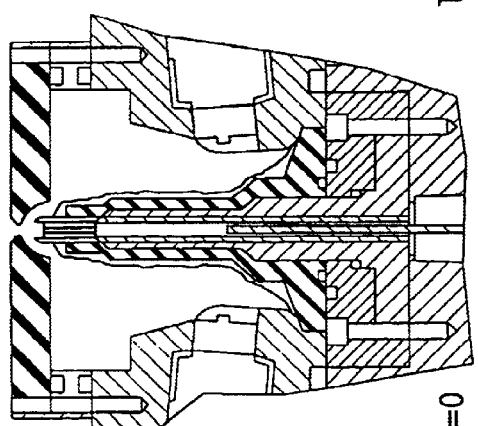
FIG.5C1 TIME=0
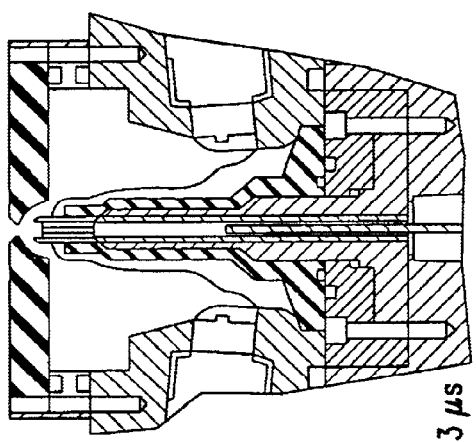
FIG.5C2 TIME=0.3 μs
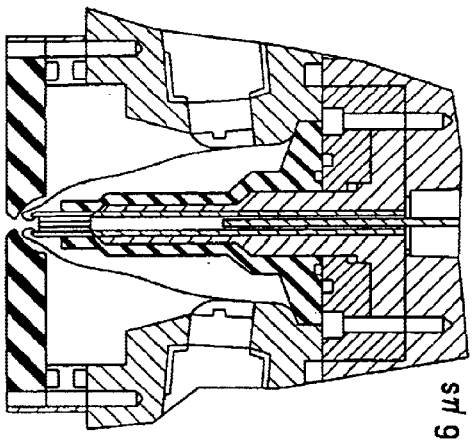
FIG.5C3 TIME=0.6 μs
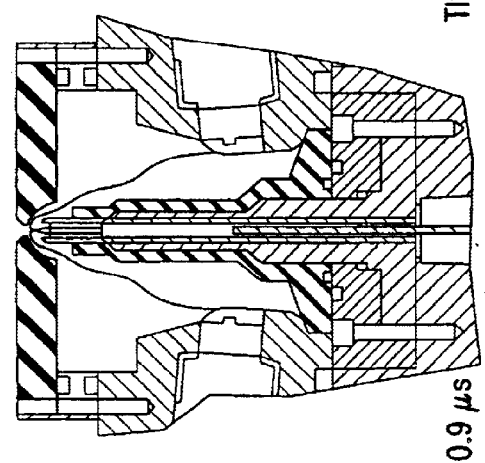
FIG.5C4 TIME=0.9 μs
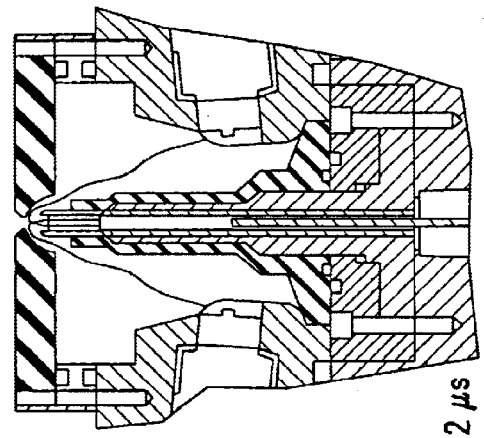
FIG.5C5 TIME=1.2 μs
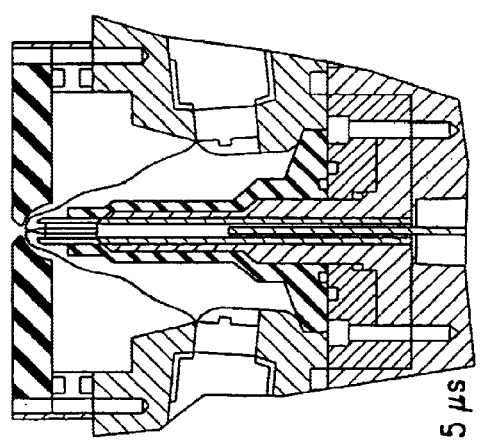
FIG.5C6 TIME=1.5 μs

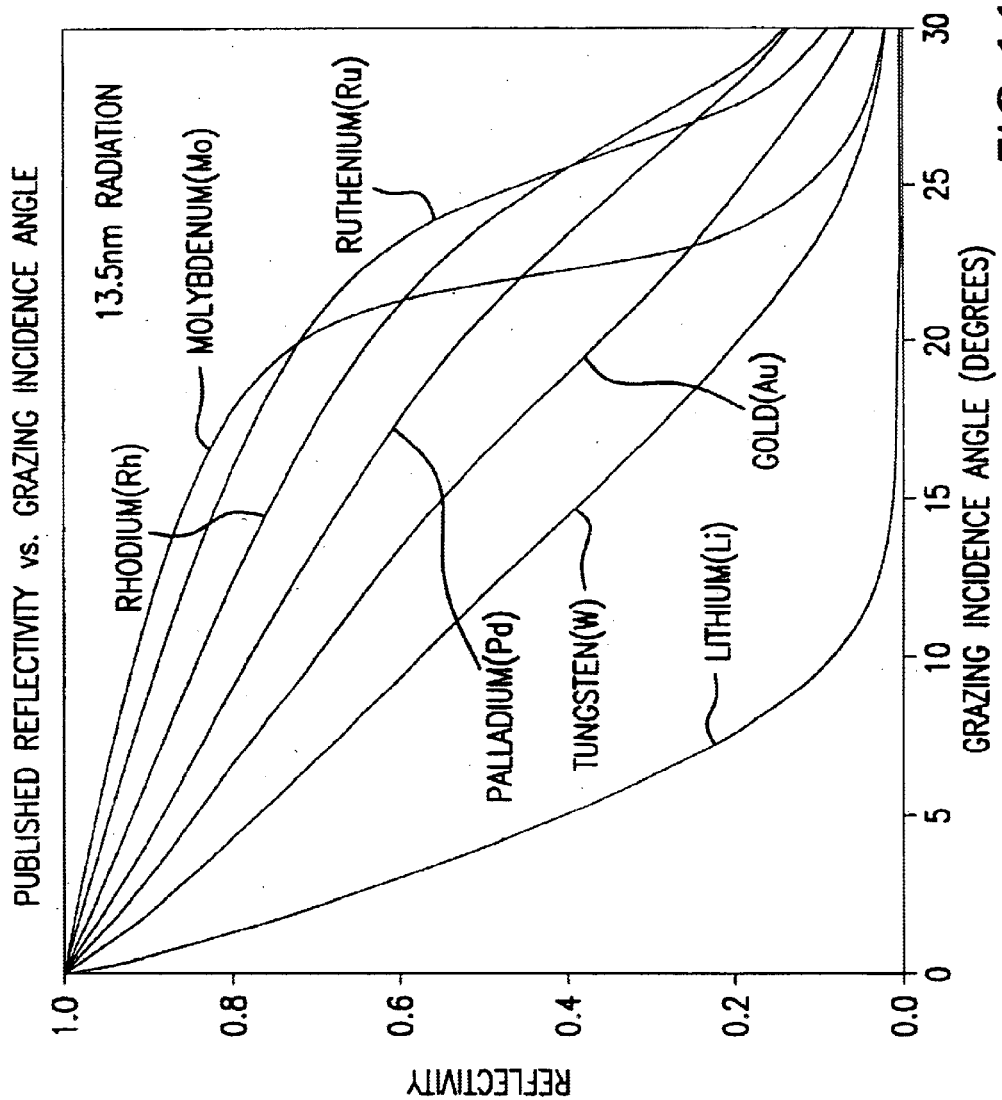

PLASMA FOCUS LIGHT SOURCE WITH IMPROVED PULSE POWER SYSTEM

This application is a continuation-in-part of U.S. Ser. No. 10/120,655 filed Apr. 10, 2002, U.S. Ser. No. 09/875,719 filed Jun. 6, 2001 now U.S. Pat. No. 6,586,757 and U.S. Ser. No. 09/875,721 filed Jun. 6, 2001 now U.S. Pat. No. 6,566,668, U.S. Ser. No. 09/690,084 filed Oct. 16, 2000 now U.S. Pat. No. 6,566,667, U.S. Ser. No. 09/590,962, filed Jun. 9, 2000 now abandoned, U.S. Ser. No. 09/442,582, filed Nov. 18, 1999 now U.S. Pat. No. 6,542,199 and U.S. Ser. No. 09/324,526, filed Jun. 2, 1999 now U.S. Pat. No. 6,541,786 which was a continuation-in-part of U.S. Ser. No. 09/268,243 filed Mar. 15, 1999 now U.S. Pat. No. 6,064,072 and U.S. Ser. No. 09/093,416, filed Jun. 8, 1998 now U.S. Pat. No. 6,051,841 which was a CIP of U.S. Ser. No. 08/854,507, filed May 12, 1997 which is now U.S. Pat. No. 5,763,930; all of which is incorporated by reference herein. This invention relates to high-energy photon sources and in particular highly reliable x-ray and high-energy ultraviolet sources.

BACKGROUND OF THE INVENTION

The semiconductor industry continues to develop lithographic technologies, which can print ever-smaller integrated circuit dimensions. These systems must have high reliability, cost effective throughput, and reasonable process latitude. The integrated circuit fabrication industry has recently changed over from mercury G-line (436 nm) and I-line (365 nm) exposure sources to 248 nm and 193 nm excimer laser sources. This transition was precipitated by the need for higher lithographic resolution with minimum loss in depth-of-focus.

The demands of the integrated circuit industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength and sufficiently high optical quality are difficult to obtain. Therefore, all-reflective imaging systems may be required. An all reflective optical system requires a smaller numerical aperture than the transmissive systems. The loss in resolution caused by the smaller NA can only be made up by reducing the wavelength by a large factor. Thus, a light source in the range of 10 nm is required if the resolution of optical lithography is to be improved beyond that achieved with 193 nm or 157 nm.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of outer electrons from the ions and a consequent production of x-rays and high energy ultraviolet radiation. Various prior art techniques for generation of high energy radiation from focusing or pinching plasmas are described in the following patents:

J. M. Dawson, "X-Ray Generator," U.S. Pat. No. 3,961,197, Jun. 1, 1976.

T. G. Roberts, et. al., "Intense, Energetic Electron Beam Assisted X-Ray Generator," U.S. Pat. No. 3,969,628, Jul. 13, 1976.

J. H. Lee, "Hypocycloidal Pinch Device," U.S. Pat. No. 4,042,848, Aug. 16, 1977.

L. Cartz, et. al., "Laser Beam Plasma Pinch X-Ray System," U.S. Pat. No. 4,504,964, Mar. 12, 1985.

A. Weiss, et. al., "Plasma Pinch X-Ray Apparatus," U.S. Pat. No. 4,536,884, Aug. 20, 1985.

S. Iwamatsu, "X-Ray Source," U.S. Pat. No. 4,538,291, Aug. 27, 1985.

G. Herziger and W. Neff, "Apparatus for Generating a Source of Plasma with High Radiation Intensity in the X-ray Region," U.S. Pat. No. 4,596,030, Jun. 17, 1986.

A. Weiss, et. al, "X-Ray Lithography System," U.S. Pat. No. 4,618,971, Oct. 21, 1986.

A. Weiss, et. al., "Plasma Pinch X-ray Method," U.S. Pat. No. 4,633,492, Dec. 30, 1986.

I. Okada, Y. Saitoh, "X-Ray Source and X-Ray Lithography Method," U.S. Pat. No. 4,635,282, Jan. 6, 1987.

R. P. Gupta, et. al., "Multiple Vacuum Arc Derived Plasma Pinch X-Ray Source," U.S. Pat. No. 4,751,723, Jun. 14, 1988.

R. P. Gupta, et. al., "Gas Discharge Derived Annular Plasma Pinch X-Ray Source," U.S. Pat. No. 4,752,946, Jun. 21, 1988.

J. C. Riordan, J. S. Peariman, "Filter Apparatus for use with an X-Ray Source," U.S. Pat. No. 4,837,794, Jun. 6, 1989.

W. Neff, et al., "Device for Generating X-radiation with a Plasma Source", U.S. Pat. No. 5,023,897, Jun. 11, 1991.

D. A. Hammer, D. H. Kalantar, "Method and Apparatus for Microlithography Using X-Pinch X-Ray Source," U.S. Pat. No. 5,102,776, Apr. 7, 1992.

M. W. McGeoch, "Plasma X-Ray Source," U. S. Pat. No. 5,504,795, Apr. 2, 1996.

G. Schriever, et al., "Laser-produced Lithium Plasma as a Narrow-band Extended Ultraviolet Radiation Source for Photoelectron Spectroscopy", *Applied Optics*, Vol. 37, No. 7, pp. 1243–1248, March 1998.

R. Lebert, et al., "A Gas Discharged Based Radiation Source for EUV Lithography", *Int. Conf. On Micro and Nano Engineering*, September, 1998.

W. T. Silfast, et al., "High-power Plasma Discharge Source at 13.5 nm and 11.4 nm for EUV Lithography", *SPIE Proc. On Emerging Lithographic Technologies III*, Vol. 3676, pp. 272–275, March 1999.

F. Wu, et al., "The Vacuum Spark and Spherical Pinch X-ray/EUV Point Sources", *SPIE Proc. On Emerging Lithographic Technologies III*, Vol. 3676, pp. 410–420, March 1999.

I. Fomenkov, W. Partlo, D. Birx, "Characterization of a 13.5 nm for EUV Lithography based on a Dense Plasma Focus and Lithium Emission", *Sematech International Workshop on EUV Lithography*, October, 1999.

Typical prior art plasma focus devices can generate large amounts of radiation suitable for proximity x-ray lithography, but are limited in repetition rate due to large per pulse electrical energy requirements, and short lived internal components. The stored electrical energy requirements for these systems range from 1 kJ to 100 kJ. The repetition rates typically did not exceed a few pulses per second.

What is needed is a production line reliable, simple system for producing high energy ultraviolet and x-radiation which operates at high repetition rates and avoids prior art problems associated with debris formation.

SUMMARY OF THE INVENTION

The present invention provides a high energy photon source. A pair of plasma pinch electrodes are located in a vacuum chamber. The chamber contains a working gas which includes a noble buffer gas and an active gas chosen to provide a desired spectral line. A pulse power source provides electrical pulses at voltages high enough to create electrical discharges between the electrodes to produce very high temperature, high density plasma pinches in the working gas providing radiation at the spectral line of the source or active gas. Preferably the electrodes are configured co-axially. The central electrode is preferably hollow and the active gas is introduced out of the hollow electrode. This permits an optimization of the spectral line source and a separate optimization of the buffer gas. In preferred embodiments the central electrode is pulsed with a high negative electrical pulse so that the central electrode functions as a hollow cathode. Preferred embodiments present optimization of capacitance values, anode length and shape and preferred active gas delivery systems are disclosed. Preferred embodiments also include a pulse power system comprising a charging capacitor and a magnetic compression circuit comprising a pulse transformer. Special techniques are described for cooling the central electrode. In one example, water is circulated through the walls of the hollow electrode. In another example, a heat pipe cooling system is described for cooling the central electrode.

In preferred embodiments an external reflection radiation collector-director collects radiation produced in the plasma pinch and directs the radiation in a desired direction. Embodiments are described for producing a focused beam and a parallel beam. Also in preferred embodiments the active gas may be xenon or lithium vapor and the buffer gas is helium and the radiation-collector is made of or coated with a material possessing high grazing incidence reflectivity. Good choices for the reflector material are molybdenum, palladium, ruthenium, rhodium, gold or tungsten.

In other preferred embodiments the buffer gas is argon. Lithium vapor may be produced by vaporization of solid or liquid lithium located in a hole along the axis of the central electrode of a coaxial electrode configuration. Lithium may also be provided in solutions since alkali metals dissolve in amines. A lithium solution in ammonia ($NH_3$) is a good candidate. Lithium may also be provided by a sputtering process in which pre-ionization discharges serves the double purpose of providing lithium vapor and also pre-ionization. In preferred embodiments, debris is collected on a conical nested debris collector having surfaces aligned with light rays extending out from the pinch site and directed toward the radiation collector-director. The reflection radiation collector-director and the conical nested debris collector could be fabricated together as one part or they could be separate parts aligned with each other and the pinch site.

This prototype devices built and test by Applicants convert electrical pulses (either positive or negative) of about 10 J of stored electrical energy per pulse into approximately 50 mJ of in-band 13.5 nm radiation emitted into $2\pi$ steradians. Thus, these tests have demonstrated a conversion efficiency of about 0.5%, Applicants estimate that they can collect about 18 percent of the 50 mJ 13.5 nm radiation so that this demonstrated collected energy per pulse will be in excess of 7 mJ. Applicants have demonstrated 100 Hz continuous operation and 1000 Hz short burst operation. Thus, 0.7 Watt continuous and 7 Watt burst outputs have been demonstrated. Applicants have also shown that the techniques described herein can be applied to provide outputs in the range of 60 Watts at repetition rates of 5,000 Hz or greater. At 2000 Hz, the measured pulse-to-pulse energy stability, (standard deviation) was about 9.4% and no drop out pulses were observed. The electrical circuit and operation of this prototype DPF device is presented along with a description of several preferred modifications intended to improve stability, efficiency and performance.

The present invention provides a practical implementation of EUV lithography in a reliable, high brightness EUV light source with emission characteristics well matched to the reflection band of the Mo/Si or Mo/Be mirror systems. Tests by Applicants have demonstrated an improved electrode configuration in which the central electrode configuration in which the central electrode is hollow and configured as a cathode. For this configuration the hollow cathode produces its own pre-ionization so special pre-ionization is not needed.

BRIEF DESCRIPTION OF THE DRAWINGS

FIGS. 5B1–5B6 are drawings showing the buildup of the plasma pinch.

FIG. 5C shows a cross section of the electrode region with the addition of a blast shield.

FIGS. 5C1–5C6 are drawings showing the buildup of the plasma pinch with the blast shield in place.

FIG. 6 is a pulse shape produced by an early prototype unit.

FIG. 7A is a prospective drawing of a hyprobolic collector.

FIG. 7B shows a portion of the EUV beam produced by an ellipsoidal collector.

FIG. 11 is a chart showing reflectivity of various materials for 13.5 mn ultraviolet radiation.

DETAILED DESCRIPTION OF PREFERRED EMBODIMENTS

Basic Design

Figure 1:
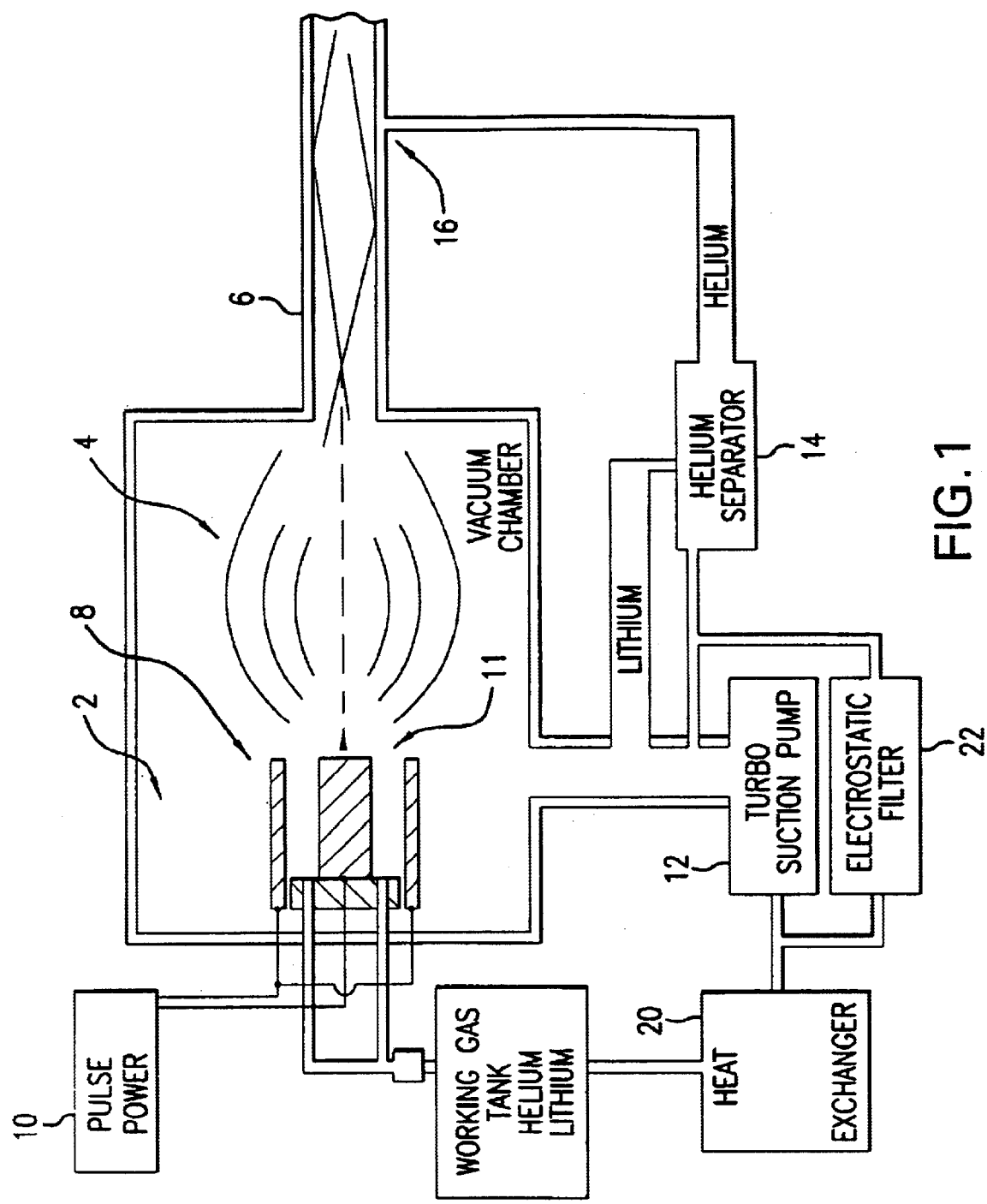
FIGS. 1 and 1A are drawings of high energy photon sources representing preferred embodiments of the present invention.
Figure 1A:
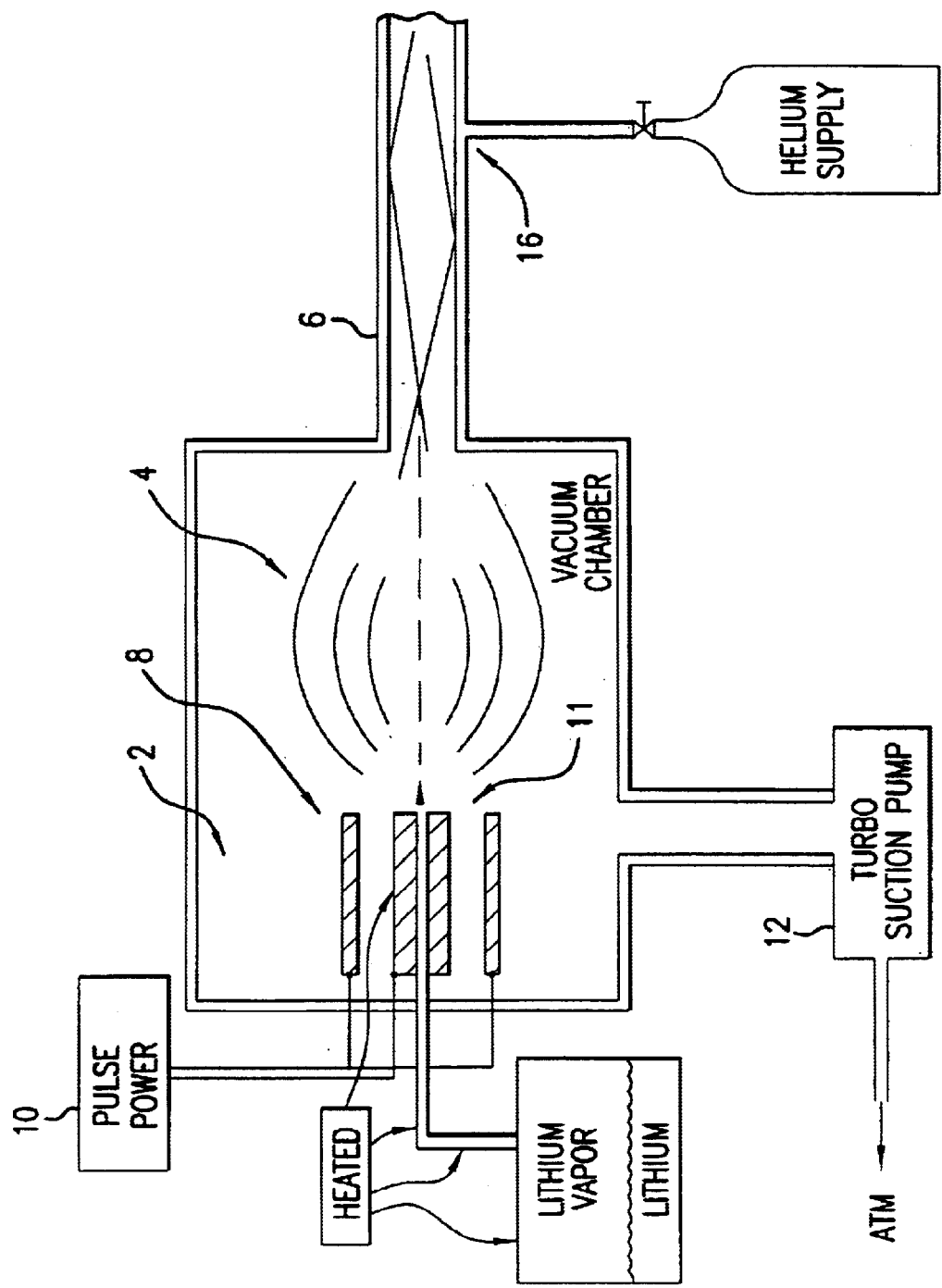

Simplified drawings showing two configurations of high energy ultraviolet light sources are shown in FIGS. 1 and 1A. The major components are a plasma pinch unit 2, a high energy photon collector 4 and a hollow light pipe 6. The plasma pinch source comprises a coaxial electrode 8 powered by a low inductance pulse power circuit 10. The pulse power circuit in this early experimental embodiment is a high voltage, energy efficient circuit capable of providing very fast (approximately 50 ns) rise time pulses in the range of 1.4 kV to 2.5 kV to coaxial electrode 8 at a rate of at least 1,000 Hz.

In the FIG. 1 case, a small amount of working gas, such as a mixture of helium and lithium vapor, is present near the base of the electrode 8 as shown in FIG. 1. At each high voltage pulse, avalanche breakdown occurs between the inner and outer electrodes of coaxial electrode 8 either due to preionization or self breakdown. The avalanche process occurring in the buffer gas ionizes the gas and creates a conducting plasma between the electrodes at the base of the electrodes. Once a conducting plasma exists, current flows between the inner and outer electrodes. In this preferred embodiment, the inner electrode is at high positive voltage and outer electrode is at ground potential. Current will flow from the inner electrode to the outer electrode and thus electrons will flow toward the center and positive ions will flow away from the center. This current flow generates a magnetic field which acts upon the moving charge carriers accelerating them away from the base of the coaxial electrode 8.

When the plasma reaches the end of the center electrode, the electrical and magnetic forces on the plasma, pinch the plasma to a "focus" around a point 11 along the centerline of and a short distance from the end of the central electrode and the pressure and temperature of the plasma rise rapidly reaching extremely high temperatures, in come cases much higher than the temperature at the surface of the sun! The dimensions of the electrodes and the total electrical energy in the circuit are preferably optimized to produce the desired black body temperature in the plasma. For the production of radiation in the 13 nm range a black body temperature of over 20–100 eV is required. In general, for a particular coaxial configuration, temperature will increase with increasing voltage of the electrical pulse. The shape of the radiation spot is somewhat irregular in the axial direction and roughly gausian in the radial direction. The typical radial dimension of the source is 300 microns and its length is approximately 4 mm.

In most prior art plasma pinch units described in the technical literature, the radiation spot emits radiation in all directions with a spectrum closely approximating a black body. The purpose of the lithium in the working gas is to narrow the spectrum of the radiation from the radiation spot.

A second basic design is shown in FIG. 1A. In this case, lithium vapor is the active gas and is injected through the center of the anode. The buffer gas is helium and it is injected at a separate location which could be downstream on the light path as shown in FIG. 1A but for high repetition rate devices, at least some of the buffer gas preferably is injected into the space between the electrodes. A suction pump is used to create the desired vacuum in the chamber. The lithium lines are heated to keep the lithium in a vapor state.

Lithium Vapor

Figure 8:
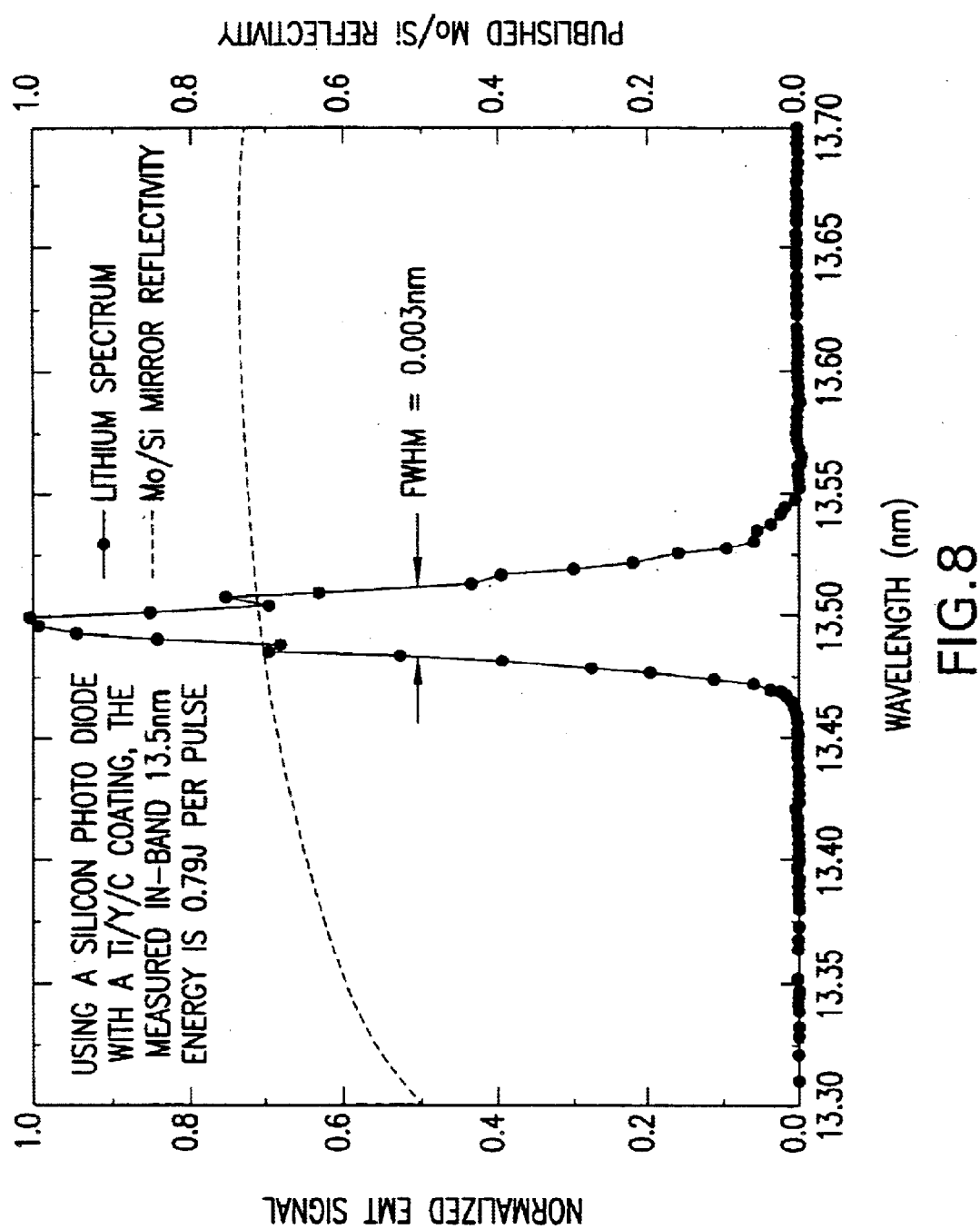
FIG. 8 shows the 13.5 nm lithium peak relative to reflectivity of MoSi coatings.

Doubly ionized lithium exhibits an electronic transition at 13.5 nm and serves as the radiation source atom in the buffer of helium. Doubly ionized lithium is an excellent choice for two reasons. The first is the low melting point and high vapor pressure of lithium. The lithium ejected from the radiation spot can be kept from plating out onto the chamber walls and collection optics by simply heating these surfaces above 180° C. The vapor phase lithium can then be pumped from the chamber along with the helium buffer gas using standard turbo-molecular pumping technology. And the lithium can be easily separated from the helium merely by cooling the two gases. Coating materials are available for providing good reflection at 13.5 nm. FIG. 8 shows the lithium emission peak in relation to the published MoSi reflectivity. A third advantage of using lithium as the source atom is that non-ionized lithium has a low absorption cross section for 13.5 nm radiation. Furthermore, any ionized lithium ejected from the radiation spot can be easily swept away with a moderate electric field. The remaining non-ionized lithium is substantially transparent to 13.5 nm radiation. Another preferred radiation source atom is Xenon which has a broad band emission line in the range of 13.5 nm. Embodiments using xenon are discussed in subsequent sections.

Radiation Collector

The radiation produced at the radiation spot is emitted uniformly into a full 4π steradians. Some type of collection optics is needed to capture this radiation and direct it toward the lithography tool. Several materials are available with high reflectivity at small grazing incident angles for 13.5 nm UV light. Graphs for some of these are shown in FIG. 11. Good choices include molybdenum, rhodium and tungsten. The collector may be fabricated from these materials, but preferably they are applied as a coating on a substrate structural material such as nickel. This conic section can be prepared by electroplating nickel on a removable mandrel.

To produce a collector capable of accepting a large cone angle, several conical sections can be nested inside each other. Each conical section may employ more than one reflection of the radiation to redirect its section of the radiation cone in the desired direction. Designing the collection for operation nearest to grazing incidence will produce a collector most tolerant to deposition of eroded electrode material. The grazing incidence reflectivity of mirrors such as this depends strongly on the mirror's surface roughness. The dependence on surface roughness decreases as the incident angle approaches grazing incidence. Applicants estimate that their devices can collect and direct the 13 nm radiation being emitted over a solid angle of least 25 degrees.

Conical Nested Debris Collector

Figure 9:
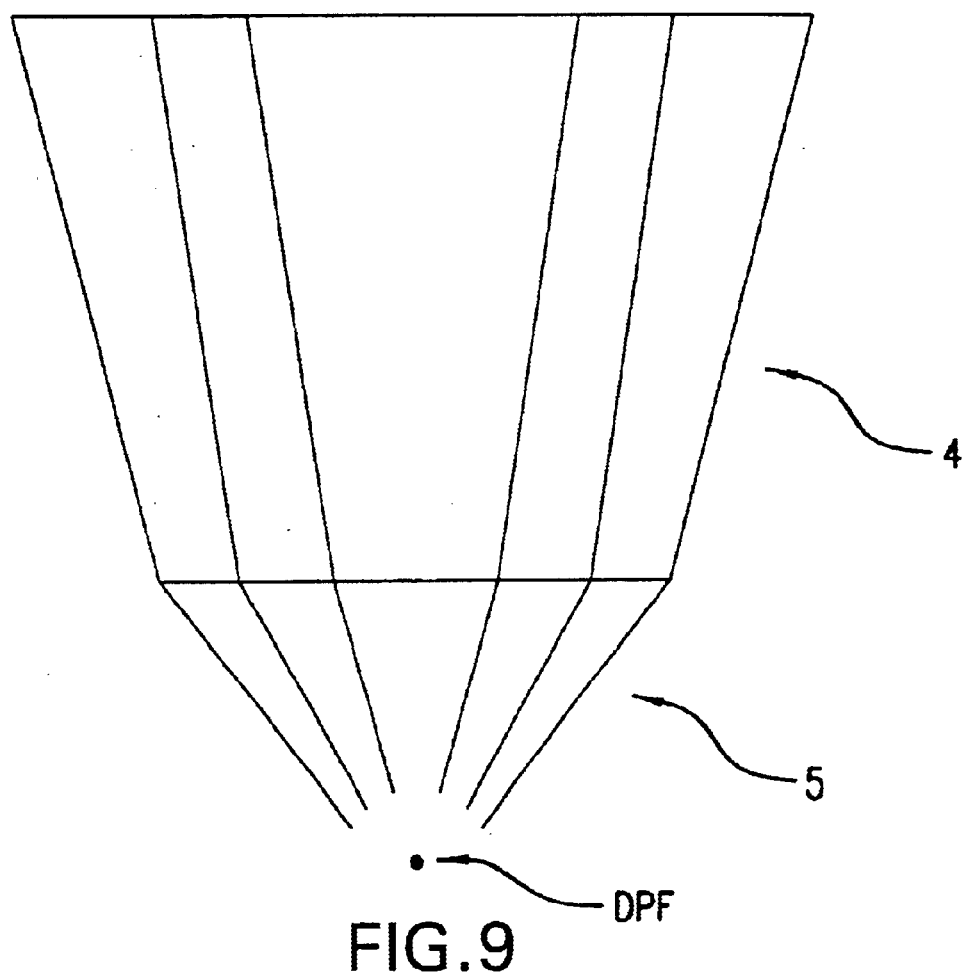
FIG. 9 shows a nested conical debris collector.

In another preferred embodiment the collector-director is protected from surface contamination with vaporized electrode material by a debris collector which collects all of the tungsten vapor before it can reach the collector director 4. FIG. 9 shows a conical nested debris collector 5 for collecting debris resulting from the plasma pinch. Debris collector 5 is comprised of nested conical sections having surfaces aligned with light rays extending out from the center of the pinch site and directed toward the collector-director 4.

The debris collected includes vaporized tungsten from the tungsten electrodes and vaporized lithium. The debris collector is attached to or is a part of radiation collector-director 4. Both collectors are comprised of nickel plated substrates. The radiation collector-director portion 4 is coated with molybdenum or rhodium for very high reflectivity. Preferably both collectors are heated to about 400° C. which is substantially below the melting point of lithium and substantially below the melting point of tungsten. The vapors of both lithium and tungsten will collect on the surfaces of the debris collector 5 but lithium will vaporize off and to the extent the lithium collects on collector-director 4, it will soon thereafter also vaporize off. The tungsten once collected on debris collector 5 will remain there permanently.

Parabolic Collector

Figure 7:
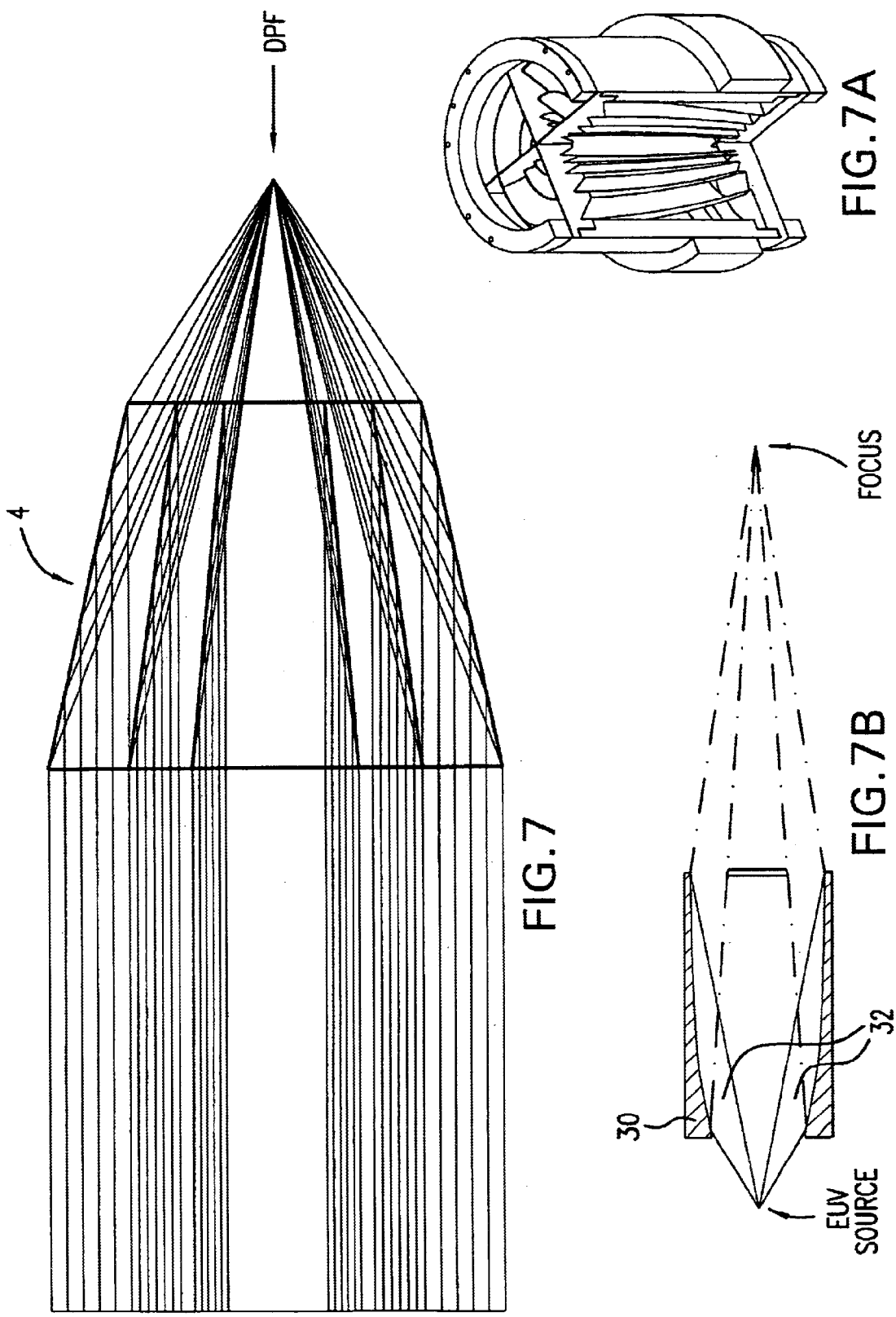
FIG. 7. shows a portion of the EUV beam produced by a hyprobolic collector.

FIG. 7 shows the optical features of a collector designed by Applicants. The collector is comprised of five nested grazing incident parabolic reflectors, but only three of the five reflections are shown in the drawing. The two inner reflectors are not shown. In this design the collection angle is about 0.4 steradians. As discussed below the collector surface is coated and is heated to prevent deposition of lithium. This design produces a parallel beam. Other preferred designs such as that shown in FIGS. 1, 3 and 10 would focus the beam. The collector should be coated with a material possessing high glazing incidence reflectivity in the 13.5 nm wavelength range. Two such materials are palladium and ruthenium.

Ellipsoidal Mirror

Another collector-director designed to focus the beam is shown in FIG. 7B. This collector-director utilizes an ellipsoidal mirror 30 to focus the EUV source. Mirrors of this type are available commercially from suppliers such as Reflex S.V.O. with facilities in the Czech Republic and are distributed in the United States by Bede Scientific Instruments Ltd. with offices in the United Kingdom and Englewood, Colo. The reader should note that this mirror collects only rays at angles shown at 32 in FIG. 7B. However, additional mirror elements could be included inside mirror 30 and outside mirror 30 to collect and focus additional rays. The reader should also note that other mirror elements could be localized downstream of mirror 30 to collect the narrow angle rays or upstream of mirror 30 to collect the wider angle rays.

Other Light Collection and Debris Control Techniques

Techniques for control of active gas and buffer gas is described by reference to FIGS. 18A–E, 19 and 19A–C.

Injection Through Anode

FIG. 2A shows features of a preferred embodiment of the present invention in which the active gas in this case Xe (mixed 1 part and 14 parts with helium) is injected through the anode. The buffer gas (in this case 100% He) is injected at 12 in the region downstream of collector-director 8. Debris collector 6 comprises nested conical sections providing narrow passageways in line with rays extending from the center of the pinch region to collector-director 8. These passageways permit about 85% of the photons directed toward collector-director 8 to pass but retards substantially the passage of debris generated in the pinch region which follows paths much more random than the EUV light. Gas is exhausted from vacuum chamber 10 through port 14 by a 40 liter per second vacuum pump. Therefore, buffer gas flow from gas feed 12 through the narrow passageways in debris collector 6 further retards the passage of debris from the pinch and also retards flow of the Xe active gas from the pinch region into the region of chamber 10. Therefore, substantially all of the debris from the pinch region and active gas injected through port 24 is either exhausted through port 14 or coats the surfaces of the debris collector or the inside walls of the vessel upstream of the debris collector. This avoids contamination of collector-director 8 by debris from the pinch and minimize attenuation of the beam by xenon gas since the flow of buffer gas through the narrow passageway in debris collector 6 prevents any significant quantity of xenon from entering the region downstream of debris collector 6.

Two Direction Gas Flow

FIG. 2B shows features of an embodiment of the present invention in which two directional gas flow is utilized to permit a controlled concentration of active gas near the pinch region with minimum concentration of active gas in the downstream portion of the EUV beam path. In this case the active gas is introduced through the center of anode 18A as shown at 24 FIG. 2B. In this preferred embodiment, the introduced gas is a $\frac{1}{15}$ to $\frac{14}{15}$ mixture of xenon and helium. Helium is also introduced at 12 as in the above embodiment. The introduced gas from both sources is exhausted at 14 with a vacuum pump of the type described above. Gas flows are controlled to produce a pressure of about 0.75 torr in the pinch region and a pressure of about 1 torr in the collector-director region so that gas flow from the collector director region is much greater than the flow from the pinch region.

Upstream Injection of Active Gas

FIG. 2C shows another preferred technique for controlling debris and the active gas and minimizing EUV absorption by the active gas. Gas pressure in the pinch region is about 0.5 torr. In this embodiment, gas flows within vacuum chamber 10 are arranged to help deter debris from the pinch region from reaching the region of collector director unit 8 and to minimize the quantity of active gas in the region beyond the immediate volume surrounding the pinch region. The active gas which could be, for example, xenon is injected about 3 centimeters upstream of the pinch region through nozzle 2 at a rate of about 5 SCCM and almost all of it is exhausted via a exhaust port 3 running through electrode 18A along its axis at a pumping speed of 50 liter/second. The exhaust flow is provided by a vacuum pump such as design blower backed by an Anect Iwata ISP-500 scroll pump available from Synergy Vacuum a Canadian company. This provides a pump speed of 40 liters per second. The xenon is fed into nozzle 2 through gas pipe 4 running through the central region of debris catcher 6. Debris catcher 6 is comprised of nested conical sections at 6A having surfaces aligned with light rays extending out from the center of the pinch site and directed toward collector director 8. These nested conical sections provide a relatively unobstructed passageway for EUV photons produced in the pinch which are directed toward collector director 8. The passageways are narrow and about 10 cm long.

Debris collector 6 collects (by condensation) tungsten vaporized from tungsten electrode 18A. (If the active gas is lithium vapor debris, the vapor will condense on the surfaces of debris collector 6.)

Buffer gas which in this embodiment is helium is injected downstream of collector director 8 as shown at 12 and most of the buffer gas is exhausted from vacuum chamber 10 through exhaust port 14 by a vacuum pump (not shown) of the type described above. About 90 percent of the helium flow passes through collector director 8 in the direction toward the pinch region and all of the buffer gas passes through the nested conical section region 6A. As in the above example, this gas flow helps deter debris produced in the pinch region from reaching director-collector 8 and also minimizes the amount of active gas in the path of the light being collected and directed by collector-director 8 to produce the output EUV beam. These features are important because any debris accumulation on the surfaces of debris collector 8 reduces its reflectivity and active gas in the EUV beam path will attenuate the beam.

Gas exhausted through port 3 is preferably filtered and exhausted to the atmosphere. Gas exhausted through port 14 may also be exhausted to the atmosphere without excessive gas cost since total helium gas flow in this system is only about 16 grams per hour. Alternatively, the helium and/or the active gas may be separated and recirculated.

Lithium As Active Gas

Lithium vapor may more efficiently convert the pinch energy into useful light at the desired wavelength range. Lithium is a solid at room temperature and a liquid between the temperature oft 180° C. and 1342° C. Many methods are available to introduce lithium vapor into the discharge and pinch regions. Lithium can be heated to its vapor temperature and introduced as a vapor. It could be introduced as a solid or liquid and vaporized by the discharge or the pinch or it could be vaporized with other forms of energy such as a high power laser pulse or by some other form of heating such as a resistance heating element, an electric discharge or rf heating. Lithium can also be introduced as a compound such as $Li_2O$, $LiH$, $LiOH$, $LiCl$, $Li_2CO_3$, $LiF$, $LiCH_3$ or their solutions in water or other liquid.

Lithium may also be delivered to the pinch region by means of laser induced evaporation or ablation. Lithium metal target 30 will be attached to a holder mounted from the central disk in the debris collector as shown in FIG. 18. In one preferred example, a KrF excimer 32 produces a pulsed laser beam of 248 nm wavelength and energy of 100 mJ to 200 mJ per pulse, with effective pulse length of 50 ns is passed through a window 34 mounted on the upstream side of the anode. The light will pass through the hollow anode and be focused by means of a lens 36 mounted external to the vacuum chamber to a spot of approximately 1 mm in diameter. This laser intensity and spot size is sufficient to heat the Li metal at such a high rate that the temperature rise is dominated by the latent heat of vaporization. The threshold power density required is about $5 \times 10^7$ W/cm$^2$. At lower power Li can also be evaporated at a rate governed by its vapor pressure at a given temperature.

Figure 18A:
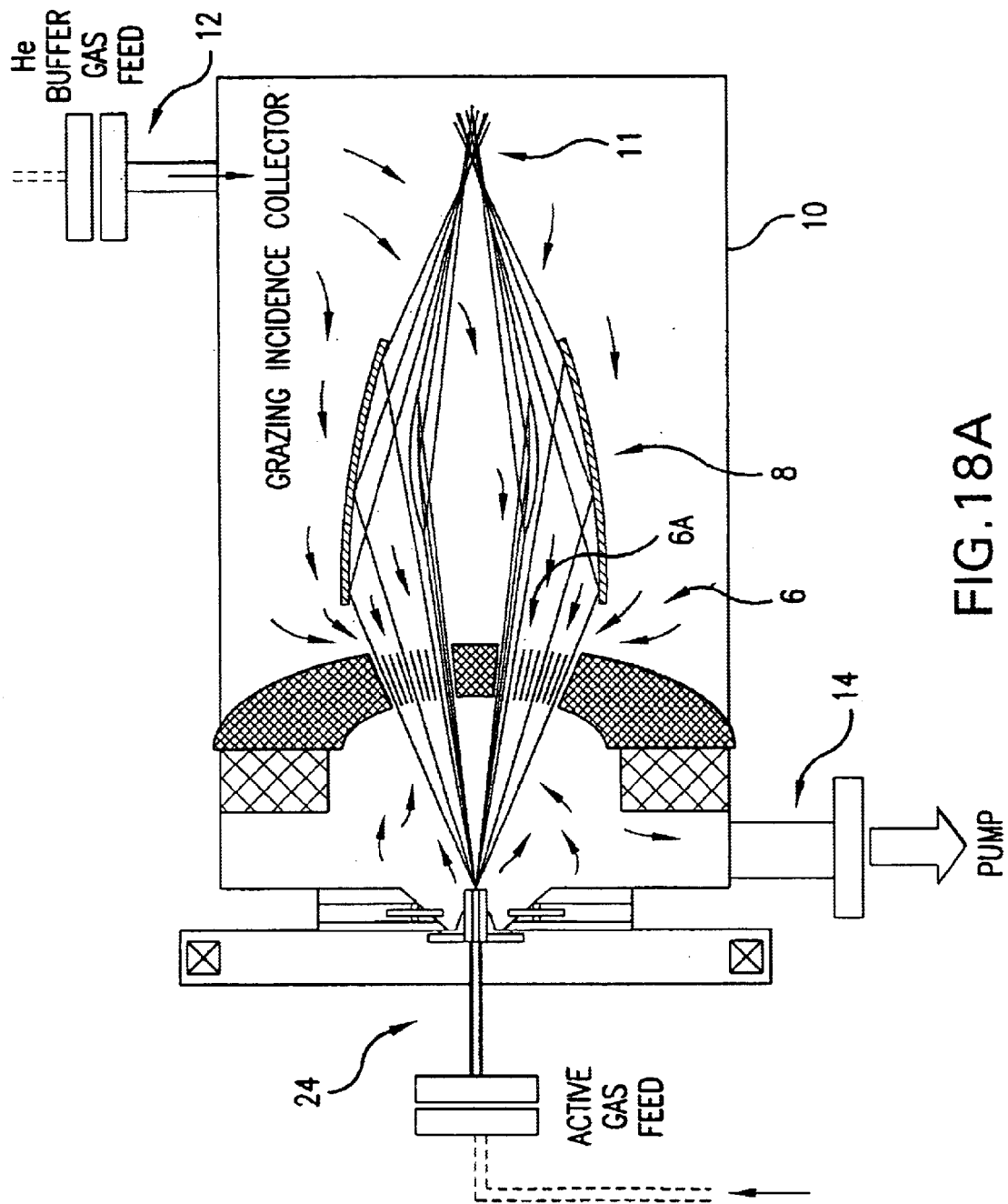
FIGS. 18A, B, C, D, and E show techniques for controlling active gas and buffer gas in the vacuum vessel of preferred embodiments.
Figure 18B:
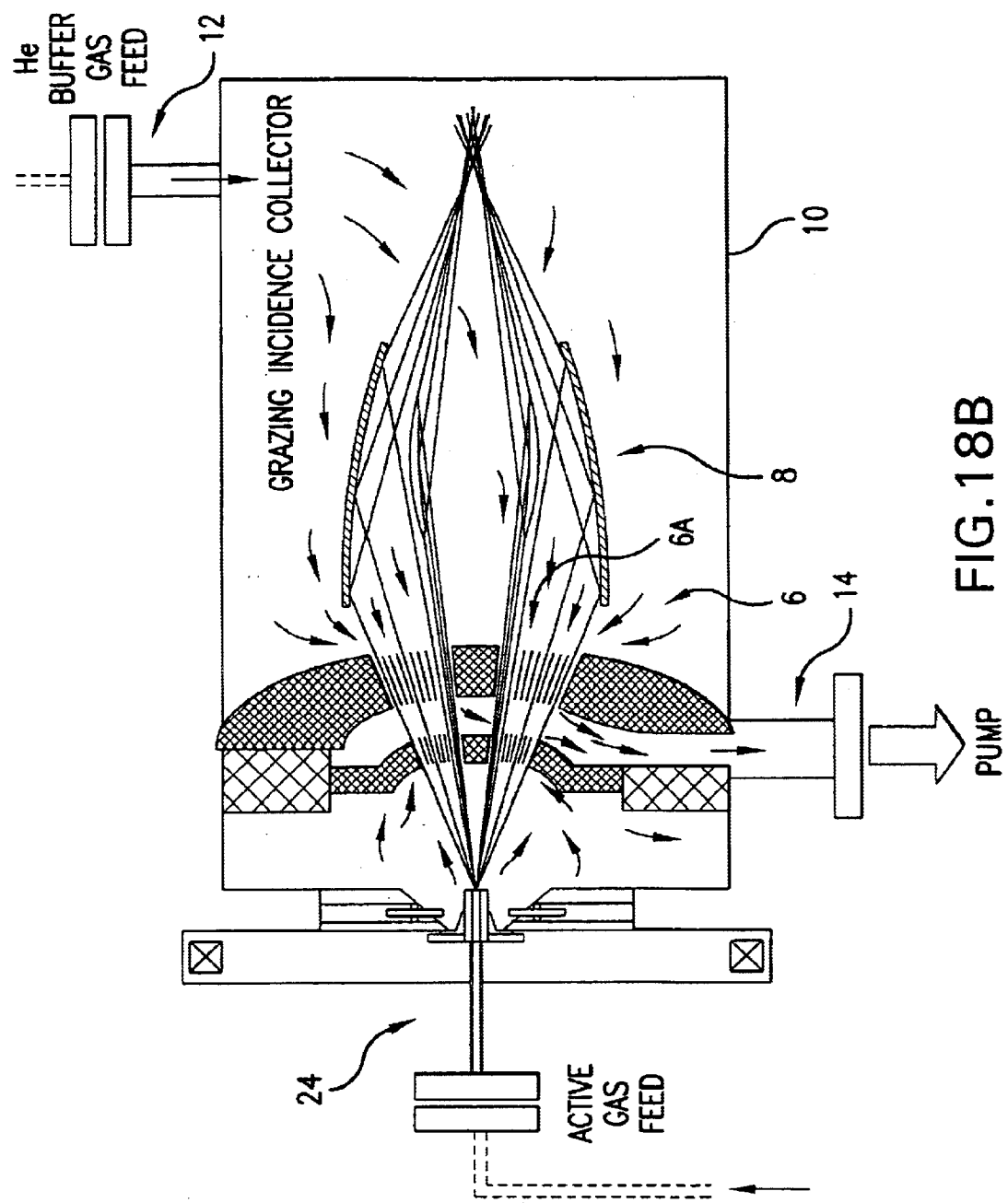
Figure 18C:
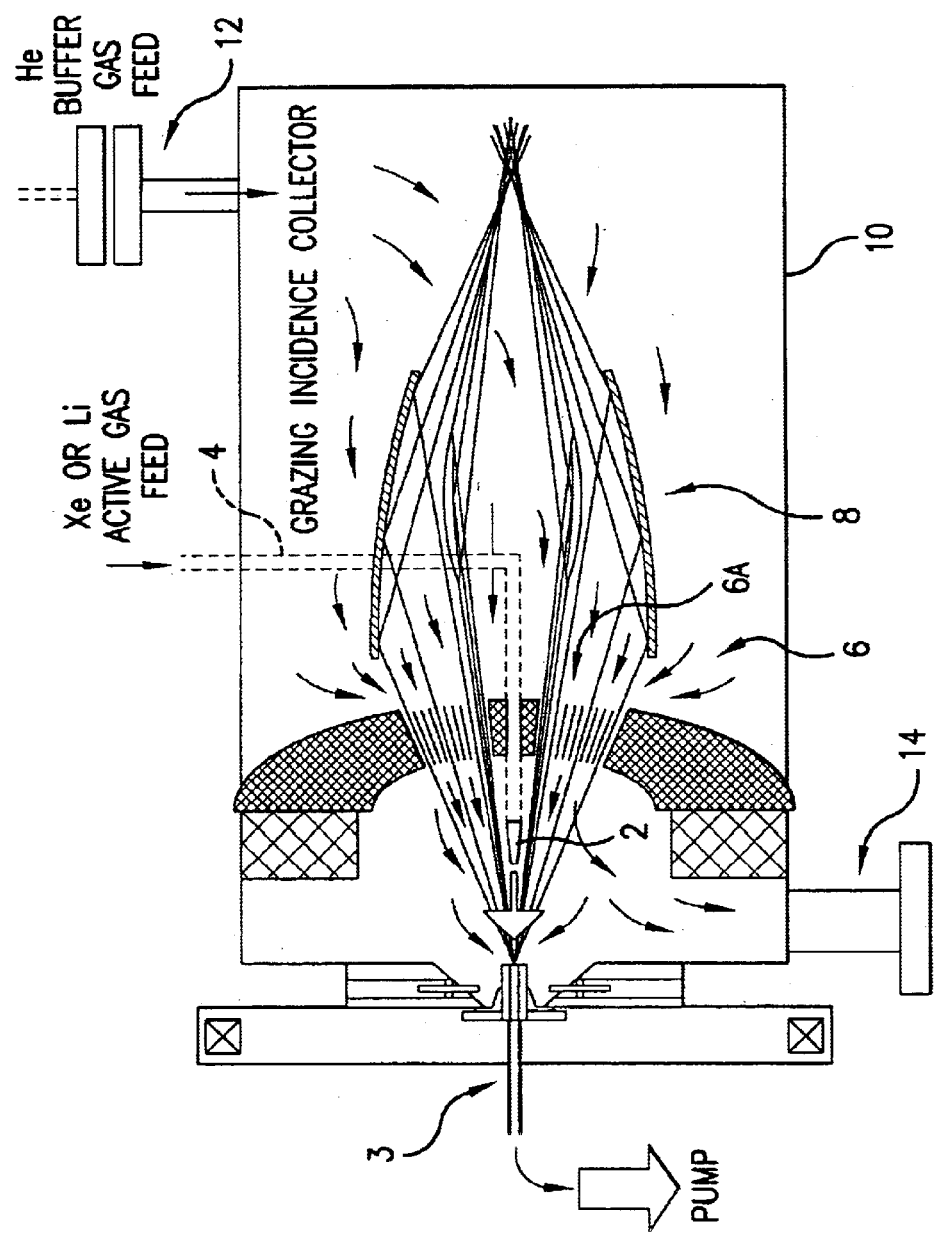
Figure 18D:
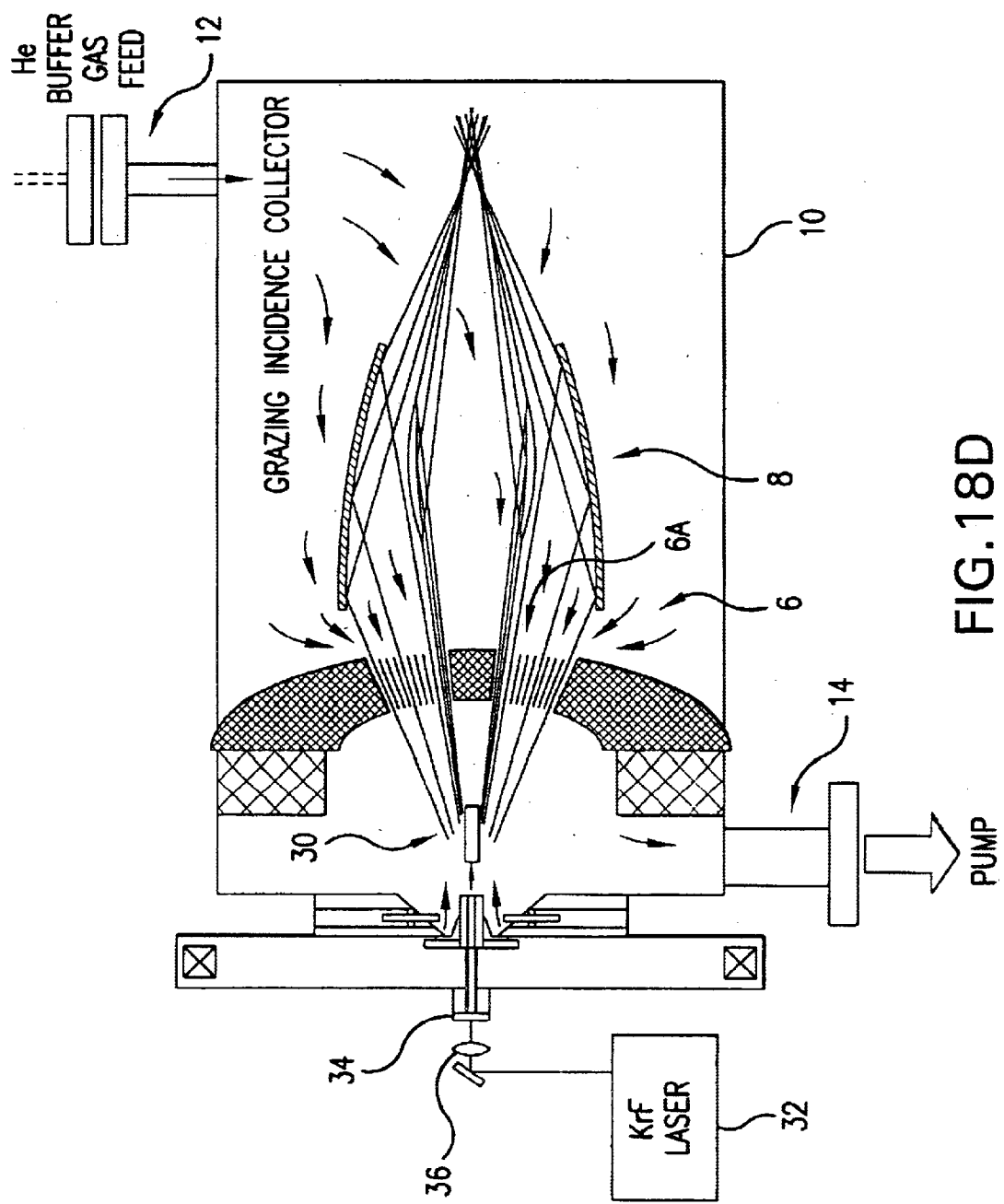
Figure 18E:
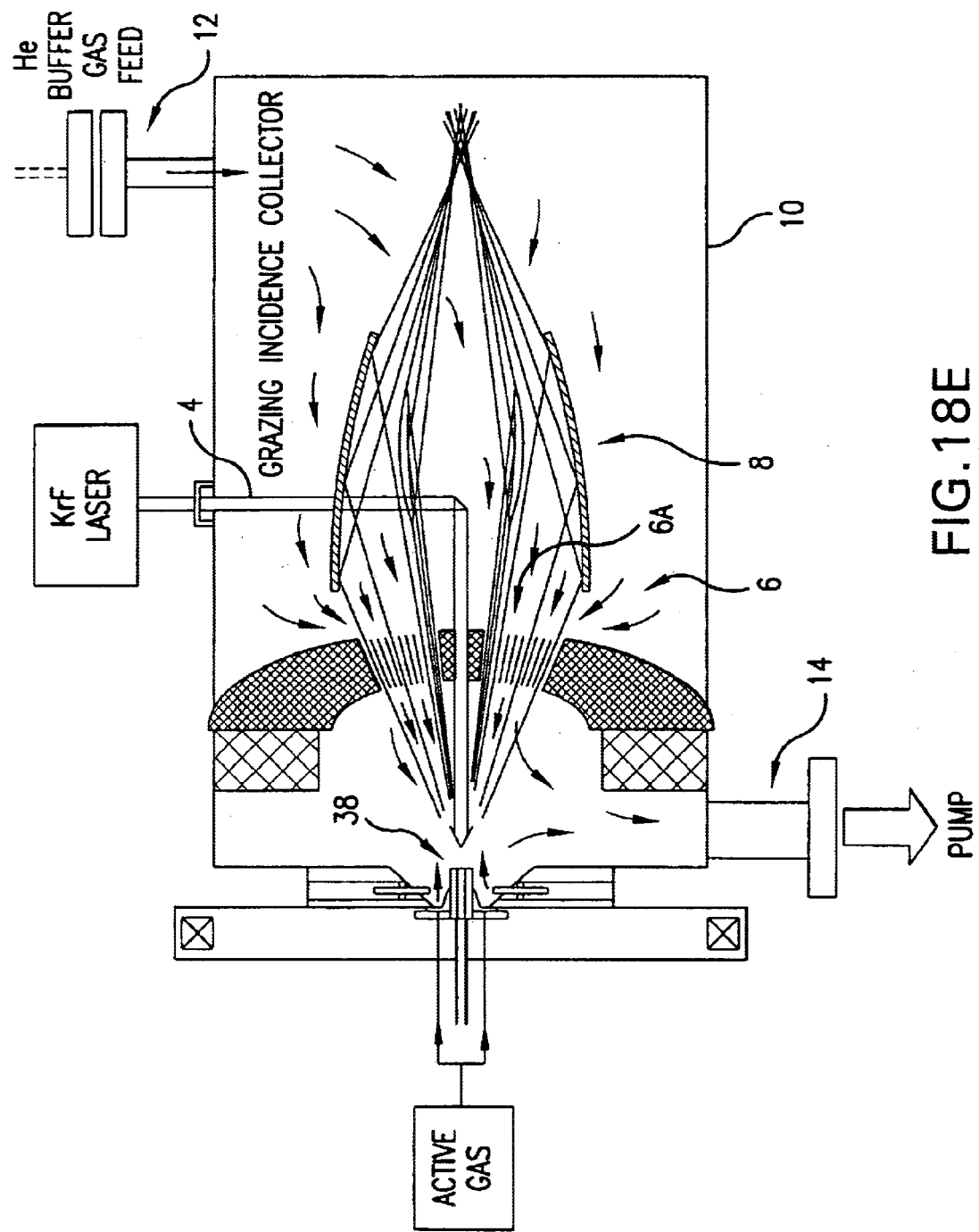

In an alternative embodiment the central region of the central electrode as shown in FIG. 18A is packed with Li metal as shown at 38 in FIG. 18 and the laser beam is passed through the center of the debris shield. In this version the debris shield 8 as shown at 40 in FIG. 18E.

In another technique by which we can deliver Li to the pinch region is to attach the Li metal to a tungsten plate which is in turn mounted on a housing containing a permanent magnet. This arrangement is mounted on an insulating shaft from the debris collector. Li metal is further covered with a tungsten mask to expose only a small region of Li. A radio frequency produced plasma is generated in the region in front of the Li target by means of an RF generator operating at a frequency of 500 MHz to 2.45 GHz. The discharge may be operated in either pulsed or CW mode. In pulsed mode, the discharge will be synchronized with the plasma pinch. An RF power of 5000 W is generally sufficient.

The generated plasma will be composed of the buffer gas, generally He. He ions will be extracted from the plasma by application of a negative bias voltage onto the Li target. A bias of 500 V to 2000 V will be sufficient. He+ ions striking the Li will sputter Li atoms from the surface. Sputter yields over the bias energies mentioned vary from approximately 0.2 to 0.3 for normal incidence. Significantly higher yields can be expected for grazing incidence and for Li at elevated temperature.

Collector—Director

Tandem Ellipsoidal Mirror

Figure 19:
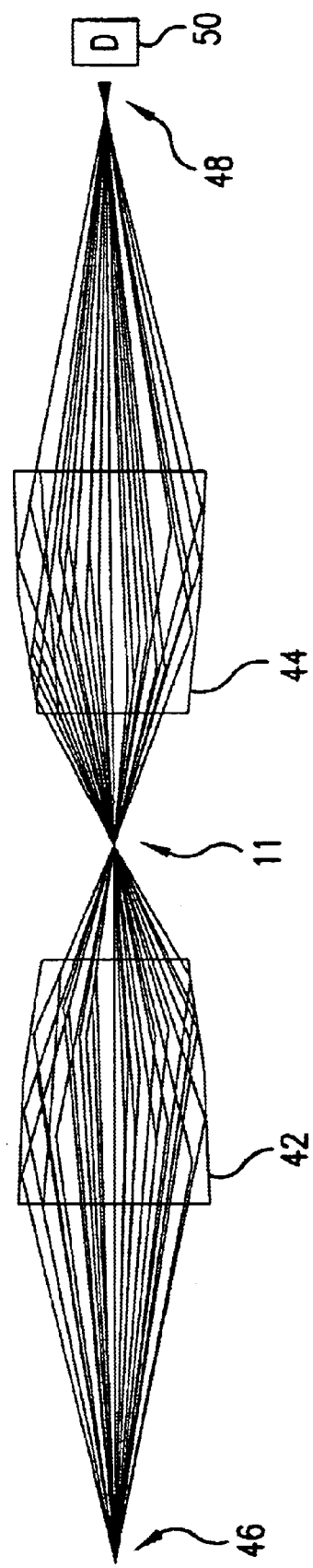
FIG. 19 shows a tandem ellipsoidal mirror arrangement.

FIG. 19 shows a preferred collector director design for greatly improving the EUV beam profiled. This is a tandem ellipsoidal mirror unit which collects and directs the EUV radiation produced in the plasma pinch.

In most lithography applications the target region needs to be exposed uniformly. A single or nested ellipsoidal mirror of the type shown in FIG. 2A when used to collect and re-focus the EUV radiation produces a very non-uniform annulus of radiation upstream and downstream of focal point 11 shown in FIG. 2A. This is a natural effect caused by the geometry of the ellipsoidal collector. The front of the mirror collects a greater solid angle of the source emission per unit mirror surface area than the back of the mirror. This effect can be reversed by using a second ellipsoidal mirror 44 in tandem with the first mirror 42 as shown in FIG. 19. (In this embodiment, single ellipsoidal mirrors are used without a second nested ellipsoidal mirror.) The second ellipsoidal mirror 44 is a mirror image of the first ellipsoidal mirror 42 "reflected" about the second focal point of the first mirror. This places the second ellipsoidal mirror on the same optical axis as the first mirror so that its first focal point is at the second focal point of the first mirror. In this case of the tandem ellipsoidal mirror the radiation leaving the second focal point of the second mirror is annular but the radiation within the annulus is uniform. The exposure uniformity is now a function of the surface figure of the ellipsoidal mirrors and not the inherent collection geometry of the ellipsoidal mirror.

Analysis

The optical characteristics of the tandem ellipsoidal mirror were analyzed by Applicants with the ray tracing code, TracePro, supplied by Lambda Research Corporation of Littleton, Mass. The EUV radiation from the DPF source is incoherent. Consequently, a ray tracing code can be used to determine the properties of the radiation collected and leaving the tandem mirror. The EUV radiation requires special reflective surfaces such as molybdenum or ruthenium. This analysis was performed under the assumption that the mirror surface has a perfect ellipsoidal reflector and that the radiation is not polarized during reflection. The mirror surface was assumed to be pure ruthenium reflecting at 13.5 nm. Also, the source has been assumed to be a 50 micron diameter disc and that the radiation emits isotropically from each point on its surface. These assumptions do not detract from the basic ability of the tandem mirror to produce a uniform annular exposure region.

The geometry of the tandem ellipsoidal mirror is illustrated in FIG. 19. Both mirrors have the same parameters. Their minor radius is 40 mm and their focal length is 150 mm. The mirrors are each 100 mm long and have been cut through their minor diameter. The figure also shows a few random rays collected by the first mirror. A fraction of the radiation that leaves the plasma pinch source 46 at the first focal point of the first mirror is collected and re-focused at the second focal point 11 of the first mirror. The radiation leaving focal point 11 at 300 mm from source 46 is collected by the second ellipsoidal mirror and re-focused at the second focal point of the second mirror 48 at 300 mm from focal point 11. At focal point 48 a 1:1 image of the source is produced. As the radiation leaves focal point 48, the rays diverge to produce an annular exposure area at detector 50 which is located 9 mm from focal point 48. The intensity in this annular region is uniform as shown by the TracePro calculation in FIG. 19. The uniformity in the main annular region is within ±2.5% of the mean value. A simulation performed by Applicants of the beam profile at detector 50 is shown in FIG. 19 which may be compared with a similar simulation made for the beam cross section at 9 mm downstream of focal point 11. A cross section of the two profiles is compared in FIG. 19 with the detector 50 cross section shown at 52 and the cross section of the FIG. 19 beam profile at 54.

Fabrication

The techniques for ellipsoidal mirror fabrication have been improved over the past few 10s of years. The surface quality of these mirrors can now be made to satisfy the requirements of surface figure, surface roughness, and the material of the reflecting surface for their use in the EUV region. Four materials have been identified as possible candidates for the EUV ellipsoidal mirror surface: molybdenum, ruthenium, rhodium, and palladium. These materials have relatively high grazing incidence reflectivity at 13.5 nm. The grazing incidence reflectivity must remain high at relatively high angles to allow the mirror to collect a reasonable solid angle subtended from the source. Theoretically, ruthenium has the highest collection efficiency of the four materials listed.

These mirrors are fabricated though a series of processes. First, a mandrel is made that has the outside figure of the desired mirror. Typically, the mandrel is made undersize using aluminum and then coated with electroless nickel containing 15% phosphorus to make the mandrel oversize. The electroless nickel is put on about 0.5 mm thick so that the entire surface can be diamond turned to the desired mirror surface figure by vendors such as Corning Netoptic with offices in Marlborough, Mass. This typically leaves about 0.1 mm of nickel on the mandrel surface. Although the present technology of diamond turning is very good the surface at this stage is not adequate for use as an EUV mirror. The diamond turning can be accurate enough for the figure requirements that include the deviations from the elliptical surface front-to-back and the roundness of the surface but the micro-roughness is too high. The diamond turned surface must be polished to reduce the micro-roughness to less than 0.5 nm RMS. The hardness of the nickel surface imparted by the high phosphorus content of the electroless nickel is required for the high degree of polishing. After the electroless nickel surface is adequately polished and the surface figure is within specifications, the reflecting surface material is coated onto the mandrel surface. The exact procedure used to coat the surface is dictated by the properties of the reflecting material being added to the surface. After the reflecting coating has been placed on the mandrel, nickel is electroformed over this surface to a thickness of about 0.5 mm. The electroformed nickel is removed from the mandrel by applying force along the axis of the mandrel between the mandrel and the electroformed nickel. The reflecting surface stays with the electroformed nickel shell to form the mirror as it slides off the nickel surface on the mandrel. The surface of the highly polished electroless nickel with the high phosphorus content acts as a natural release agent for the reflecting surface. After the mirror has been removed from the mandrel and the mandrel re-polished, the mandrel is then available to make additional mirrors that are exact copies of the first mirror.

Alignment

The positioning of the mirrors relative to the source and to each other is critical to the correct function of the tandem ellipsoidal mirrors. Alignment can be accomplished on an optical bench with a source placed at the same location as the DPF EUV source. One must take advantage of the optical properties of these ellipsoidal mirrors. If a detector plane is placed perpendicular to the optical axis near the second focal point, the small source, 50 microns diameter, e.g., can be placed near the first focal point of the ellipse. The image will only be centered and symmetric if the detector is at the second focal point. After the axial location of the second focal point has been determined, the detector array can be moved away from the focal point. Now the image will only be symmetric if the source is on the mirror axis. This requires positioning the source in two spatial dimensions. The axial location of the first focal point can be determined by moving the detector to the second focal point and then moving the source along the mirror axis until the detector gives a maximum signal in the image center.

This procedure must be repeated for the second mirror. After the two mirrors have been aligned, the entire assembly must be transferred to the DPF. The fixture must be adequately keyed to place the EUV source at the first focal point of the first mirror. The accuracy of positioning must be at least 25% of the effective diameter of the DPF EUV source. The present estimate of the DPF source diameter is 80 microns while looking along the machine axis. Hence, the expected alignment accuracy is 20 microns in the plane perpendicular to the machine axis. The axial alignment of the tandem mirror is not as critical and is expected to be about 0.5 mm.

Debris Mitigation

Both the mid-focal point 11 between the two mirrors and the final focal point 48 allow the DPF source region to be isolated from the lithography exposure region. At these points the EUV radiation can pass through pinholes that block any source debris or active gas (that penetrated into the region of the first elliptical mirror unit) from reaching the exposure chamber but not the EUV radiation. Also, these small pinholes allow the exposure chamber to have a much lower pressure than that required for DPF operation.

Lithography Projection Optics

The EUV projection optics should be designed to map the source spot into the entrance pupil of the projection optic and to map the far field intensity (i.e. the energy vs. angle) of the source onto the reticle. Such a design is preferred because the uniformity in the entrance pupil, though important, is not critical while the uniformity at the reticle plane is critical. This design concept exploits the fact that the emission is isotropic and thus has uniform intensity vs. angle. The dual mirror concept restores this uniform intensity vs. angle property (at least within the cone of capture angle for the mirrors). The EUV illuminator take the "ring" of intensity versus angle, break it into pieces or arcs, and overlay these arcs onto the reticle. This further improves the uniformity and can be done in EUV systems since they are scanners and thus require illumination only over a slit region.

Light Pipe

It is important to keep deposition materials away from the illumination optics of the lithography tool. Therefore, a light pipe 6 is preferred to further assure this separation. The lightpipe 6 is a hollow lightpipe which also employs substantially total external reflection on its inside surfaces. The primary collection optic can be designed to reduce the cone angle of the collected radiation to match the acceptance angle of the hollow lightpipe. This concept is shown in FIG. 1.

Pulse Power Unit

Figure 4:
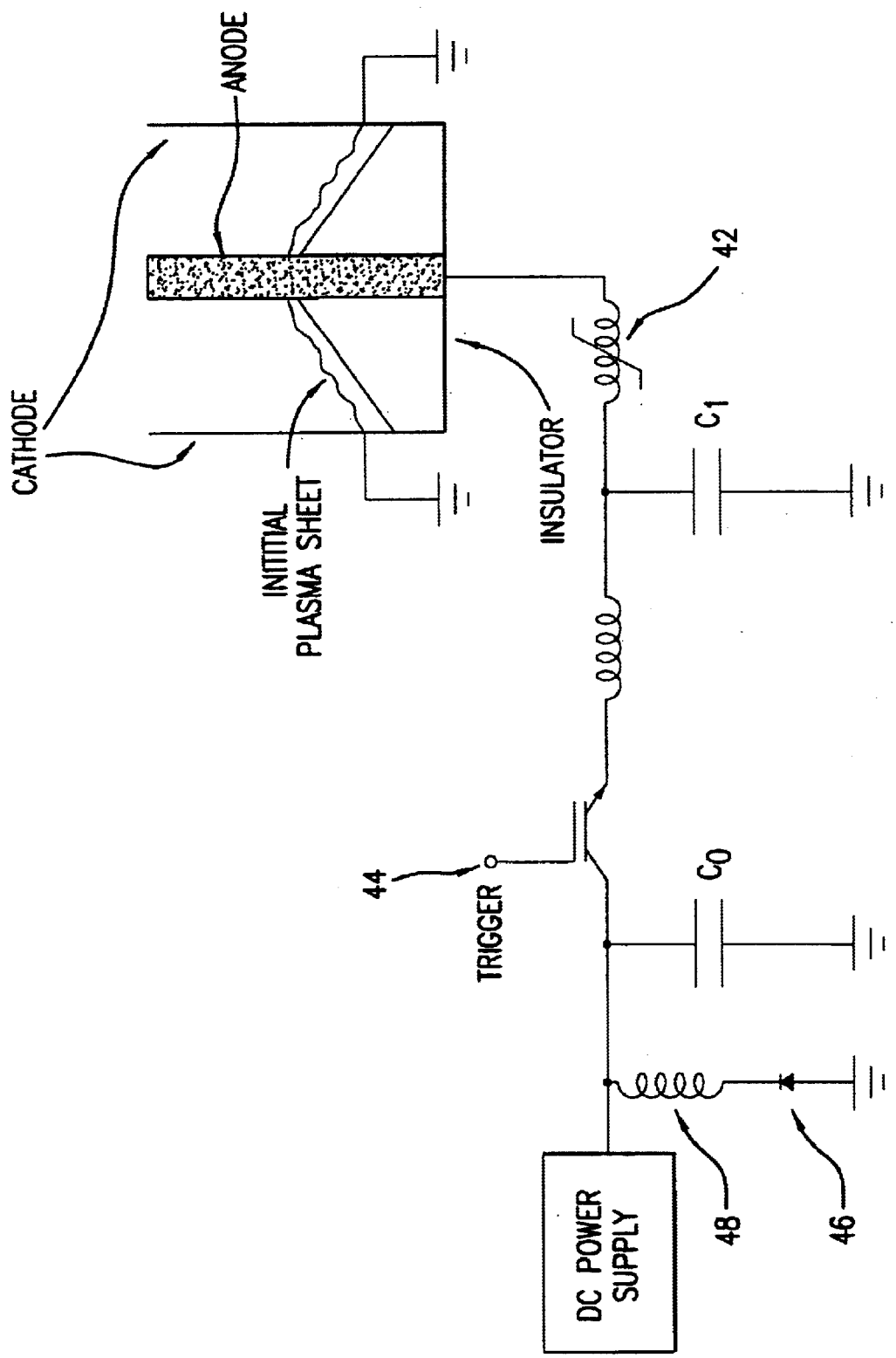
FIG. 4 is a preferred circuit diagram for a preferred embodiment of the present invention.

FIG. 4 shows a simplified electrical circuit providing pulse power. This circuit includes DC power supply 40 which is a command resonant charging supply of the type used in excimer lasers. $C_O$ which is a bank of off the shelf capacitors having a combined capacitance of 65 $\mu$F, a peaking capacitor $C_1$ which is also a bank of off the shelf capacitors having a combined capacitance of 65 $\mu$F. Saturable inductor 42 has a saturated drive inductance of about 1.5 nH. Trigger 44 is an IGBT. Diode 46 and inductor 48 creates an energy recovery circuit similar to that described in U.S. Pat. No. 5,729,562 permitting reflected electrical energy from one pulse to be stored on $C_O$ prior to the next pulse.

The System

Thus, as shown in FIG. 1, a working gas mixture of helium and lithium vapor is discharged into coaxial electrode 8. Electrical pulses from pulse power unit 10 create a dense plasma focus at 11 at sufficiently high temperatures and pressures to doubly ionize the lithium atoms in the working gas generating ultraviolet radiation at about 13.5 nm wavelength.

This light is collected in total external reflection-collector 4 and directed into hollow light pipe 6 where the light is further directed to a lithography tool (not shown). Discharge chamber 1 is maintained at a vacuum of about 4 Torr with turbo suction pump 12. Some of the helium in the working gas is separated in helium separator 14 and used to purge the lightpipe as shown in FIG. 1 at 16. The pressure of helium in the light pipe is preferably matched to the pressure requirements of the lithography tool which typically is maintained at a low pressure or vacuum. The temperature of the working gas is maintained at the desired temperature with heat exchanger 20 and the gas is cleaned with electrostatic filter 22. The gas is discharged into the coaxial electrode space as shown in FIG. 1.

Prototype Unit

Figure 5A:
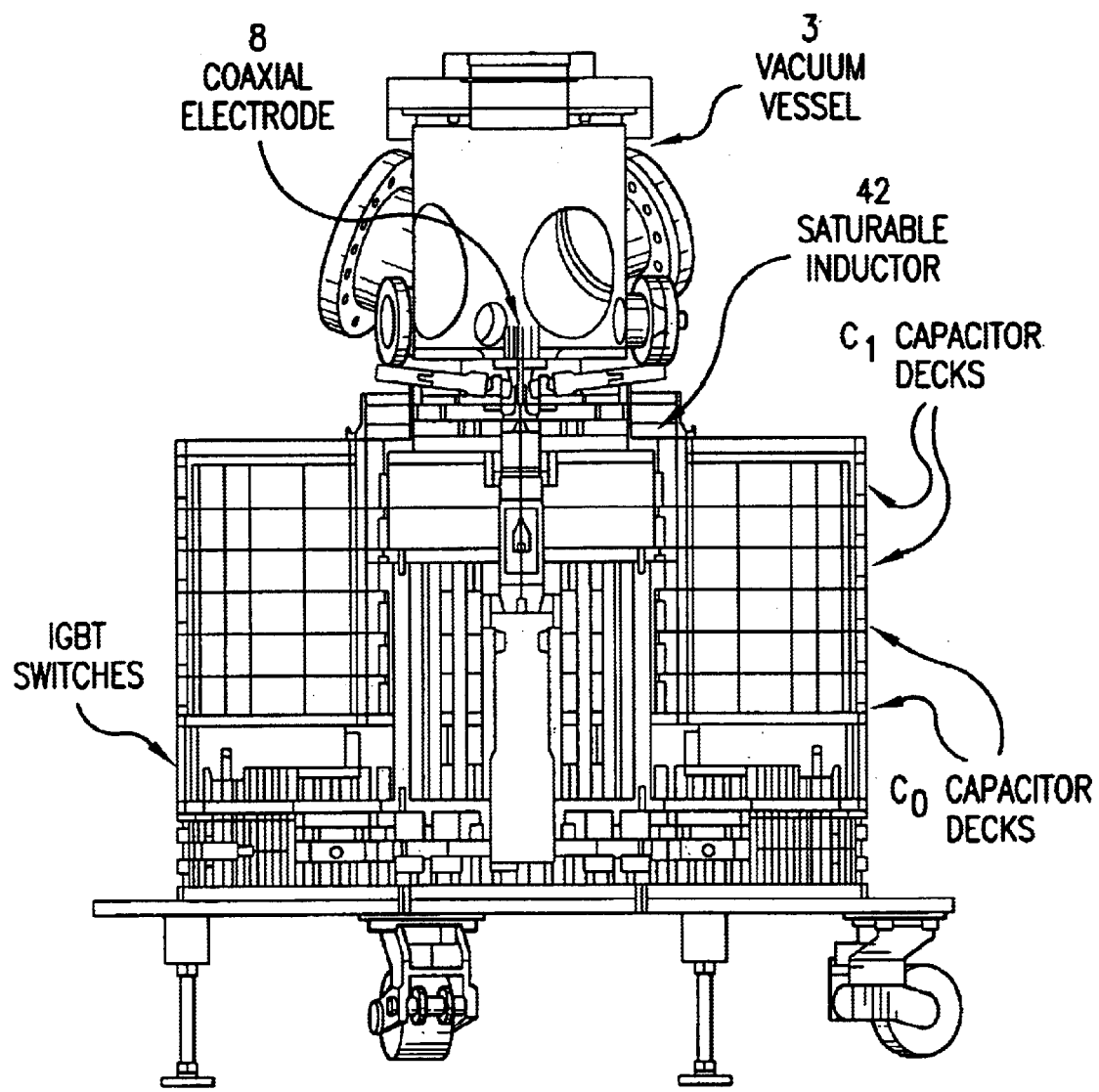
FIG. 5A is a drawing of a prototype unit built by Applicants and their fellow workers.

A drawing of a prototype plasma pinch unit built and tested by Applicant and his fellow workers is shown in FIG. 5A. Principal elements are $C_I$ capacitor decks, $C_o$ capacitor decks, GBT switches, saturable inductor 42, vacuum vessel 3, and coaxial electrode 8.

Test Results

Figure 5B:
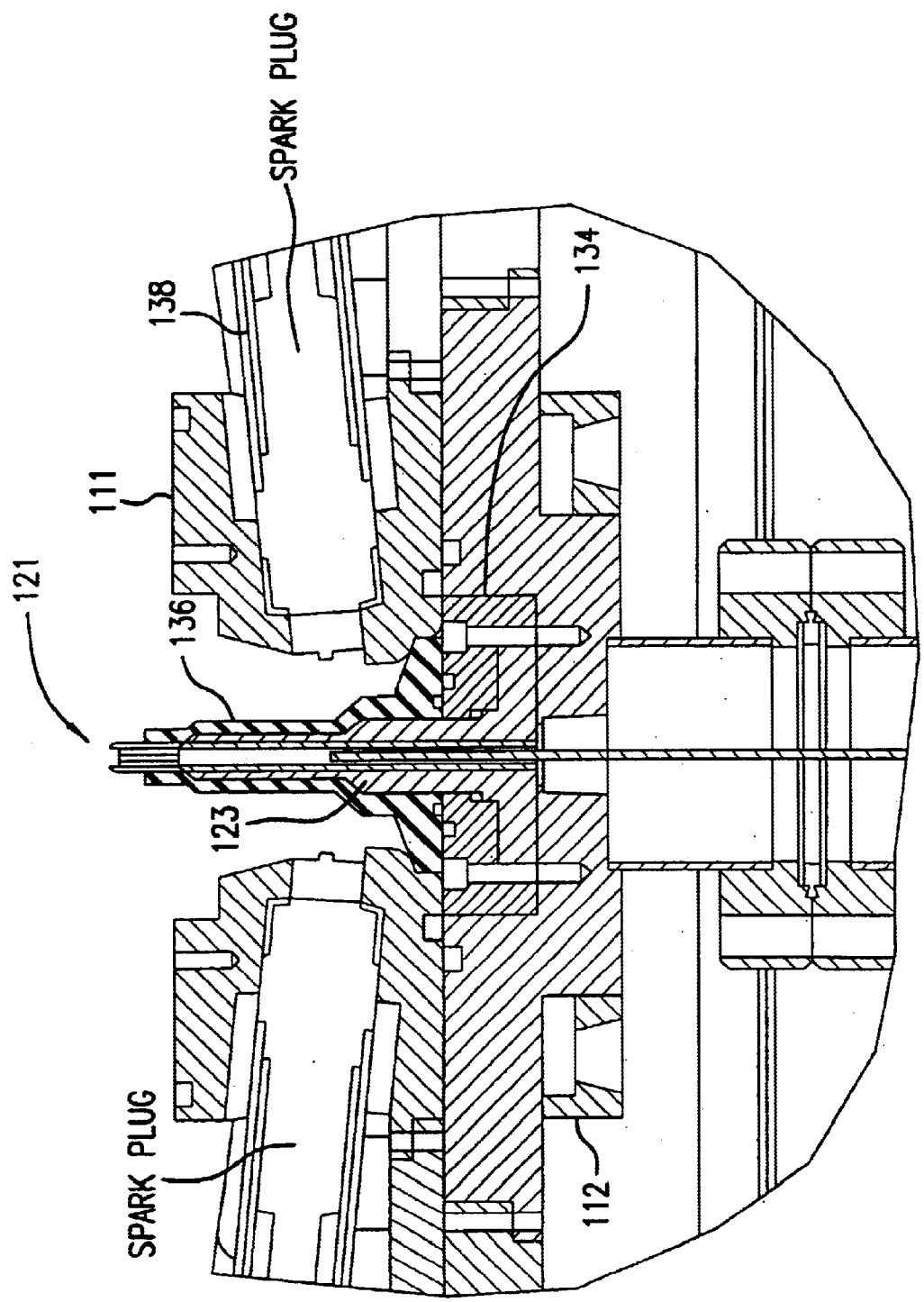
FIG. 5B is a cross section view showing the electrodes of the prototype with spark plug pre-ionizers.
Figure 6:
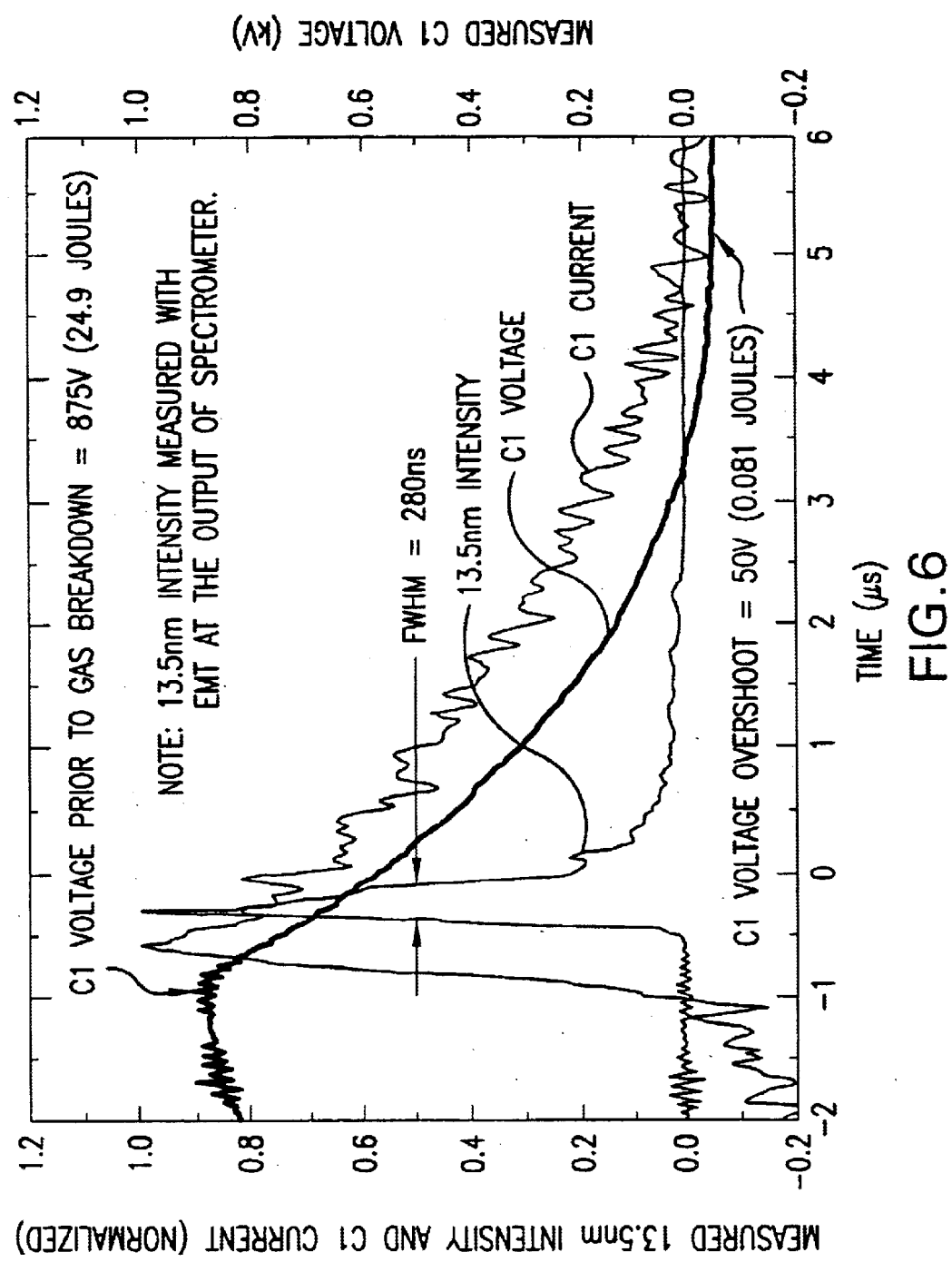

FIG. 6 shows a typical pulse shape measured by Applicant with the unit shown in FIG. 5. Applicants have recorded $C_I$ voltage, $C_I$ current and intensity at 13.5 nm over an 8 microsecond period. The integrated energy in this typical pulse is about 0.8 J. The pulse width (at FWHM) is about 280 ns. The $C_I$ voltage prior to breakdown is a little less than 1 KV.

This early prototype embodiment could be operated at a pulse rate up to 200 Hz. The measured average in-band 13.5 nm radiation at 200 Hz is 152 W in $4\pi$ steradians. Energy stability at 1 sigma is about 6%.

Second Plasma Pinch Unit

Figure 2:
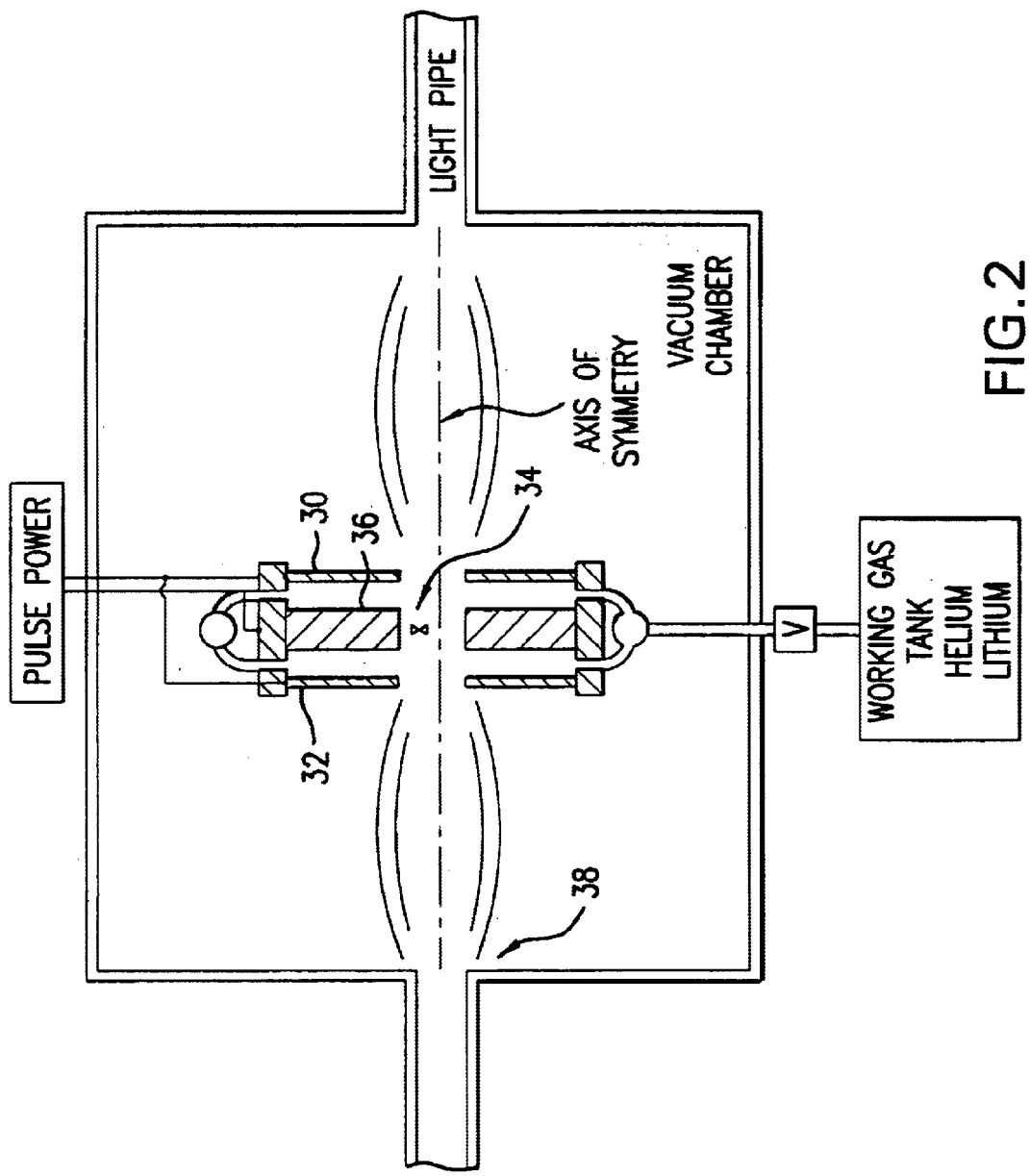
FIG. 2 is a drawing of a three-dimensional plasma pinch device with disk shaped electrodes.

A second plasma pinch unit is shown in FIG. 2. This unit is similar to the plasma pinch device described in U.S. Pat. No. 4,042,848. This unit comprises two outer disk shaped electrodes 30 and 32 and an inner disk shaped electrode 36. The pinch is created from three directions as described in U.S. Pat. No. 4,042,848 and as indicated in FIG. 2. The pinch starts near the circumference of the electrodes and proceeds toward the center and the radiation spot is developed along the axis of symmetry and at the center of the inner electrode as shown in FIG. 2 at 34. Radiation can be collected and directed as described with respect to the FIG. 1 embodiment. However, it is possible to capture radiation in two directions coming out of both sides of the unit as shown in FIG. 2. Also, by locating a dielectric mirror at 38, a substantial percentage of the radiation initially reflected to the left could be reflected back through the radiation spot. This should stimulate radiation toward the right side.

Third Plasma Pinch Unit

Figure 3:
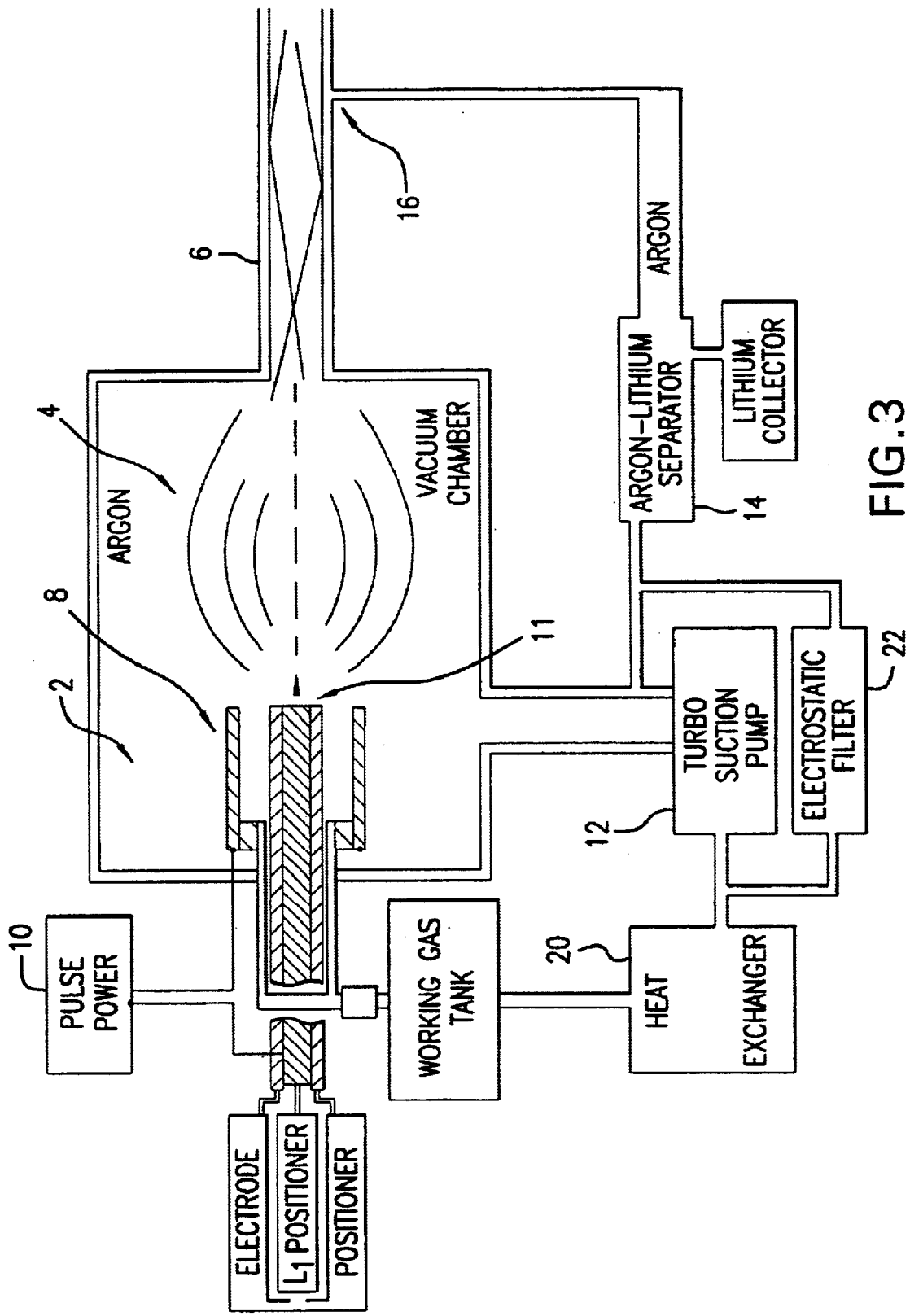
FIG. 3 is a drawing of a fourth preferred embodiment of the present invention.

A third embodiment can be described by reference to FIG. 3. This embodiment is similar to the first preferred embodiment. In this embodiment, however, the buffer gas is argon. Helium has the desirable property that it is relatively transparent to 13 nm radiation, but it has the undesired property that it has a small atomic mass. The low atomic mass forces us to operate the system at a background pressure of 2–4 Torr. An additional drawback of the small atomic mass of He is the length of electrode required to match the acceleration distance with the timing of the electrical drive circuit. Because He is light, the electrode must be longer than desired so that the He falls off the end of the electrode simultaneous with the peak of current flow through the drive circuit.

A heavier atom such as Ar will have a lower transmission than He for a given pressure, but because of its higher mass can produce a stable pinch at a lower pressure. The lower operating pressure of Ar more than offsets the increased absorption properties of Ar. Additionally, the length of the electrode required is reduced due to the higher atomic mass. A shorter electrode is advantageous for two reasons. The first is a resulting reduction in circuit inductance when using a shorter electrode. A lower inductance makes the drive circuit more efficient and thus reduces the required electrical pump energy. The second advantage of a shorter electrode is a reduction in the thermal conduction path length from the tip of the electrode to the base. The majority of the thermal energy imparted to the electrode occurs at the tip and the conductive cooling of the electrode occurs mainly at the base (radiative cooling also occurs). A shorter electrode leads to a smaller temperature drop down its length from the hot tip to the cool base. Both the smaller pump energy per pulse and the improved cooling path allow the system to operate at a higher repetition rate. Increasing the repetition rate directly increases the average optical output power of the system. Scaling the output power by increasing repetition rate, as opposed to increasing the energy per pulse, is the most desired method for the average output power of lithography light sources.

In this preferred embodiment the lithium is not injected into the chamber in gaseous form as in the first and second embodiments. Instead solid lithium is placed in a hole in the center of the central electrode as shown in FIG. 3. The heat from the electrode then brings the lithium up to its evaporation temperature. By adjusting the height of the lithium relative to the hot tip of the electrode one can control the partial pressure of lithium near the tip of the electrode. One preferred method of doing this is shown in FIG. 3. A mechanism is provided for adjusting the tip of the solid lithium rod relative to the tip of the electrode. Preferably the system is arranged vertically so that the open side of coaxial electrodes 8 is the top so that any melted lithium will merely puddle near the top of the center electrode. The beam will exit straight up in a vertical direction as indicated in FIG. 5A. (An alternative approach is to heat the electrode to a temperature in excess of the lithium melting point so that the lithium is added as a liquid.) Extremely low flow pumps are available for pumping the liquid at rates needed for any specified repetition rates. A tungsten wick can be used to wick the liquid lithium to region of the central electrode tip.

The hole down the center of the electrode provides another important advantage. Since the plasma pinch forms near the center of the tip of the central electrode, much of the energy is dissipated in this region. Electrode material near this point will be ablated and eventually end up of other surfaces inside the pressure vessel. Employing an electrode with a central hole greatly reduces the available erosion material. In addition, Applicants' experiments have shown that the existence of lithium vapor in this region further reduces the erosion rate of electrode material. A bellows or other appropriate sealing method should be used to maintain a good seal where the electrode equipment enters the chamber. Replacement electrodes fully loaded with the solid lithium can be easily and cheaply manufactured and easily replaced in the chamber.

Small Vacuum Chamber Window

The pinch produces a very large amount of viable light which needs to be separated from the EUV light. Also, a window is desirable to provide additional assurance that lithography optics are not contaminated with lithium or tungsten. The extreme ultraviolet beam produced by the present invention is highly absorbed in solid matter. Therefore providing a window for the beam is a challenge. Applicants preferred window solution is to utilize an extremely thin foil which will transmit EUV and reflect visible. Applicants preferred window is a foil (about 0.2 to 0.5 micron) of beryllium tilted at an incident angle of about 10° with the axis of the incoming beam. With this arrangement, almost all of the visible light is reflected and about 50 to 80 percent of the EUV is transmitted. Such a thin window, of course, is not very strong. Therefore, Applicants use a very small diameter window and the beam is focused through the small window. Preferably the diameter of the thin beryllium window is about 10 mm. Heating of the little window must be considered, and for high repetition rates special cooling of the window will be needed.

In some designs this element can be designed merely as a beam splitter which will simplify the design since there will be no pressure differential across the thin optical element.

Figure 10:
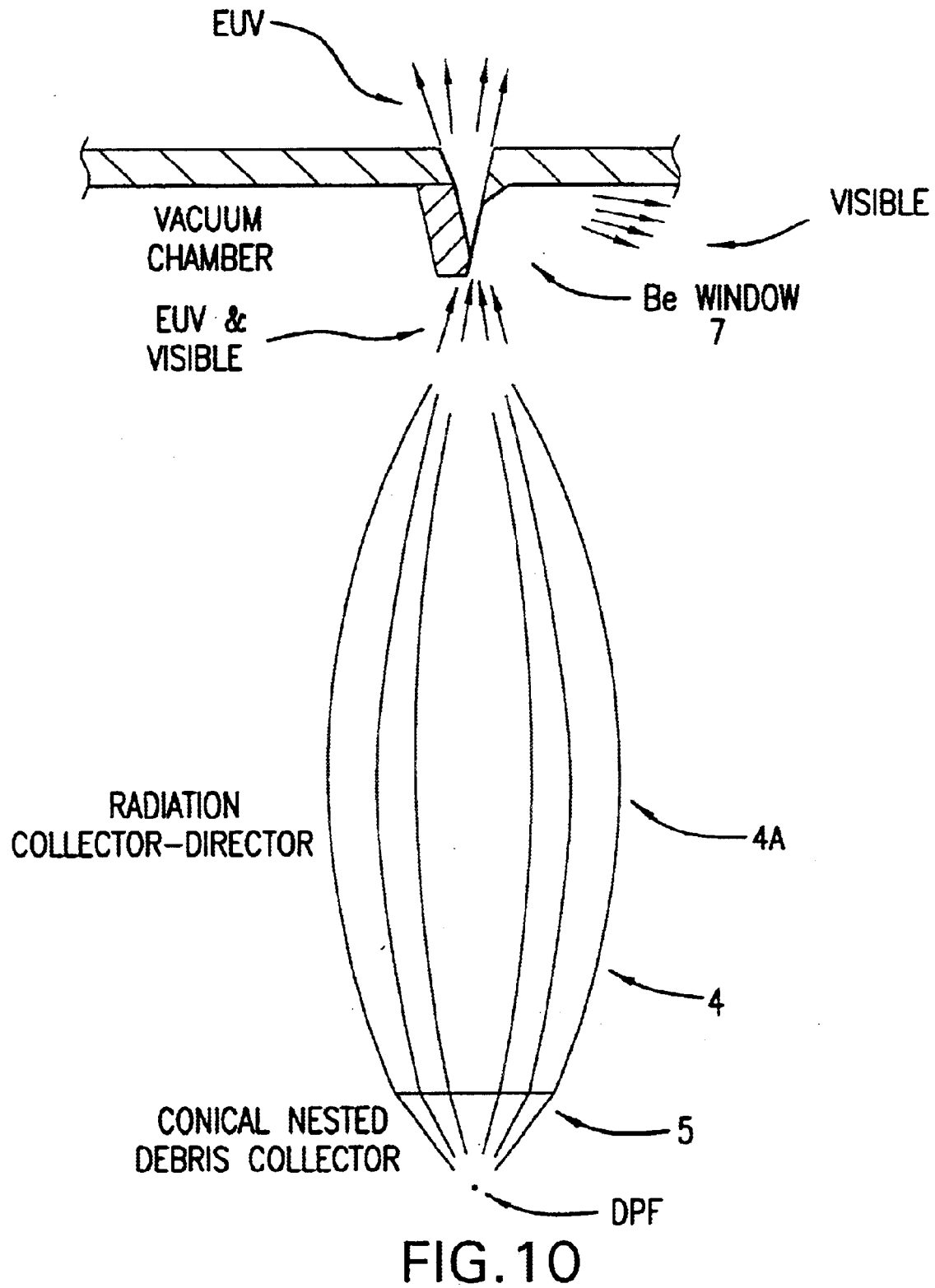
FIG. 10 shows thin Be window for reflecting visible light and transmitting EUV light.

FIG. 10 shows a preferred embodiment in which radiation collector 4 is extended by collector extension 4A to focus the beam 9 through 0.5 micron thick 1 mm diameter beryllium window 7.

Preionization

Applicants' experiments have shown that good results can be obtained without preionization but performance can be improved with preionization especially when the central electrode is pulsed with a positive potential. The prototype unit shown in FIG. 5 comprises DC driven spark gap preionizers to preionize the gas between the electrodes. Applicants will be able to greatly improve these energy stability values and improve other performance parameters with improved preionization techniques. Preionization is a well developed technique used by Applicants and others to improve performance in excimer lasers. Preferred preionization techniques include:

1) DC drive spark gap
2) RF driven spark gap
3) RF driven surface discharge
4) Corona discharge
5) Spiker circuit in combination with preionization These techniques are well described in scientific literature relating to excimer lasers and are well known.

Blast Shield

FIG. 5B shows the location of two of a total of eight spark plugs 138 providing preionization in a preferred embodiment. This figure also shows the cathode 111 and the anode 123 comprised of a stainless steel outer part and a tungsten inner part. Insulator shroud encircles the lower portion of anode 123 and a 5 mill thick film insulator 125 completes the isolation of the anode from the cathode. FIGS. 5B1–6 show the progression of a typical pulse leading to a pinch which is fully developed in FIG. 5B5 at about 1.2 μs after the initiation of the discharge.

During the discharge plasma is accelerated toward the tip of the anode by the Lorence forces acting on the ions and electrons created by the current flow through the plasma. Upon reaching the tip of the electrode shown at 121 in FIG. 5B force vectors directed radially compress and heat the plasma to high temperatures.

Once the plasma is compressed, the existing axially directed forces acting on the plasma tend to elongate the plasma column as shown especially in FIG. 5B6. It is this elongation that leads to instabilities. Once the plasma column has grown along the axis beyond a certain point, the voltage drop across the region of compressed plasma becomes too large to be sustained by the low pressure gas in the region around and near the tip of the anode. Arc-over occurs and much or all of the current flows through the shorter, lower density region of gas near the tip of the anode as shown by the dashed line in FIG. 5B6. This arc-over is detrimental because it produces instabilities in the pulse and causes relatively rapid electrode erosion.

A solution to this problem is to provide a physical barrier to motion of the plasma column in the axial direction. Such a barrier is shown as element number 143 in FIG. 5C and is called by Applicants a blast shield because it acts like a shield against the plasma exhaust of the PDF device. The blast shield must be made of an electrically insulating material with robust mechanical and thermal properties. In addition, the chemical compatibility of the blast shield material must be considered when operating with highly reactive elements such as Lithium. Lithium is a proposed emission element for this EUV source due to its intense emission at 13.5 nm. An excellent candidate is single crystal aluminum oxide, sapphire or an amorphous sapphire such as the trademarked material Lucalux manufactured by General Electric.

The optimum shape of the blast shield has been found to be a dome centered on the anode with a radius equal to the diameter of the anode as shown in FIG. 5C. Such a shape closely matches the naturally occurring plasma current lines when the plasma is under maximum compression. If the blast shield is placed further from the anode tip, then the plasma column will be too long leading to insufficient plasma heating and the risk of arc-over. If the blast shield is placed too close to the anode tip then current flow from the central axis out and down toward the cathode is restricted, again leading to insufficient plasma heating.

The hole in the top side of blast shield 143 at 144 is required to allow EUV radiation to escape and be collected for use. This hole must be made as small as possible due to the tendency of the plasma to leak out through this hole and form a long narrow column above the blast shield. A bevel cut into this hole as shown at 144 allows for greater off-axis collection of the EUV radiation produced by the plasma pinch device.

FIGS. 5C1–6 show how the blast shield contains the plasma pinch and prevents arc-over.

Combination of Gas Types and Densities

Applicants have discovered that the requirements of the source gas and that of an optimized buffer gas are not satisfied by a single gas. The source gas must be something like Lithium for narrow-band emission at 13.5 nm or Xenon for broad-band emission near 13.5 nm. The density, breakdown and absorption properties of Lithium and Xenon are not optimum for use as a buffer gas. For example, Xenon is too strongly self-absorbing and Lithium is not sufficiently dense for use as a buffer gas.

Figure 12:
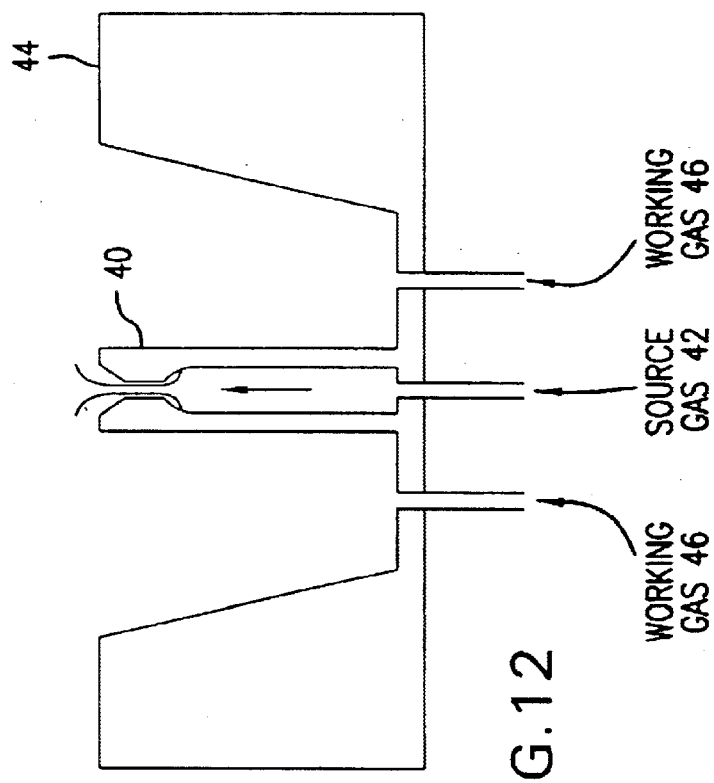
FIG. 12 is a drawing showing a technique for introducing source gas and working gas.

To address this problem of conflicting requirements, Applicants as shown in FIG. 12 separate the working gas into a source gas and a buffer gas and provide a source gas feed 42 such as a mixture of 5% Xe and 95% He up the center of the anode 40. Applicants then provide an optimized buffer gas such as helium or a mixture of helium and argon to the main vessel region maintained at a constant pressure. The source gas inside the anode will then be at the pressure of the buffer gas and the flow rate of source gas 42 determine the partial pressure of source gas mixed in with the buffer gas in the main vessel region. It is optimum to have a low source gas flow rate to minimize the partial pressure of the source gas in the main vessel region. (The working gas pressure in the main vessel region is regulated by a pressure regulation system not shown.) The buffer gas is circulated between the anode 40 and cathode 44 as shown at 46.

Optimizing Capacitance

Applicants have discovered that the highest plasma temperature exists when the plasma pinch event occurs simultaneous with the peak of the current flow from the drive capacitor bank. For a given anode configuration and buffer gas density, the plasma front will travel down the length of the anode in a given amount of time for a given amount of charge voltage. Maximum emission efficiency is obtained by adjusting the capacitance value and charge voltage such that the peak capacitor current exists during the plasma pinch event.

If a higher input energy level is desired and thus a higher charge voltage, then the drive capacitance must be reduced so that the timing of the drive waveshape matches the plasma run down time along the length of the anode. Since energy stored on a capacitor scales as the square of voltage and linearly with capacitance, the stored energy will increase linearly with voltage as one decreases capacitance proportional with increases in voltage.

Figure 13:
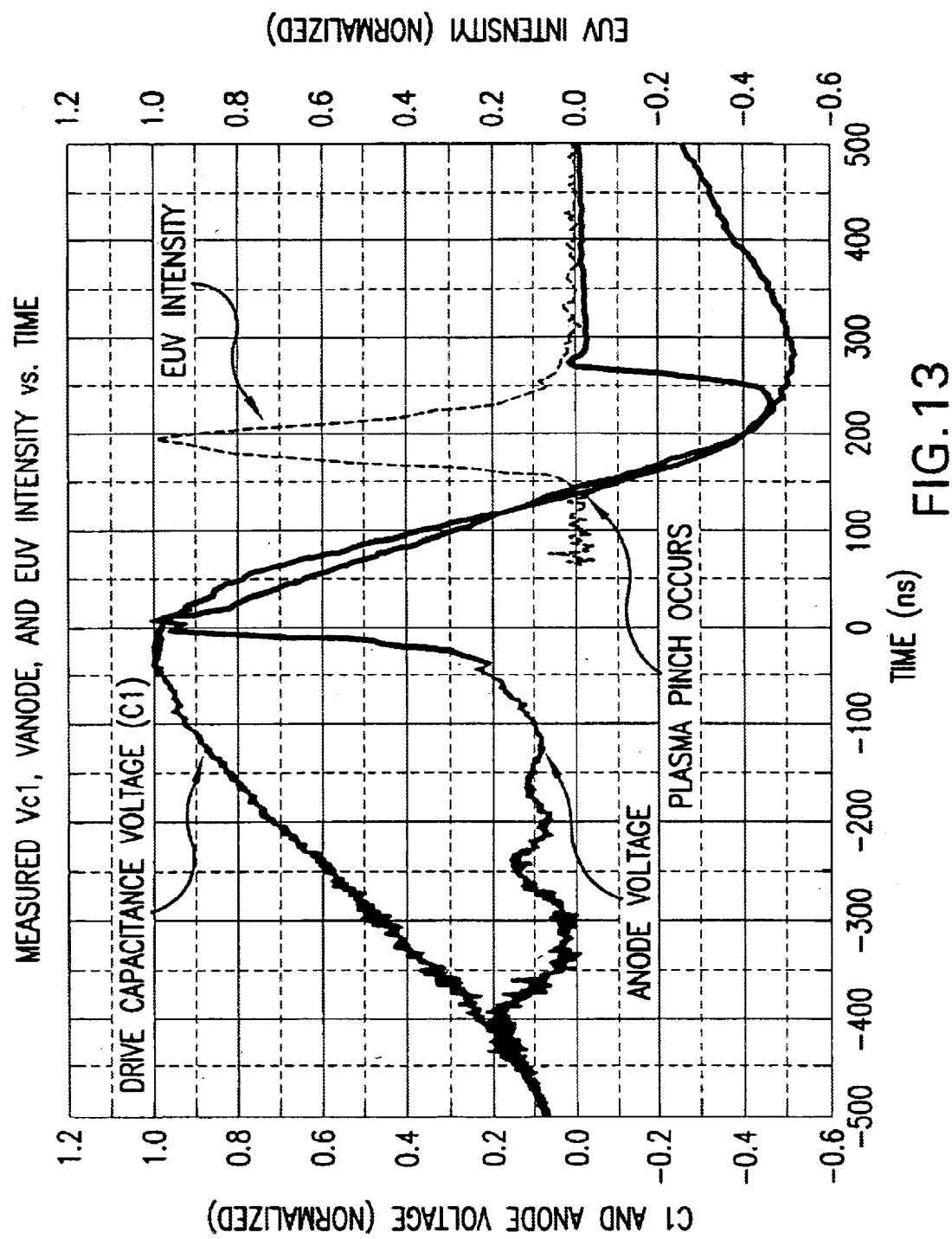
FIG. 13 is a time chart showing the anode voltage and EUV intensity.

FIG. 13 is a drawing showing the measured drive capacitance voltage, the measured anode voltage and the EUV intensity versus time for a preferred embodiment with the capacitance properly chosen to produce maximum capacitor current during the pinch. In this case, for a 2 cm long anode, a He buffer gas pressure of 2.5 Torr and a $C_l$ capacitance of 3 $\mu$F.

Optimum Shape of Central Electrode

Applicants have discovered with hollow anode configurations, that the plasma pinch grows rapidly along the axis once the pinch has been formed, and will extend down the opening in the hollow anode. As this pinch grows in length, it eventually drops too much voltage along its length and an arc-over occurs across the surface of the anode. One solution to prevent this arc-over makes use of a blast shield to provide a physical barrier to the growth of the pinch length extending away from the anode as described above. Another solution is to reduce the rate of pinch length growth down into the hollow anode, is to increase the open diameter inside the anode narrow region will slow the growth of the pinch length and prevent arc-over.

All previous literature shows a hollow anode with a constant dimension hollow portion.

Figures 14A, 14B, 14C, 14D:
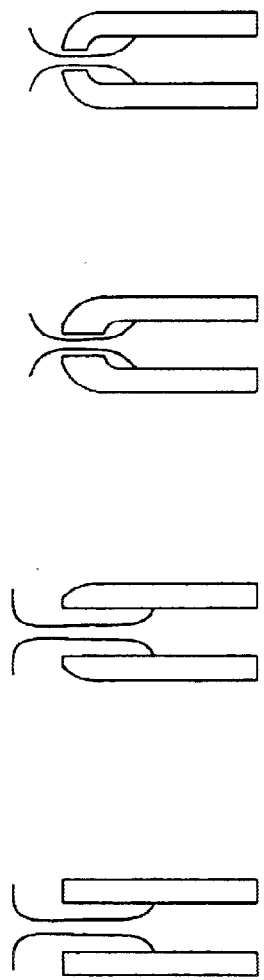
FIGS. 14A, 14B, 14C and 14D show the effect of various central electrode designs on the plasma pinch.

FIGS. 14A, 14B, 14C and 14D show examples of pinch shapes for various hollow anode shapes. The configuration shown in FIG. 14D shows the shortest pinch shape.

Exposed Length of Central Electrode

Since the plasma run down time determines where on the drive voltage waveshape the pinch occurs, Applicants have been able to adjust the duration of the pinch portion of the plasma focus device by changing the amount of exposed anode and thus the duration of the rundown.

The buffer gas density is dictated by a desired plasma pinch diameter, and the drive capacitance is in practice limited to within a certain range. These two parameters, combined with the drive voltage determine the desired run down time. The run down time can then be adjusted by increasing or decreasing the length of exposed anode. Preferably, the run down time is chosen such that the plasma pinch event occurs during the peak in the drive current waveshape. If a longer plasma pinch duration is desired then the exposed length of the anode can be reduced, thus shortening the run down time and causing the plasma pinch to occur earlier in the drive waveshape.

Lithium Delivery Technique

Lithium delivery schemes described above depend on raising the anode temperature sufficiently high that the vapor pressure of Lithium reached a desired level. Such temperatures are in the range of 1000–1300° C.

Figure 15:
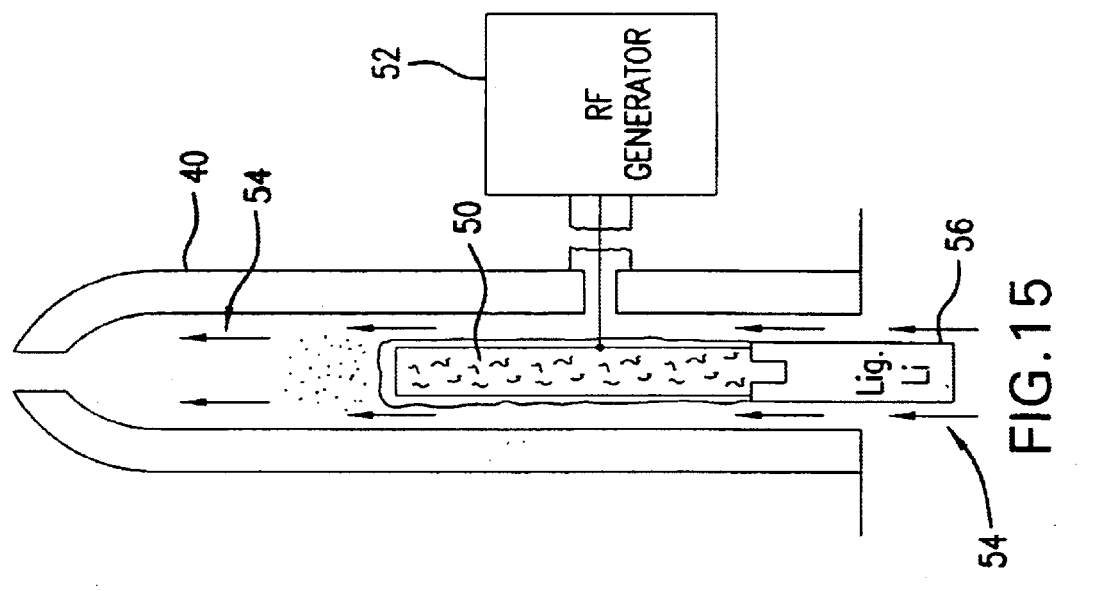
FIG. 15 is a drawing showing a technique for using RF energy to operate lithium vapor source gas.

An alternative is to fabricate an RF antenna from a material such as porous Tungsten infiltrated with Lithium. This porous Lithium filled Tungsten antenna 50 is placed down inside the anode as shown in FIG. 15. RF power source 52 creates a plasma-layer on and near the antenna will drive off atoms that are swept up by the gas flow 54 through the center of the hollow anode and the Lithium atoms carried to the end of the anode.

The rate of Lithium ion production is easily controlled by the power level of the RF source. In addition, the porous Tungsten anode can be maintained with this RF drive at a temperature sufficient for liquid Lithium to wick up from a reservoir 56 placed at the bottom of the anode.

Cooling of Central Electrode

In preferred embodiments of the present invention the central anode has an outside diameter in the range of about 0.5 cm to 1.25 cm. The central electrode is expected to absorb substantial energy due to the plasma fall during discharge and due to absorption of radiation from the plasma pinch. Cooling in the range of about 15 kw or more may be required. Because the gas pressure are very low there cannot be much cooling due to convection through the buffer gas. Radiation cooling could only be effective at very high anode temperatures. Conduction down the anode length would require a very large temperature drop.

Heat Pipe

If lithium vapor is used as an active gas and is injected through the center of the anode the anode temperature will need to be maintained at temperatures in the range of 1,000° C. to 1,300° C. or higher. This high temperature of operation, substantial heat removal requirement, envelope considerations and the high voltage limit the choices of cooling technique. One technology, however, a lithium (or other alkali metal) heat pipe, offers the potential for a relatively simple and robust solution. Lithium heat pipes begin to operate efficiently at temperatures about 1000° C. The specific design of such devices typically use refractory metals, molybdenum and tungsten, for the casing and internal wick and can therefore operate at very high temperatures. Initial investigations reveal that there is confidence that such a heat pipe is capable of meeting the cooling requirements of the DPF.

The simplest embodiment would take the form of a tubular or annular heat pipe that is integral with the anode of the DPF for best thermal coupling. A likely embodiment would be annular to enable the delivery of liquid or vaporized lithium to the plasma of the DPF. By way of an example of 0.5" diameter solid heat pipe removing 15 kW would have a watt density of 75 kW/in$^2$ (11.8 kW/cm$^2$). An annular heat pipe having an OD of 1" and an ID of 0.5" removing 15 kW of heat would have a watt density of 25.4 kW/in$^2$ (3.9 kW/cm$^2$). Both of these examples illustrate the potential of this technology since watt densities far in excess of 15 kW/cm$^2$ have been demonstrated with lithium heat pipes. In operation, heat pipes have only a very small temperature gradient along their length and can be considered as having constant temperature with length for practical purposes. Therefore the "cold" (condenser) end of the heat pipe will also be at some temperature at or above 1000° C. To remove heat from the condenser end of the heat pipe a preferred embodiment may utilize radiative cooling to a liquid coolant (such as water) jacket. Radiative heat transfer scales as the fourth power of temperature, therefore, high rates of heat transfer will be possible at the proposed operating temperatures. The heat pipe would be surrounded by an annular water heat exchanger capable of steady state operation at 15 kW. Other embodiments may insulate the condenser end of the heat pipe with another material such as stainless steel and cool the outer surface of that material with a liquid coolant. Whatever technique is used, it is important that the heat pipe is not "shocked" with a coolant at the condenser, i.e., forced to be much cooler than the evaporator end. This can seriously impact performance. Also if the heat pipe temperature falls below the freezing temperature of the working fluid at any point along its length (~180° C. for lithium) it will not work at all.

Restrictions to the operating temperature of components near the base of the central electrode (anode) may require that heat transferred to this region be minimized. This condition may be accomplished, for example, by coating the exterior of the heat pipe with a low emissivity material near the region of lower temperature tolerance. A vacuum gap can then be fabricated between the heat pipe and the desired lower temperature components. Since vacuum has very low thermal conductivity and the heat pipe is coated with a low emissivity material, minimal heat transfer will occur between the heat pipe and the cooler components. Maintaining a controlled anode temperature under varying power load levels is another consideration. This may be accomplished by placing a cylinder between the heat pipe and the water cooled outer jacket. This cylinder would be coated or finished for high reflectivity on its inner diameter and for low emissivity on its outer diameter. If the cylinder is fully inserted between the radiating heat pipe and the water cooling jacket, radiation will be reflected back toward the heat pipe thus reducing the power flow from heat pipe to jacket. As the "restrictor" cylinder is extracted a greater proportion of the heat pipe's condenser can radiate directly onto the water jacket heat exchanger. Adjustment of the "restrictor" position thus controls the power flow which sets the steady state operating temperature of the heat pipe, and ultimately the anode.

Figure 17:
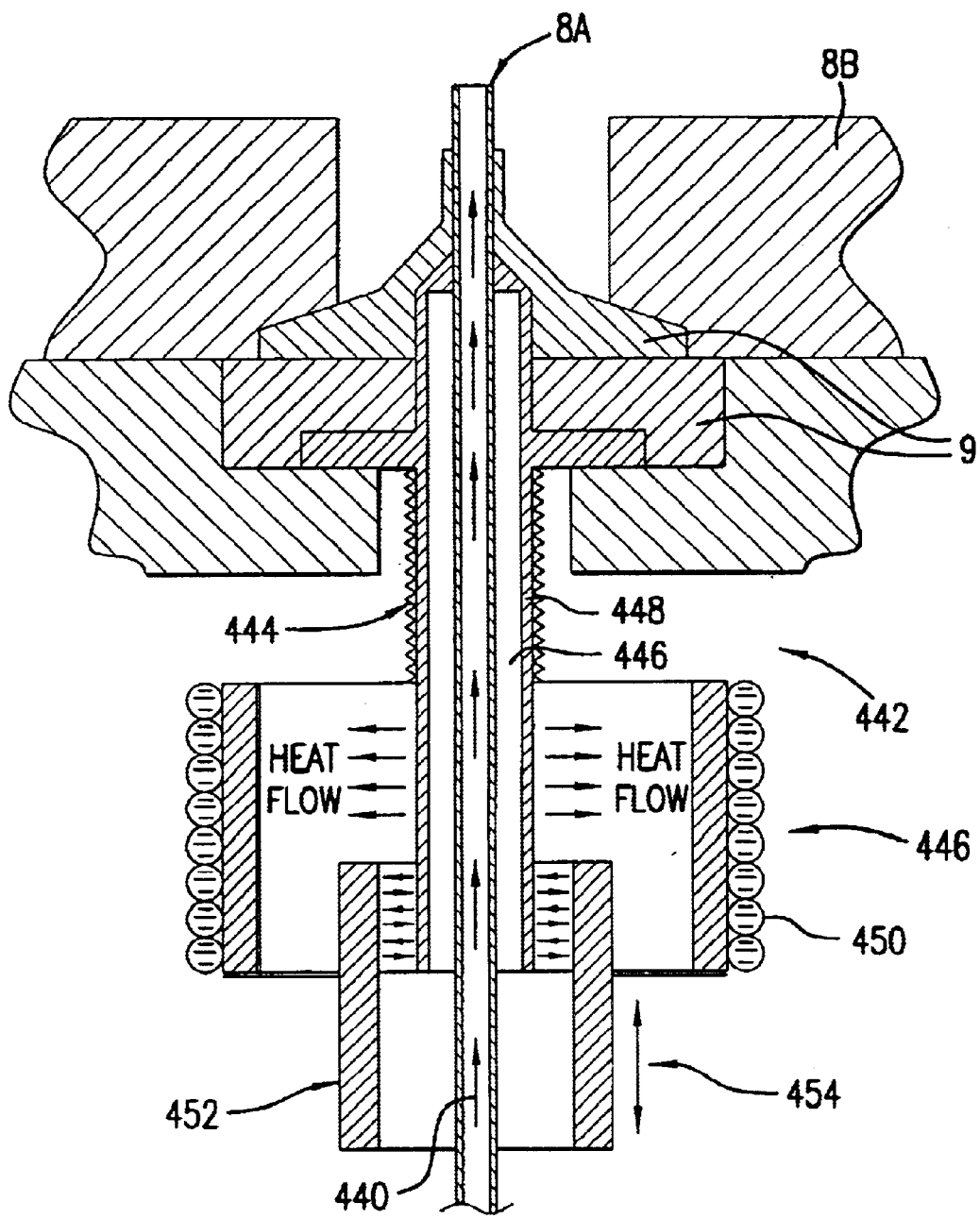
FIG. 17 shows a heat pipe cooling technique for the anode in a preferred DPF device.

A preferred embodiment using heat pipe cooling is shown in FIG. 17 shown in the drawing are anode 8A, cathode 8B, and insulator element 9. In this case, lithium vapor is used as the active gas and is delivered into the discharge chamber through the center of anode 8A as shown at 440. Anode 8A is cooled with lithium heat pipe system 442 comprising lithium heat pipe 444. Lithium within the heat transfer region 446 of heat pipe 444 vaporizer near the hot end of the electrode 8A and the vapor flows toward the cooler end of the heat pipe where heat is transferred from the heat pipe by radiative cooling to a heat sink unit 446 having a heat sink surface 448 cooled by water coil 450. The cooling of the lithium vapor causes a change in its state to liquid and the liquid is wicked back to the hot end in accordance with well known heat pipe technology. In the embodiment a restrictor cylinder 452 slides up and down as shown at 454 inside heat sink surface 448 based on a drive which is part of a temperature feedback control unit not shown. The anode heat pipe unit also preferably comprises an auxiliary heating system for maintaining the lithium at temperatures in excess of its freezing point when the plasma pinch device is not producing sufficient heat.

Water Cooling of Central Electrode

Another preferred method of cooling the central electrode is sown in FIGS. 20, 20A, 20B and 20C. In this case water under pressure is circulated through the central electrode. Central electrode 8A is comprised of two parts, a discharge portion 8A1 comprised of single crystal tungsten (available from Mateck GMBH, Fuelich, Germany and lower part 8A comprised of sintered tungsten. The outer electrode 8B is made in two parts, a lid 8B1 and a base 8B2, both comprised of an oxide hardened copper material sold under the tradename Glidcop. The oxide material is alumina. The outer electrode is made in two parts to provide water passages 460 for cooling the outer electrode. The electrodes are insulated from each other by main insulator 462 comprised of boron nitride or silicon carbide, a layer 464 of alumina deposited on stainless steel base 8A3 and a polymide 466 (preferably Kapton as available from Dupont). The water path through the central electrode is shown by arrows 468 in FIG. 20C. Cylindrically shaped stainless steel partition 470 separate the supply and return flow in the electrodes. Parts 8A1, 8A2 and 8A3 are braised together using a gold/nickel or gold/copper braze material such as Niord or 50 An-50c.

Fourth Generation Pinch Device

Figure 16:
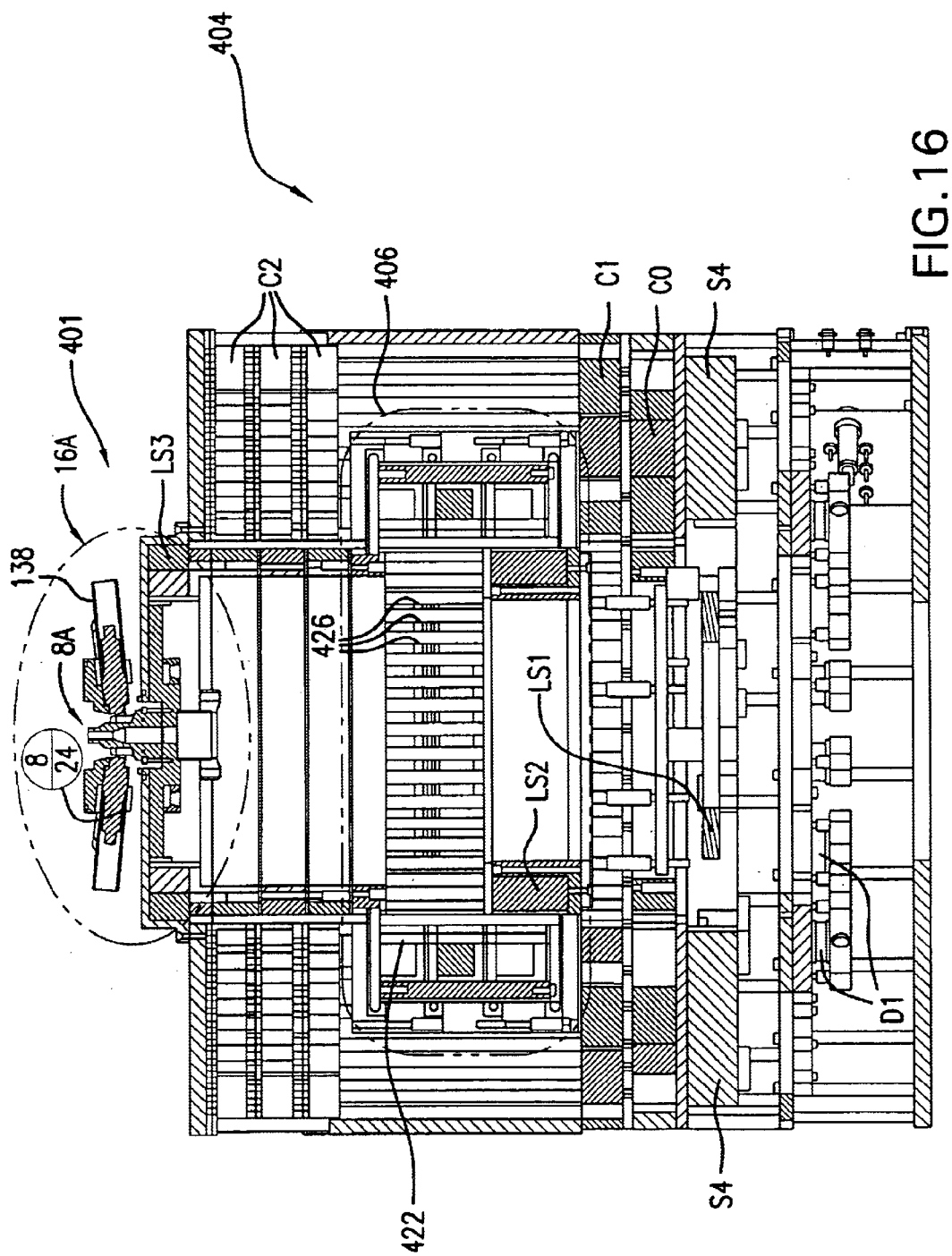
FIGS. 16, 16A, 16B, 16C, 16D and 16E show features and test results of a fourth generation prototype plasma pinch device.
Figure 16A:
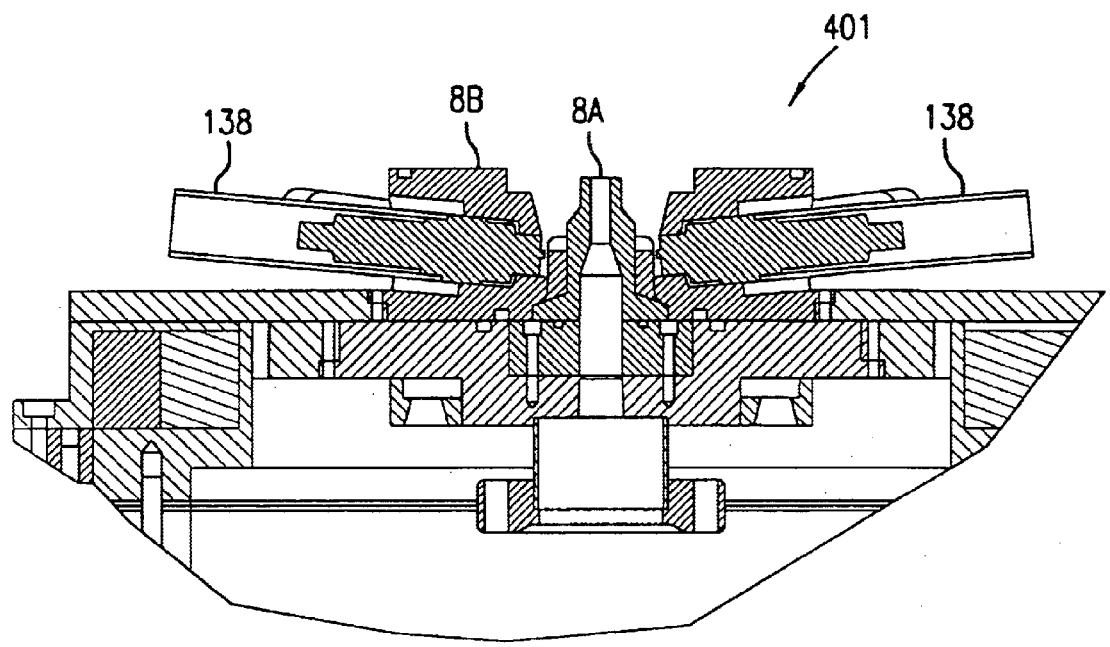
Figure 16C:
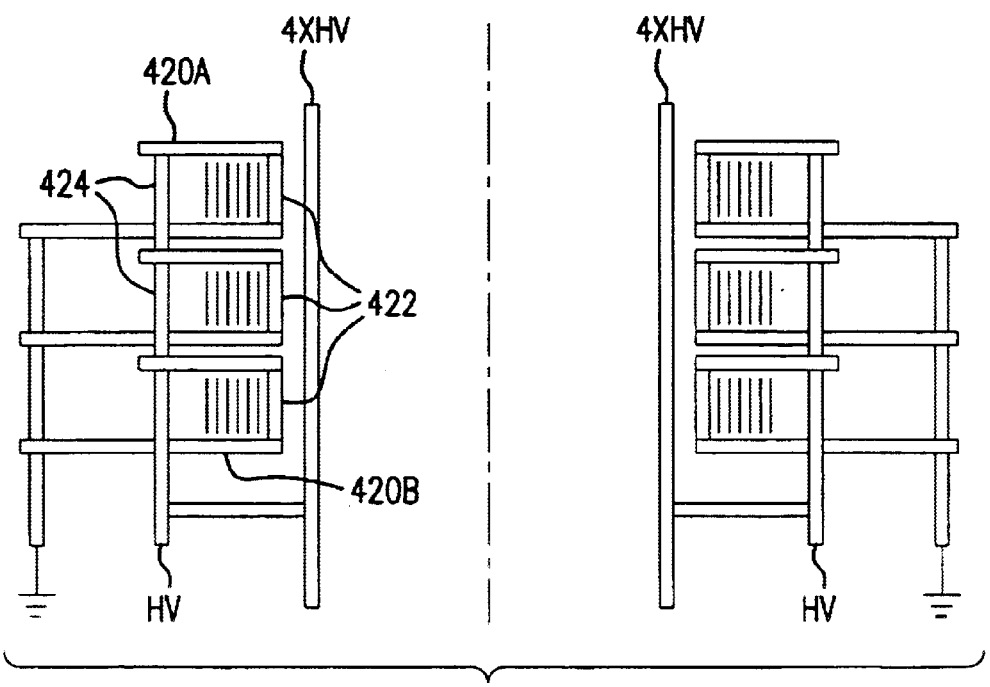
Figure 16B:
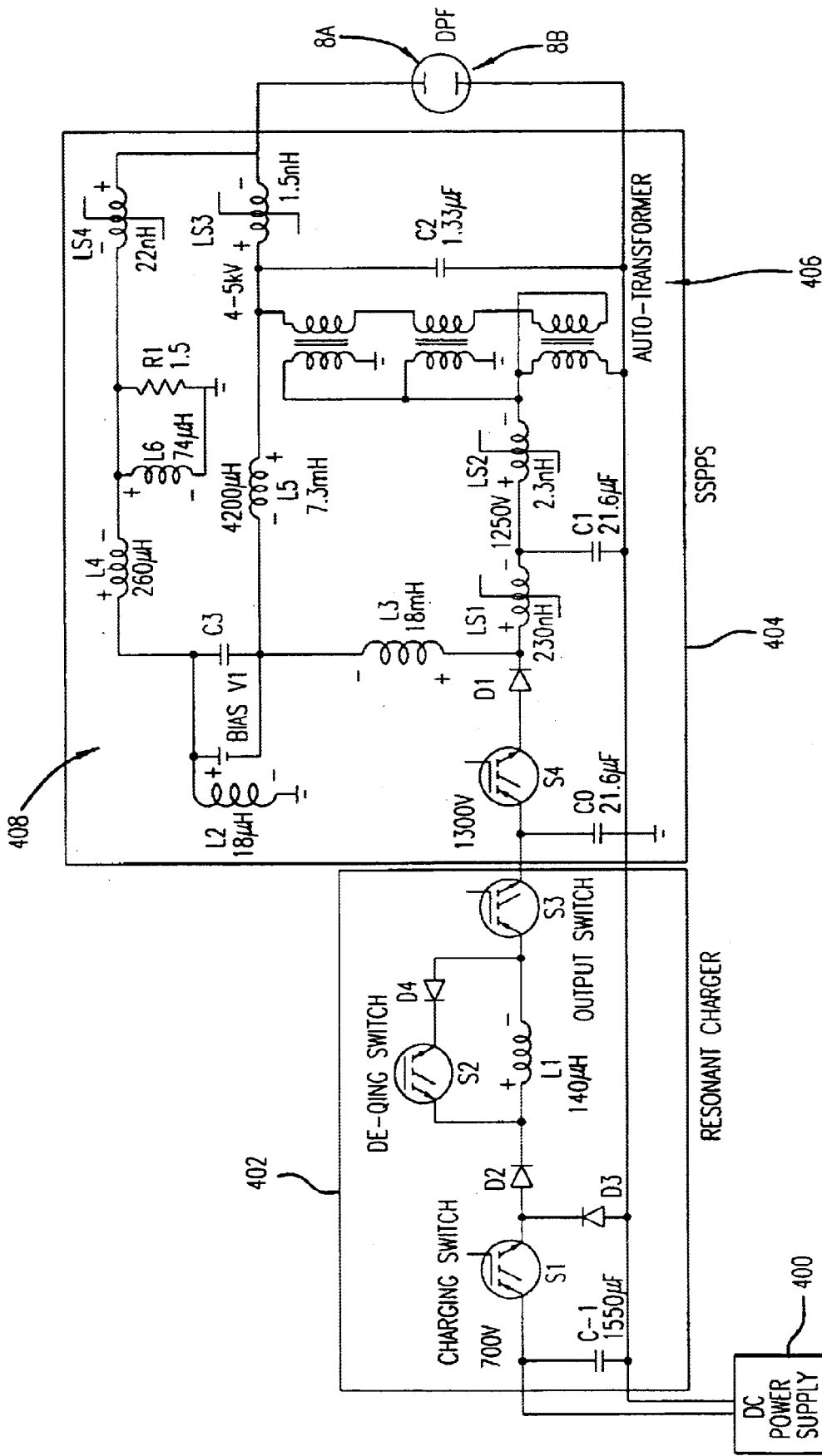

FIG. 16 is a cross section drawing of a fourth generation prototype plasma pinch device 400 built and tests by Applicants. FIG. 16A is an enlarged portion of the device showing in greater detail the pinch region 401. FIG. 16B is a circuit diagram showing the important electrical elements of the high voltage pulse power drive system for this embodiment. This unit produces plasma pinches at pulse repetition rates of up to about 2 kHz. The electrical energy discharged between the electrodes is about 12 J per pulse. Applicants' estimate that the useful light energy produced by each pinch in the EUV range of interest into $2\pi$ steradians is in the range of about 20 mJ.

Substantially all of the components shown in FIG. 16 area part of the solid state pulse power system 404 for supplying the discharge electrical pulses of the electrodes. In this embodiment, a positive voltage pulse of about 4–5 kv is applied to the central anode 8A. The cathode 8B is at ground potential. Preionization is provided by 8 spark plugs 138 which produce preionization sparks at the bottom of the space between the cathode and the anode. These spark plugs operate at 20 kv using as a power supply a 30 kv 10 mHz sine wave generator (not shown).

Electrical Circuit

A description of the electrical circuit diagram of this preferred pulse power system is set forth below with reference to FIG. 16B and occasionally to FIGS. 16 and 16A.

Resonant Charger

A conventional approximately 700 V dc power supply is used to convert ac electrical power from utility 208 volt, 3 phase power into approximately 700 V dc 50 A power. This power supply 400 provides power for resonant charger unit 402. Power supply 400 charges up a large 1500 $\mu$F filter capacitor bank, C-1. Upon command from the external trigger signal, the resonant charger initiates a charging cycle by closing the command-charging switch, S1. Once the switch closes, a resonant circuit is formed from the C-1 capacitor, a charging inductor L1, and a C0 capacitor bank which forms a part of solid pulse power system (SSPPS) 404. Current therefore begins to discharge from C-1 through the L1 inductor and into C0, charging up that capacitance. Because the C-1 capacitance is much, much larger than the C0 capacitance, the voltage on C0 can achieve approximately 2 times the initial voltage of that on C-1 during this resonant charging process. The charging current pulse assumes a half-sinusoidal shape and the voltage on C0 resembles a "1-cosine" waveform.

In order to control the end voltage on C0, several actions may take place. First, the command-charging switch S1 can be opened up at any time during the normal charging cycle. In this case, current ceases to flow from C-1 but the current that has already been built up in the charging inductor continues to flow into C0 through the free-wheeling diode D3. This has the effect of stopping any further energy from C-1 from transferring to C0. Only that energy left in the charging inductor L1 (which can be substantial) continues to transfer to C0 and charge it to a higher voltage.

In addition, the de-qing switch S2 across the charging inductor can be closed, effectively short-circuiting the charging inductor and "de-qing" the resonant circuit. This essentially removes the inductor from the resonant circuit and prevents any further current in the inductor from continuing to charge up C0. Current in the inductor is then shunted away from the load and trapped in the loop made up of charging inductor L1, the de-qing switch S2, and the de-qing diode D4. Diode D4 is included in the circuit since the IGBT has a reverse anti-parallel diode included in the device that would normally conduct reverse current. As a result, diode D4 blocks this reverse current which might otherwise bypass the charging inductor during the charging cycle.

Finally, a "bleed down" or shunt switch and series resistor (both not shown in this preferred embodiment) can be used to discharge energy from C0 once the charging cycle is completely finished in order to achieve very fine regulation of the voltage on C0.

The dc power supply is a 208 V, 90 A, ac input, 800 V, 50 A dc output regulated voltage power supply provided by vendors such as Universal Voltronics, Lambda/EMI, Kaiser Systems, Sorensen, etc. A second embodiment can use multiple, lower power, power supplies connected in series and/or parallel combinations in order to provide the total voltage, current, and average power requirements for the system.

The C-1 capacitor is comprised of two 450 V dc, 3100 $\mu$F, electrolytic capacitors connected together in series. The resulting capacitance is 1500 $\mu$F rated at 900 V, providing sufficient margin over the typical 700–800 V operating range. These capacitors can be obtained from vendors such as Sprague, Mallory, Aerovox, etc.

The command charging switch S1 and output series switch S3 in the embodiment are 1200 V, 300 A IGBT switches. The actual part number of the switches is CM300HA-24H from Powerex. The de-qing switch S2 is a 1700 V, 400 A IGBT switch, also from Powerex, part number CM400HA-34H.

The charging inductor L1 is a custom made inductor made with 2 sets of parallel windings (20 turns each) of Litz wire made on a toroidal, 50—50% NiFe tape wound core with two ⅛" air gaps and a resulting inductance of approximately 140 $\mu$H. National Arnold provides the specific core. Other embodiments can utilize different magnetic materials for the core including Molypermaloy, Metglas™, etc.

The series, de-qing, and freewheeling diodes are all 1400 V, 300 A diodes from Powerex, part number R6221430PS.

Pulse Compression and Voltage Amplification

Once the resonant charger 402 charges up C0, a trigger is generated by a control unit (not shown) in the resonant charges that triggers the IGBT switches S4 to close. Although only one is shown in the schematic diagram (for clarity), S4 consists of eight parallel IGBT's which are used to discharge C0 into C1. Current from the C0 capacitors then discharges through the IGBT's and into a first magnetic switch LS1. Sufficient volt-seconds are provided in the design of this magnetic switch to allow all of the 8 parallel IGBT's to fully turn on (i.e. close) prior to substantial current building up in the discharge circuit. After closure the main current pulse is generated and used to transfer the energy from C0 into C1. The transfer time from C0 to C1 is typically on the order of 5 $\mu$s with the saturated inductance of LS1 being approximately 230 nH. As the voltage on C1 builds up to the full desired voltage, the volt-seconds on a second magnetic switch LS2 run out and that switch saturates, transferring the energy on C1 into 1:4 pulse transformer 406 which is described in more detail below. The transformer basically consists of three one turn primary "windings" connected in parallel and a single secondary "winding". The secondary conductor is tied to the high voltage terminal of the primaries with the result that the step-up ratio becomes 1:4 instead of 1:3 in an auto-transformer configuration. The secondary "winding" is then tied to C2 capacitor bank that is then charged up by the transfer of energy from C1 (through the pulse transformer). The transfer time from C1 to C2 is approximately 500 ns with the saturated inductance of LS2 being approximately 2.3 nH. As the voltage builds up on C2, the volt-second product of the third magnetic switch LS3 is achieved and it also saturates, transferring the voltage on C2 to anode 8a as shown on FIGS. 14A and 14B. The saturated inductance of LS3 is approximately 1.5 nH.

Over Voltage Protection

A fourth magnetic switch is provided as a protection device in case the DPF is not functioning properly. In the case where the pre-ionization pulse is not applied at the right time (just prior to the main pulse), the main pulse voltage is not sufficient to break down the insulator between the anode and cathode. As a result, the pulsed voltage into this open-circuit condition can essentially double leading to an undesirable breakdown in the machine at some location other than the desired DPF electrodes. In this case, most of the energy is then reflected back to the "front end" of the SSPPS. Such a large reverse voltage pulse can cause avalanching of the series diode in the SSPPS, leading to potential damage or destruction of the devices. This fourth magnetic switch is designed such that volt-second product will be exceeded if the main DPF electrodes do not break down. In this instance, the magnetic switch is designed to short the load prior to the voltage doubling and causing significant damage. The saturated inductance of the fourth magnetic switch LS4 is approximately 22 nH and it is terminated into a parallel RL load with ~1.5 ohms resistance and ~75 $\mu$H inductance.

Bias Circuit

Bias circuitry shown in the schematic diagram 14B at 408 is also used to properly bias the four magnetic switches. Current from the bias power supply V1, passes through magnetic switches LS4 and LS3. It then splits and a portion of the current passes through bias inductor L5 and back to the bias power supply V1. The remainder of the current passes through the pulse transformer secondary winding and then through magnetic switches LS2 and LS1 and bias inductor L3 back to the bias power supply V1. Bias inductor L2 provides a path back to the power supply from current through the pulse transformer primary to ground. Bias inductors L3 and L5 also provide voltage isolation during the pulse in the SSPPS since the bias power supply V1 operates close to ground potential (as opposed to the potentials generated in the SSPPS where the bias connections are made).

Capacitor Banks

The C0, C1 and C2 capacitances are made up of a number of parallel, polypropylene film capacitors mounted on a printed circuit board with thick (6–10 oz.) copper plating. The printed circuit boards are wedge shaped such that 4 boards make up a cylindrical capacitor deck which feeds a cylindrical bus for both the high voltage and ground connections. In such a way, a low inductance connection is formed which is important to both the pulse compression and to the stability of the plasma pinch in the DPF itself. The total capacitance for C0 and C1 are 21.6 $\mu$F each while the total capacitance for C2 is 1.33 $\mu$F. The C0 and C1 capacitors are 0.1 $\mu$F, 1600 V capacitors obtained from vendors such as Wima in Germany or Vishay Roederstein in North Carolina. The C2 capacitance is made up of three sections of capacitors stacked in series to achieve the overall voltage rating since the voltage on the secondary of the pulse transformer is ~5 kv. The C2 capacitors are 0.01 $\mu$F, 2000 V dc components, again from Wima or Vishay Roederstein.

Switches and Diodes

The SSPPS switches are 1400 V, 1000 A IGBT switches. The actual part number is CM1000HA-28H from Powerex. As noted earlier, 8 parallel IGBT switches are used to discharge C0 into C1.

The SSPPS series diodes are all 1400 V, 300 A diodes from Powerex, part number R6221430. Two diodes are used for each IGBT switch, resulting in a total of sixteen parallel devices.

Magnetic switch LS1 is a custom made inductor made with 16 sets of parallel windings (6 turns each) of Litz wire made on a toroidal, ferrite core. The specific core is provided by Ceramic Magnetics of New Jersey and is made of CN-20 ferrite material. The toroid is 0.5" thick with an I.D. of 5.0" and an O.D. of 8.0".

Magnetic switch LS2 is a single turn, toroidal inductor. The magnetic core is tape wound on a 8.875" O.D. mandrel using 2" wide, 0.7 mil thick, 2605-S3A Metglas™ from Honeywell with 0.1 mil thick Mylar wound in between layers to an outside diameter 10.94".

Magnetic switch LS3 is also a single turn, toroidal inductor. The magnetic core is tape wound on a 9.5" O.D. mandrel using 1" wide, 0.7 mil thick, 2605-S3A Metglas™ from Honeywell with 0.1 mil thick Mylar wound in between layers to an outside diameter of 10.94".

Pulse Transformer

The pulse transformer is similar in construction to that described in U.S. Pat. No. 5,936,988. Each of the three transformer cores is tape would on a 12.8" O.D. mandrel 422 using 1" wide, 0.7 mil thick, 2605-S3A Metglas™ from Honeywell with 0.1 mil thick Mylar wound in between layers to an outside diameter of 14.65". Each of the three cores 418 are ring shaped, 12.8 I.D. and about 14 inch O.D. having heights of 1 inch. An axial cross section sketch showing the physical arrangement of the three cores and the primary and secondary "windings" is shown in FIG. 14C. Each of the primary windings actually are formed from two circular rings 420A and 420B bolted to mandrel 422 and rod-like spacers 424. The secondary "winding" is comprised of 48 circularly spaced bolts 426.

The transformer operates on a principal similar to that of a linear accelerator. A high voltage current pulse in the three primary "windings" induce a voltage rise in the secondary "winding" approximately equal to the primary voltage. The result is a voltage generated in the secondary winding (i.e., rods 426) equal to three times the primary voltage pulse. But since the low voltage side of the secondary winding is tied to the primary windings a four fold transformation is provided.

Bias Inductors

Bias inductors L3 and L4 are both toroidal inductors wound on a Molypermalloy magnetic core. The specific core dimensions are a height of 0.8", an I.D. of 3.094", and an O.D. of 5.218". The part number of the core is a-430026-2 from Group Arnold. Inductor 13 has 90 turns of 12 AWG wire wound on the toroid for an inductance of ~7.3 mH while L4 has 140 turns of 12 AWG wire wound on it for an inductance of ~18 mH.

Bias inductor L6 is merely 16 turns of 12 AWG wire wound in a 6" diameter. Bias inductor L4 is 30 turns of 12 AWG wire in a 6" diameter. Bias inductor L2 is 8 turns of 12 AWG wire in a 6" diameter.

Resistor R1 is an array of twenty parallel resistors, each of which is 27 ohm, 2W carbon composition resistor. The SSPPS resistor diodes are all 1400V, 300 A diodes from Powerex, Part Number R6221430. Two diodes are used for each 1 GBT switch, resulting in a total of sixteen parallel devices.

Energy Recovery

In order to improve the overall efficiency this fourth generation dense plasma focus device provides for energy recovery on a pulse-to-pulse basis of electrical pulse energy reflected from the discharge portion of the circuit. The energy recovery technique utilized herein is similar to that described in U.S. Pat. No. 5,729,562 which is incorporated herein by reference. Energy recovery is achieved as explained below by reference to FIG. 16B.

After the discharge C2 is driven negative. When this occurs, LS2 is already saturated for current flow from C1 to C2. Thus, instead of having energy ringing in the device (which tends to cause electrode erosion) the saturated state of LS2 causes the reverse charge on C2 to be transferred resonantly back into C1. This transfer is accomplished by the continued forward flow of current through LS2. After the transfer of charge from C2 to C1, C1 then has a negative potential as compared to C0 (which at this time is at approximately ground potential) and (as was the case with LS2) LS1 continues to be forward conducting due to the large current flow during the pulse which has just occurred. As a consequence, current flows from C0 to C1 bringing the potential of C1 up to about ground and producing a negative potential on C0.

The reader should note that this reverse energy transfers back to C0 is possible only if all the saturable inductors (LS1, LS2 and LS3) remain forward conducting until all or substantially all the energy is recovered on C0. After the waste energy is propagated back into C0, C0 is negative with respect to its initial stored charge. At this point switch 54 is opened by the pulse power control. Inverting circuit comprising inductor L1 and solid state diode D3 coupled to ground causes a reversal of the polarity of C0 as the result of resonant free wheeling (i.e., a half cycle of ringing of the L1-C0 circuit as clamped against reversal of the current in inductor L1 by diode D3 with the net result that the energy is recovered by the partial recharging of C0.

In the preferred embodiment, the de-qing switch is left closed during this time period and, as a result, the voltage on C0 stops at approximately 0 volts potential during the energy recovery process and the recovered energy is stored in the form of current in the charging inductor, L1. The de-qing switch is held closed during the entire time until the next pulse is required, maintaining the recovered energy current in the circuit and storing it for later use. Therefore, the energy which otherwise would have contributed to the erosion of the electrodes is recovered reducing the charging requirements for the following pulse. Once the next pulse is needed, the de-qing switch, S2, is turned off simultaneously with turning on the charging switch, S1. At this time, the remainder of the recovered energy current (some loss of energy will occur because of the finite resistance in the de-qing circuit) is added to charging current from C-1 and the sum of the two begins to charge C0 positively.

In a second embodiment, the recovered voltage is stored as a negative voltage on C0 by opening the output switch S3 at the point in time during the energy recovery process when the C0 voltage reaches its negative peak voltage.

Spark Preionization

FIGS. 1A and 1F shows features of a preferred preionization technique. In this case 8 spark devices powered by 10 megahertz RF generator 60 as shown in FIG. 1A provides the needed preionization with one microsecond pulses timed to coincide with the pinch discharges. The preferred timing is shown in FIG. 1F. The RF power is applied about 1 microsecond before the pinch discharge begins. Preionization breakdown occurs in the gap between the anode 8A and the cathode 8B about 0.1 microsecond into the RF pulse. Spark occurs between the end of the spark devices and surfaces of the anode and cathode. This causes the region between the anode 4 cathode to be filled with a highly conductive plasma. This preionization plasma serves two purposes. First, it is designed to exist during the entire time that C2 is charging up. The plasma conductivity is kept high enough to create a very low impedance path to the normal leakage current flowing through saturable inductor LS3. This maintains the anode potential at close to ground while C2 is charging which helps ensure complete energy transfer to the anode when inductor LS3 saturates and the main discharge begins. Without a sufficiently conducting plasma generated by the preionization, the anode would charge up to a voltage high enough to cause a premature breakdown of the main discharge in the anode-cathode gap prior to the maximum voltage on C2. The second purpose of the preionization plasma is to provide an initial plasma source for the main discharge, making it more uniform and more consistent from pulse to pulse. The RF pulse shape is shown in FIG. 1F. It starts out at about kV and dies off to near zero toward the end of each pulse. Currents are about 100 amp for each of the eight spark devices for a total of about 800 amp. The spark devices are shown in FIG. 1A. Each plug is pressurized serially through ports 64 with $SF_6$ gas to prevent internal breakdown in space 62 and each plug is provided with a commercial high voltage connector 64 supplied by Fisher.

Reversing Polarity

Figure 20:
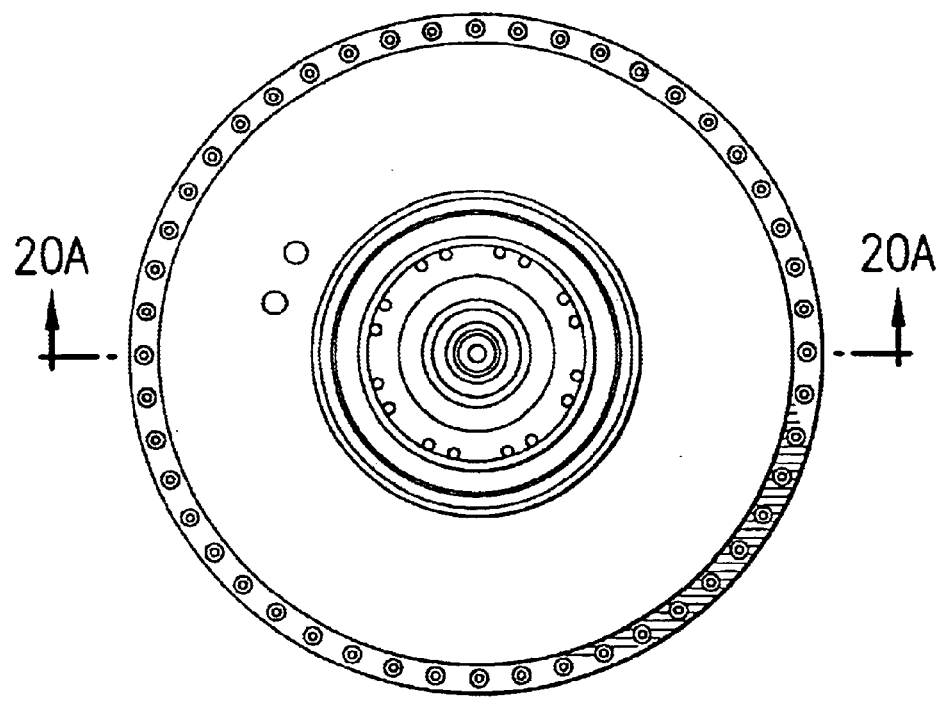
FIGS. 20, 20A, 20B and 20C show a technique for water-cooling of the electrodes.
Figure 20A:
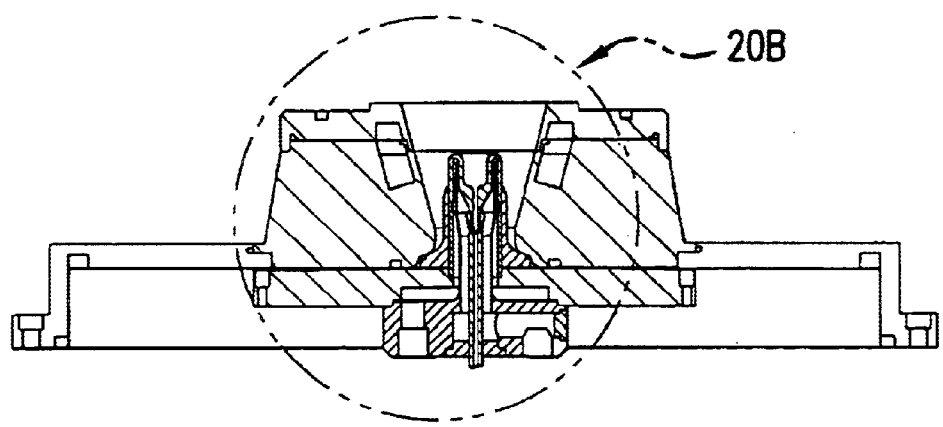
Figure 20B:
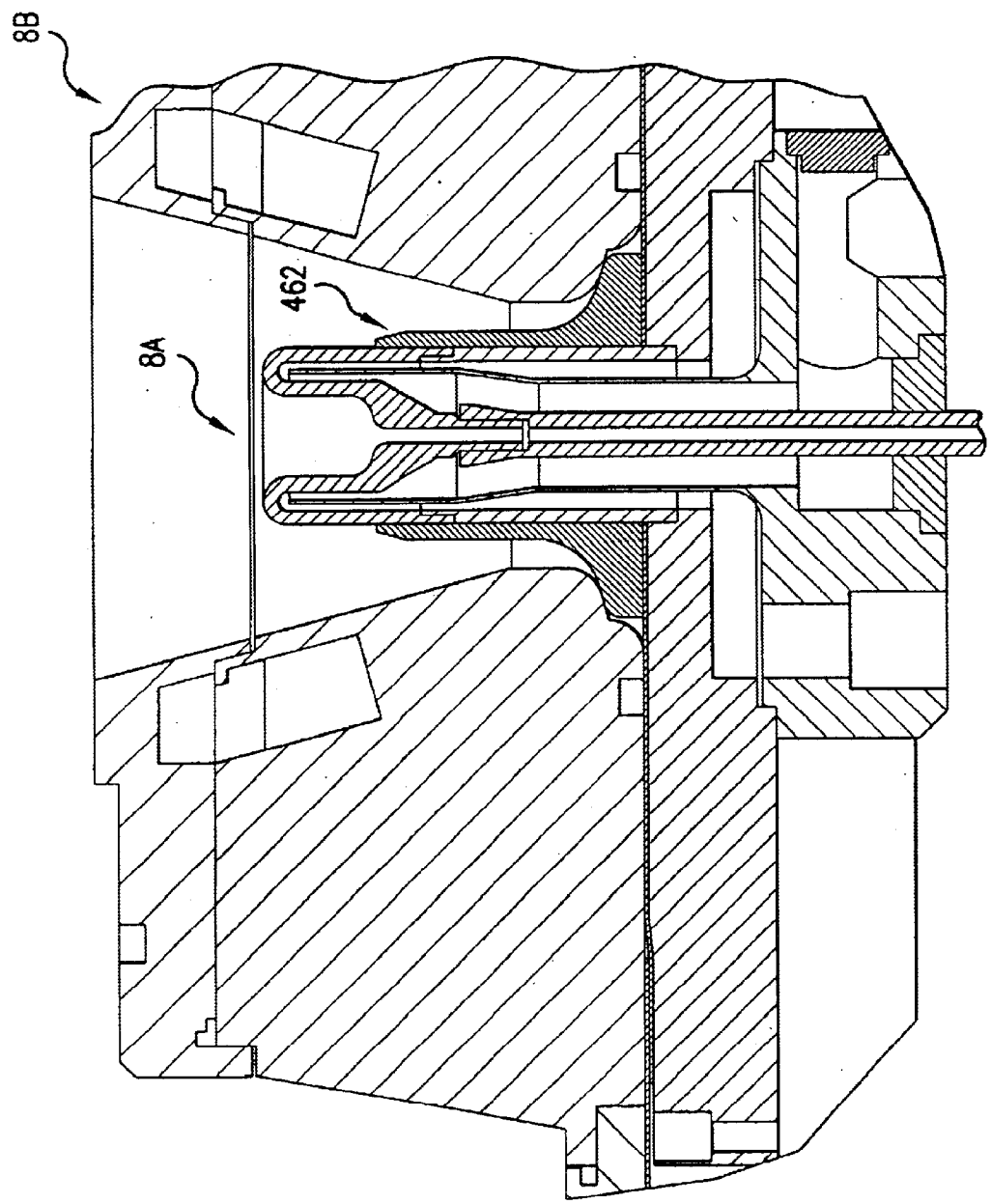
Figure 20C:
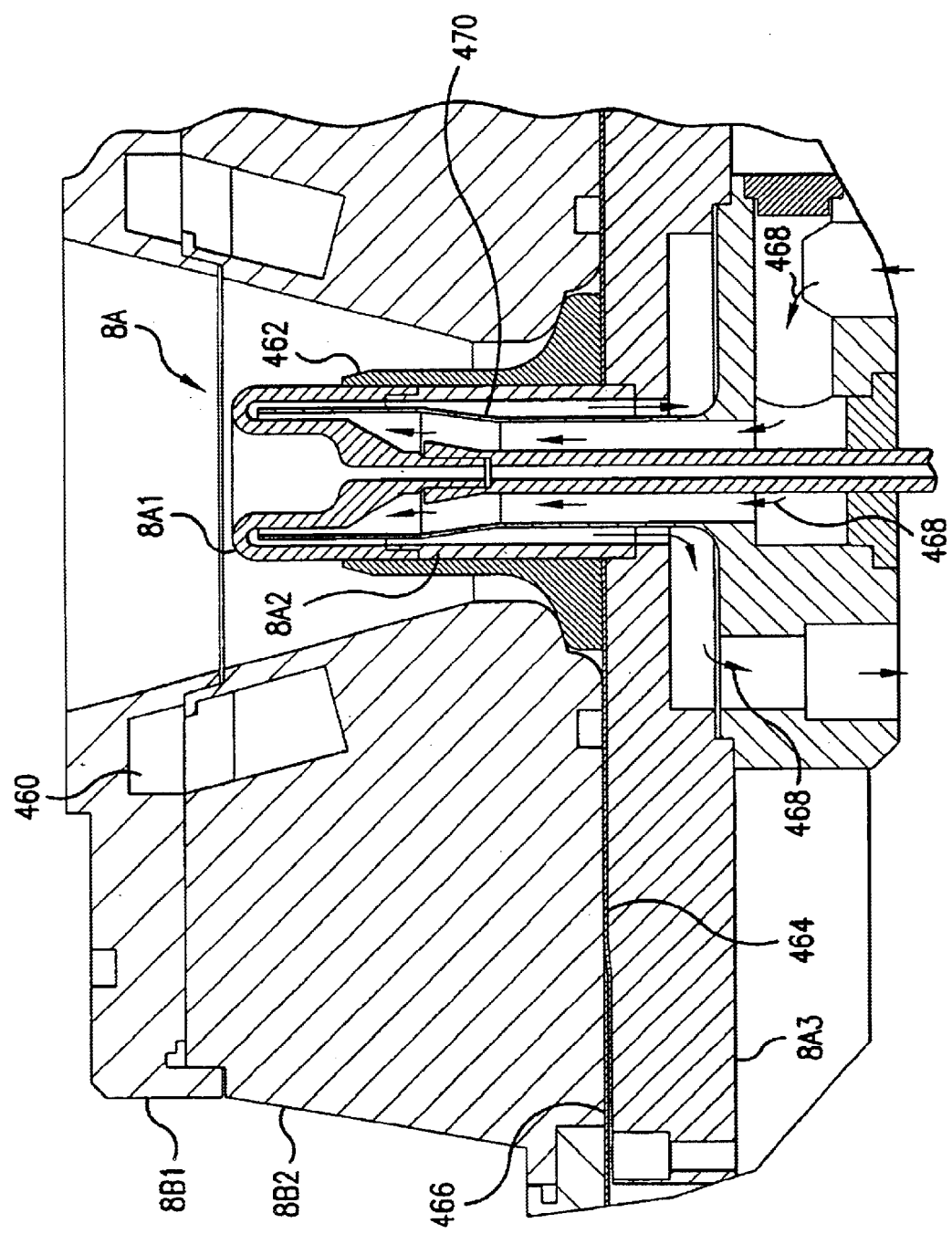

The standard practice for operating plasma pinch devices similar to those described in this specification and the parent cases is to provide high negative potential pulses to the central electrode so that the discharge is initialed along the outside surface of insulator 462 as shown in FIG. 20C and in this case the plasma formed between the electrodes in a accelerated up the channel between the electrodes and pinches just above the center of the center electrode.

Applicants has discovered what appears to be substantial improvement in performance of their pinch devices as a result of reversing the polarity so that a high negative potential is applied to the central electrode.

In this case the central electrode function as a cathode. Applicants has also discovered that the hollow portion of the central electrode serves to produce what appears to be a hollow cathode effect which eliminates the need for the pre-ionization which is needed when the central electrode functions as an anode.

Figure 21A:
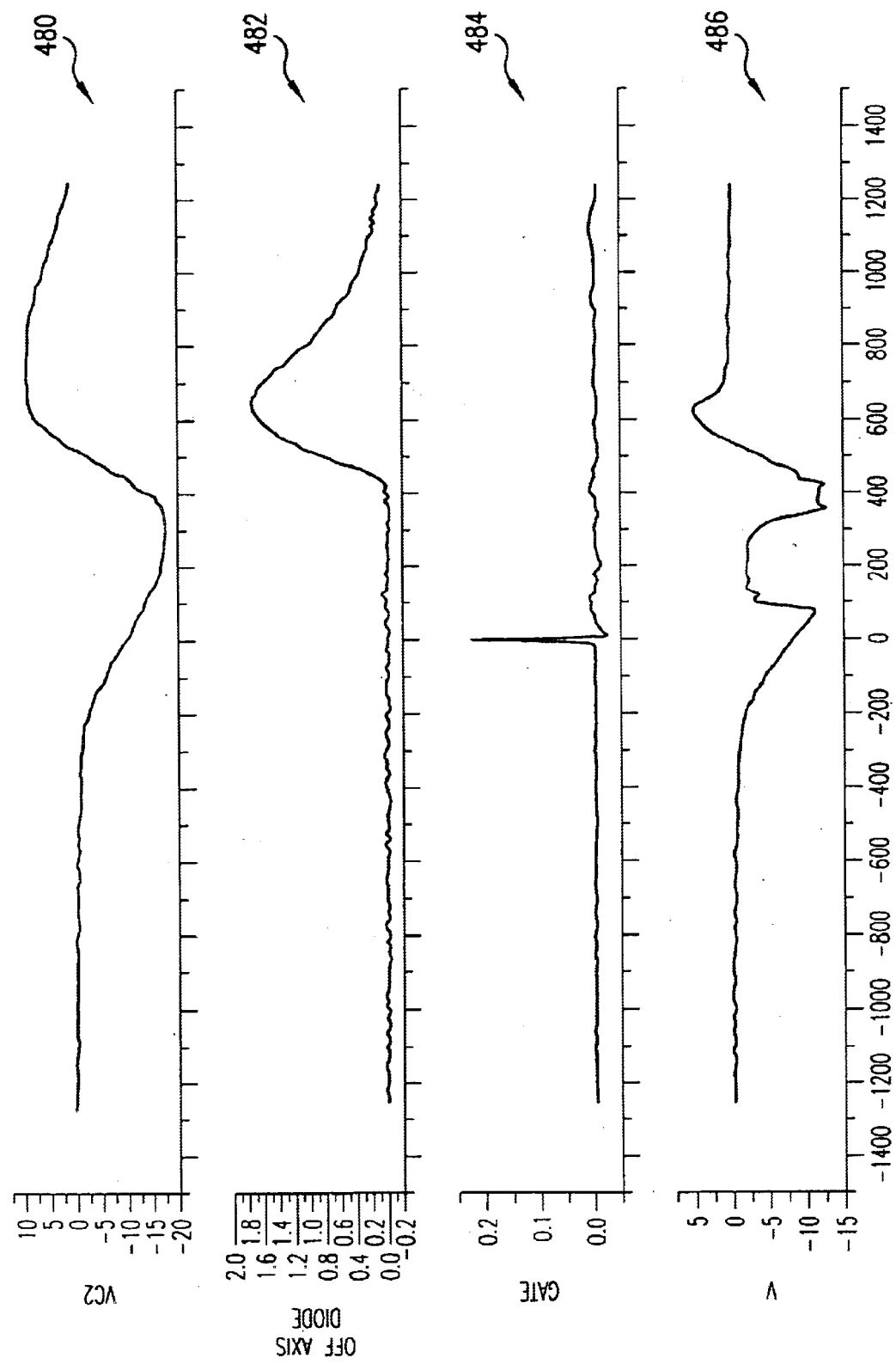
FIGS. 21A and 21B show traces of a typical pinch which the central electrode configured as a cathode.
Figure 21B:
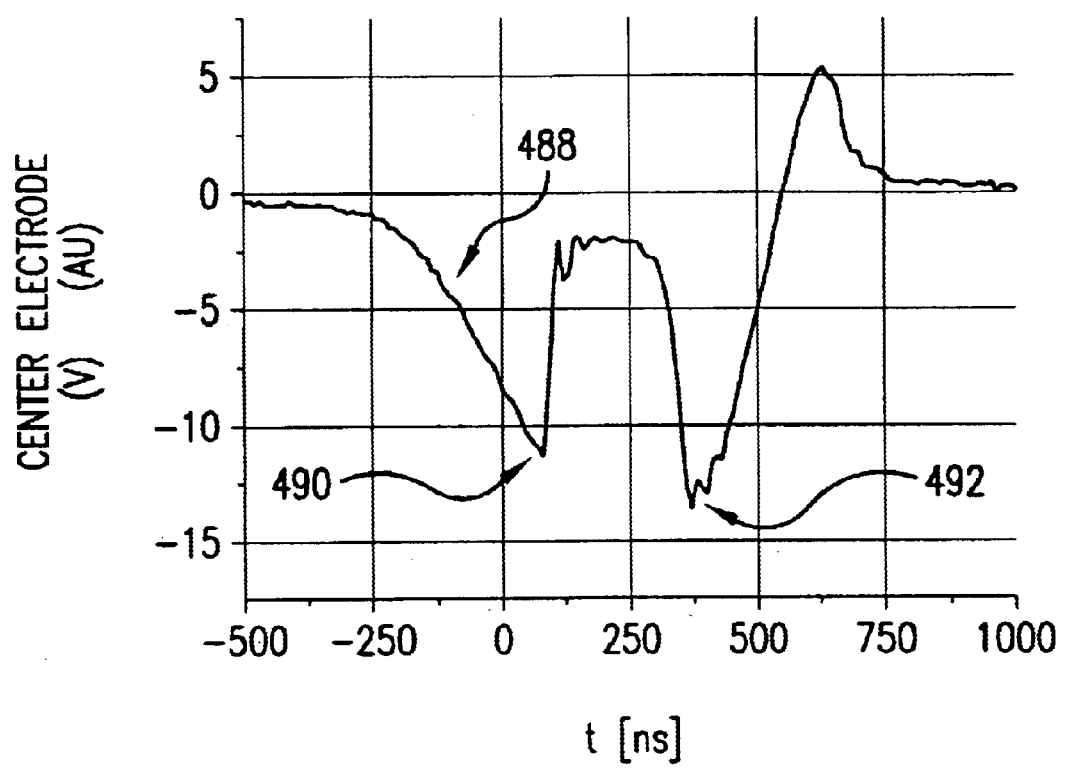
Figure 22:
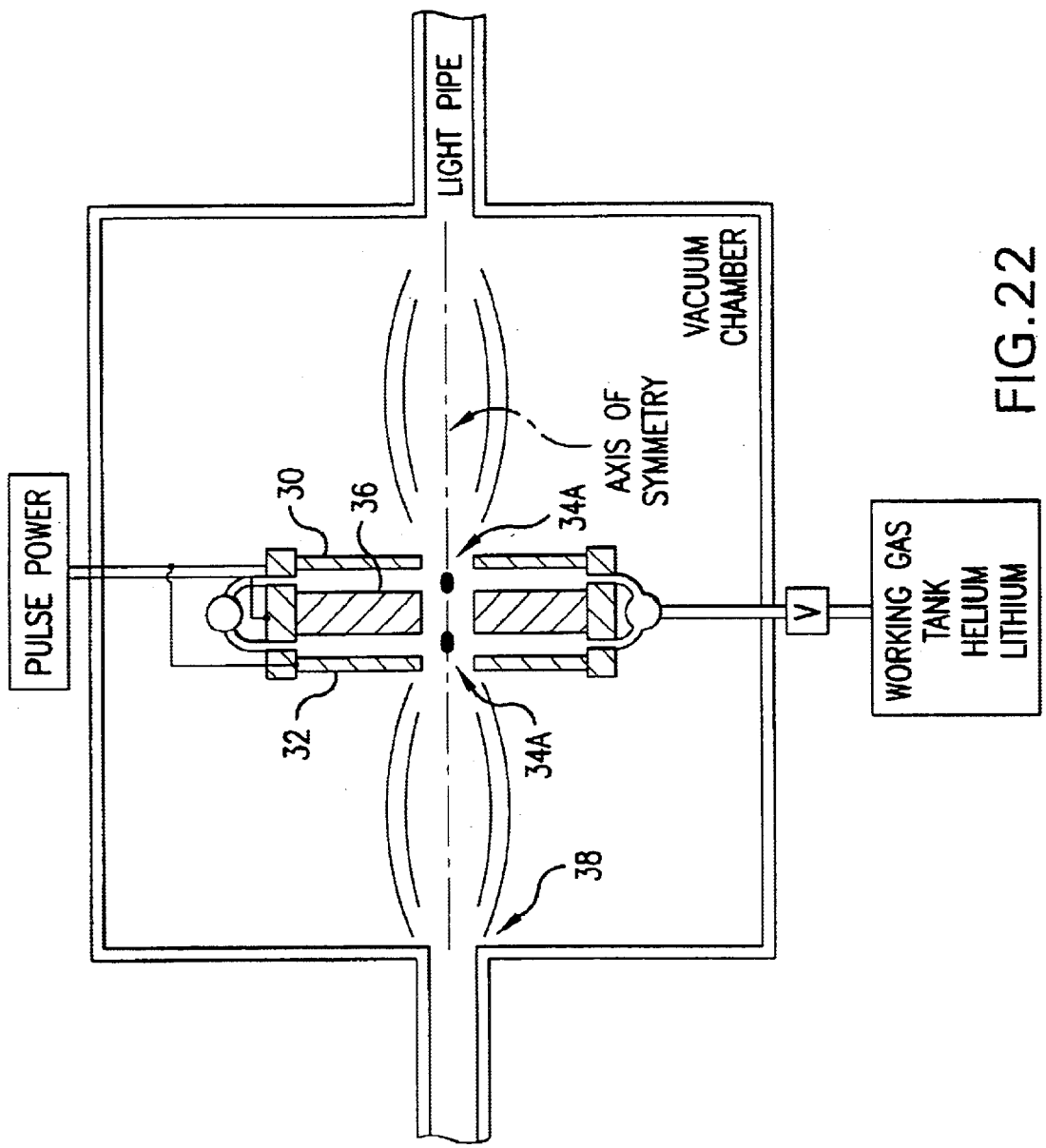
FIG. 22 shows a radial run-down technique.

Data traces are shown in FIGS. 21A and 21B. FIG. 21A shows:

(1) the voltage 480 on peaking capacitor VC2 as shown in FIG. 16B;

(2) EUV light output 482 of the pinch device;

(3) trigger signal 484 and (4) central electrode voltage 486.

Referring to FIG. 21B and FIG. 16B Applicants believe that a small amount of current leakage through saturable inductor L53 produces an initial negative potential rise as shown at 488 in FIG. 21B. As a consequence of the hollow cathode effect sufficient ionization is produced to cause a discharge at the time shown at 490. This provides sufficient pre-ionization to support the main discharge which begins at 492. No light outside the hollow portion of the central electrode is observed prior to discharge 492. Applicants initial test results indicate that the pinch in this polarization is significantly more efficient than with the conventional polarization. And with this polarization the design of the device is greatly simplified by not requiring a separate pre-ionization system.

Plasma Pinch with Radial Run-Down

Another preferred embodiment of the present invention utilizes the pulse power features and the radiation collection features debris control features described above with an electrode arrangement as described in FIG. 2. This electrode arrangement provides advantages and disadvantages as compared to electrode configuration such as that shown in FIG. 20B. The electrodes have greater surface area so that thermal problems may be minimized. There also could be less filamentations of the discharge and perhaps better plasma confinement and possibly better radial stability. Applicants believe they can design the electrodes to produce pinches along the axis of the electrodes as shown in FIG. 21.

Use of Multiple EUV Sources

As indicated above a preferred application of the present invention in for lithography light sources for future machines, at least the production versions, have not yet been designed and built. It is possible that illumination power may exceed the illumination power that can be conveniently produced by a single EUV source source utilizing the technology described herein. In this case two or more EUV sources could be combined to provide the illumination needed. Preferably the light from each of the sources would be collected using techniques similar to those described herein and projected on a single slit which would be the source for the lithography equipment.

Dual Purpose Collectors

Due to large reflection losses of EUV mirrors, minimization of the number of mirrors is very desirable for illumination systems for EUV lithography. Specially designed surfaces can have additional features such as beam homogenization features. One such feature could be a reflective diffuser added to a grazing incidence collector of te type described above.

Use of Magnetic Field and Preionizers to Control Pinch

Applicants have demonstrated that magnetic fields can be used to control the pinch size and position. In one embodiment a permanent magnetic positioned above the pinch region reduces the pinch length. Magnetic fields can also be applied to help confine the pinch. Applicants have also demonstrated that the shape and position of the pinch can also be controlled by moderating the preionization signal from preionizers 138 as shown in FIG. 16A.

Lithium Vapor Produced by Sputtering

In preferred embodiments the active gas (lithium vapor) and pre-ionization is provided in a single system. In this case lithium metal is sputtered with an electric discharge which produces the lithium vapor and also produces any ionization needed to promote the main discharge. The source for the sputter power preferably is a signal generator, a 100 watt linear RF amplifier and a 2000 watt command amplifier. The solid lithium target is preferably located in a hollow in the central electrode and the sputter discharge are directed to that target.

Test Results

Figure 16D:
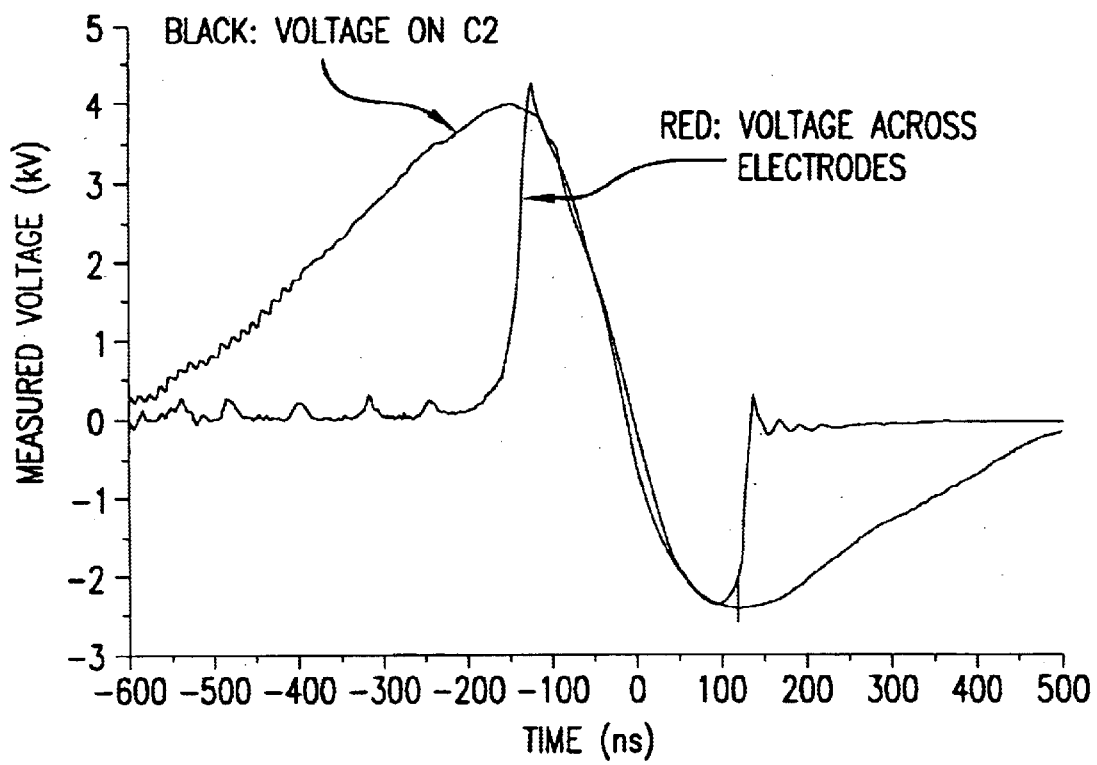
Figure 16E:
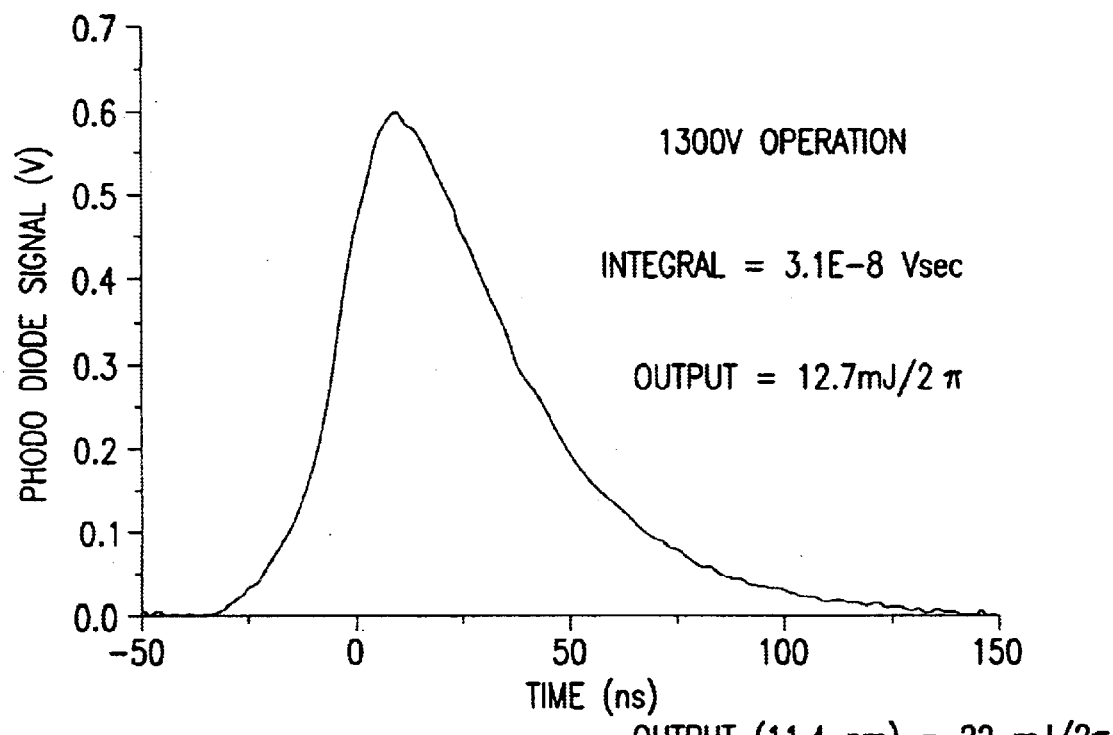

FIGS. 16D and 16E show test results from the fourth generation prototype device. FIG. 16D shows the pulse shape on capacitor C2 and across the electrodes and FIG. 16E shows a measured photo diode signal with Xenon as the active gas.

Active And Buffer Gas Control

Techniques for controlling the active and buffer gases and for controlling debris are described in U.S. patent application Ser. No. 09/875,719 which has been incorporated by reference herein. FIGS. 18A–E from that application shows an example of these techniques.

Tandum Ellipsoidal Mirrors

Figure 19A:
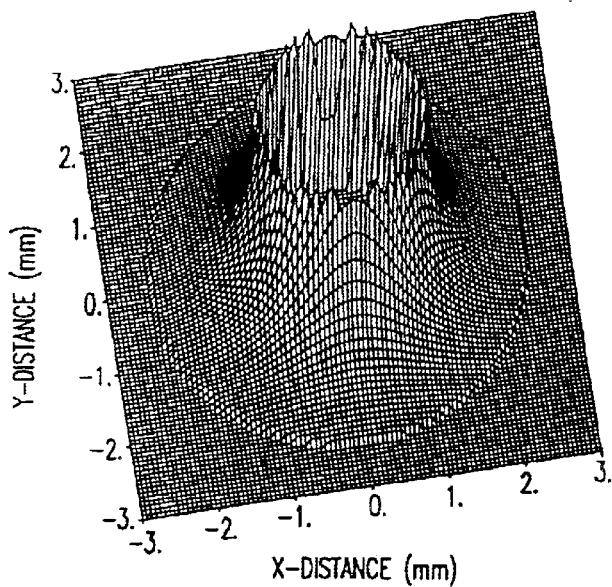
FIGS. 19A, B, and C show the shape of the EUV profile at just downstream of two focuses.
Figure 19B:
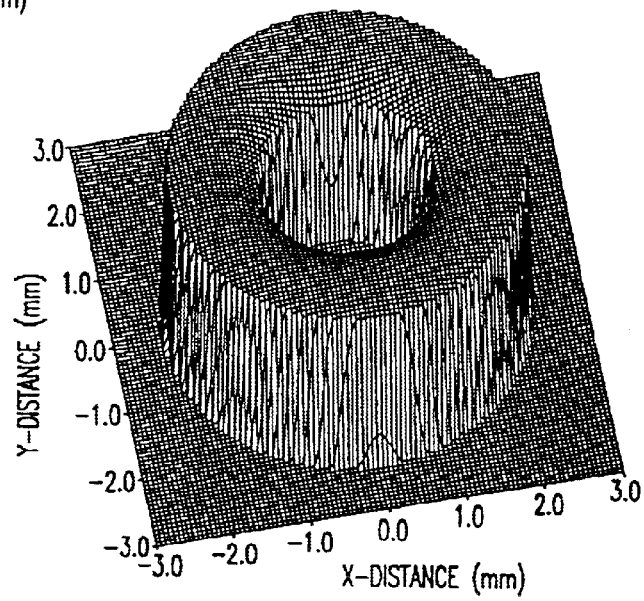
Figure 19C:
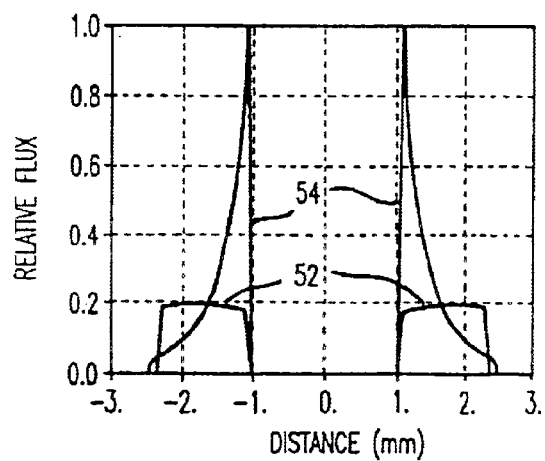

Techniques for focusing the EUV light is described in U.S. patent application Ser. No. 09/875,721 which has been incorporated by reference herein. An example of these techniques is shown in FIGS. 19A, B, and C from that application.

It is understood that the above described embodiments are illustrative of only a few of the many possible specific embodiments which can represent applications of the principals of the present invention. For example, instead of recirculating the working gas it may be preferable to merely trap the lithium and discharge the helium. Use of other electrode—coating combinations other than tungsten and silver are also possible. For example copper or platinum electrodes and coatings would be workable. Other techniques for generating the plasma pinch can be substituted for the specific embodiment described. Some of these other techniques are described in the patents referenced in the background section of this specification, and those descriptions are all incorporated by reference herein. Many methods of generating high frequency high voltage electrical pulses are available and can be utilized. An alternative would be to keep the lightpipe at room temperature and thus freeze out both the lithium and the tungsten as it attempts to travel down the length of the lightpipe. This freeze-out concept would further reduce the amount of debris which reached the optical components used in the lithography tool since the atoms would be permanently attached to the lightpipe walls upon impact. Deposition of electrode material onto the lithography tool optics can be prevented by designing the collector optic to re-image the radiation spot through a small orifice in the primary discharge chamber and use a differential pumping arrangement. Helium or argon can be supplied from the second chamber through the orifice into the first chamber. This scheme has been shown to be effective in preventing material deposition on the output windows of copper vapor lasers. Lithium hydride may be used in the place of lithium. The unit may also be operated as a static-fill system without the working gas flowing through the electrodes. Of course, a very wide range of repetition rates are possible from single pulses to about 5 pulses per second to several hundred or thousands of pulses per second. If desired, the adjustment mechanism for adjusting the position of the solid lithium could be modified so that the position of the tip of the central electrode is also adjustable to account for erosion of the tip.

Many other electrode arrangements are possible other than the ones described above. For example, the outside electrode could be cone shaped rather than cylindrical as shown with the larger diameter toward the pinch. Also, performance in some embodiments could be improved by allowing the inside electrode to protrude beyond the end of the outside electrode. This could be done with spark plugs or other preionizers well known in the art. Another preferred alternative is to utilize for the outer electrode an array of rods arranged to form a generally cylindrical or conical shape. This approach helps maintain a symmetrical pinch centered along the electrode axis because of the resulting inductive ballasting.

Accordingly, the reader is requested to determine the scope of the invention by the appended claims and their legal equivalents, and not by the examples which have been given.

What is claimed is:

1. A high energy photon source comprising:
A. a vacuum chamber,
B. at least two electrodes mounted coaxially within said vacuum chamber and defining an electrical discharge region arranged to create high frequency plasma pinches at a pinch site upon electrical discharge,
C. a working gas comprising an active gas and a buffer gas, said buffer gas being a noble gas, and said active gas being chosen to provide light at at least one spectral line,
D. an active gas supply system for supplying the active gas to said discharge region,
E. a pulse power system comprising a charging capacitor and a magnetic compression circuit said magnetic compression circuit comprising a pulse transformer for providing electric pulses and voltages high enough to create electrical discharge between said at least two of electrodes.

2. A source as in claim 1 wherein one of said two electrodes defines a central electrode and comprises a hollow region.

3. A source as in claim 2 wherein said pulse power system is configured to apply high negative potential pulses to said central electrode.

4. A source as in claim 2 wherein said pulse power system is configured to apply high positive potential pulses to said central electrode.

5. A source as in claim 2 wherein said active gas is provided from said hollow region.

6. A source as in claim 2 wherein said active gas comprises lithium.

7. A source as in claim 6 wherein said lithium is injected in the form of a solution.

8. A source as in claim 7 wherein said lithium is injected in a solution in $NH_3$.

9. A source as in claim 6 and further comprising a sputtering means for producing lithium vapor.

10. A high photon energy source as in claim 2 wherein said active gas comprises Xenon.

11. A source as in claim 1 and further comprising a magnetic means for shaping said plasma pinch.

12. A source as in claim 1 wherein said buffer gas is a noble gas.

13. A source as in claim 1 wherein said pulse power source comprises at least one capacitor optimized to provide peak capacitor current simultaneous with said plasma pinch.

14. A source as in claim 2 wherein said central electrode defines a pinch end and a first inside diameter near said pinch end and a second inside diameter farther from said pinch end than said first inside diameter, wherein said second inside diameter is larger than said first inside diameter.

15. A source as in claim 7 wherein said first inside diameter extends from said pinch end by a distance chosen to prevent arc-over.

16. A source as in claim 2 wherein said central electrode defines an exposed length and said length is chosen so that a plasma pinch occurs approximately simultaneously with a peak drive current.

17. A high energy photon source as in claim 2 and further comprising a lithium source comprised of a porous material infiltrated with lithium.

18. A high energy photon source as in claim 10 wherein said porous material is porous tungsten.

19. A high energy photon source as in claim 11 wherein said source further comprises an RF source configured to create a plasma surrounding at least a portion of said porous material.

20. A high energy photon source as in claim 1 wherein said pulse power system comprises a resonance charging system for charging said charging capacitor.

21. A source as in claim 1 wherein said magnetic compression circuit comprising at least two saturable inductors and a bias circuit for biasing said at least two saturable inductors.

22. A source as in claim 1 and further comprising an energy recovery circuit for recovering on said charging capacitor energy reflected from said electrodes.

23. A source as in claim 1 wherein said charging capacitor is comprised of a bank of individual capacitors.

24. A source as in claim 1 and further comprising a heat pipe for cooling at least one of said electrodes.

25. A source as in claim 24 and further comprising a heat pipe cooling system for cooling said hollow anode.

26. A source as in claim 24 wherein said heat pipe cooling system comprises a hollow cathode comprising a heat pipe cooled hollow cathode having a portion for the introduction of said active gas.

27. A source as in claim 1 wherein said central electrode is water-cooled.

28. A source as in claim 27 wherein said central electrode comprises a water channel providing water flow to a rim region of said central electrode surrounding said hollow region.

29. A source as in claim 28 wherein said central electrode is comprised of single crystal tungsten.

30. A source as in claim 1 wherein said pulse transformer is comprised of a plurality of ring shaped cores comprised of magnetic material and a primary winding in electromagnetic association with each of said cores.

31. A source as in claim 20 wherein said magnetic material is comprised of high permeability film wrapped on a mandrel.

32. A source as in claim 21 wherein said pulse transformer defines a secondary winding comprised of a plurality of rods.

33. A source as in claim 21 wherein each respective mandrel forms a part of said primary winding for each primary winding.

34. A high energy photon source comprising:
 A. a vacuum chamber,
 B. at least two electrodes mounted within said vacuum chamber and defining electrical discharge region and arranged to create high frequency plasma pinches at a pinch site upon electrical discharge,
 C. a working gas comprising an active gas and a buffer gas, said buffer gas being a noble gas, and said active gas being chosen to provide light at at least one spectral line,
 D. an active gas supply system for supplying the active gas to said discharge region,
 E. a pulse power system comprising a charging capacitor and a magnetic compression circuit said magnetic compression circuit comprising a pulse transformer for providing electric discharges between said at least two of electrodes.

35. A source as in claim 30 wherein said electrode are configured to provide at least two radial run-down pinches on a common axis.

36. A source as in claim 1 and further comprising a grazing incident collector combining at least two optical features.

37. A source as in claim 36 wherein said two optical features are radiation collection and beam homogenization.

38. A source as in claim 1 wherein said source is combined with at least one other similar source to provide an array of sources producing EUV light which is combined to provide a single combined EUV light source for an industrial application.

39. A source as in claim 38 wherein said the industrial application is integrated circuit lithography and said combined EUV light source is combined at a slit.

40. A source as in claim 7 wherein said lithium if injected in a solution of an amine.

* * * * *